United States Patent [19]
Kawashima

[11] Patent Number: 5,602,400
[45] Date of Patent: Feb. 11, 1997

[54] SURFACE POSITION DETECTING METHOD AND APPARATUS INCLUDING DETECTION AND CORRECTION OF ERRORS, SUCH AS SURFACE POSITION ERRORS OR TILT, IN EXPOSURE REGIONS

[75] Inventor: Haruna Kawashima, Utsunomiya, Japan

[73] Assignee: Canon Kabushiki Kaisha, Tokyo, Japan

[21] Appl. No.: 636,723

[22] Filed: Apr. 23, 1996

Related U.S. Application Data

[63] Continuation of Ser. No. 541,022, Oct. 11, 1995, abandoned, which is a continuation of Ser. No. 107,609, Aug. 18, 1993, abandoned.

[30] Foreign Application Priority Data

Aug. 19, 1992 [JP] Japan .................................. 4-244267
Dec. 18, 1992 [JP] Japan .................................. 4-355965

[51] Int. Cl.⁶ ................................................. G01N 21/86
[52] U.S. Cl. .......................... 250/548; 250/559.3; 356/401
[58] Field of Search ................................. 250/548, 561, 250/559.3, 559.02, 559.2, 559.27; 356/376, 381, 400, 401, 371

[56] References Cited

U.S. PATENT DOCUMENTS

| 4,558,949 | 12/1985 | Uehara et al. | 356/152 |
|---|---|---|---|
| 4,723,845 | 2/1988 | Mizutani et al. | 356/375 |
| 4,780,616 | 10/1988 | Nishi et al. | 250/548 |
| 4,952,815 | 8/1990 | Nishi | 250/548 |
| 5,118,957 | 6/1992 | Kawashima et al. | 250/561 |
| 5,124,562 | 6/1992 | Kawashima et al. | 250/548 |
| 5,191,200 | 3/1993 | van der Werf et al. | 250/548 |
| 5,241,188 | 8/1993 | Mizutani | 250/548 |

FOREIGN PATENT DOCUMENTS

| 0474445 | 3/1992 | European Pat. Off. . |
|---|---|---|
| 102518 | 4/1990 | Japan . |
| 198130 | 9/1990 | Japan . |

*Primary Examiner*—Que T. Le
*Attorney, Agent, or Firm*—Fitzpatrick, Cella, Harper & Scinto

[57] ABSTRACT

A registration method is usable with projection optical system for projecting first and second patterns of a first object simultaneously upon a second object having a surface step, for measuring at different locations the surface position of the second object with respect to the direction of an optical axis of the projection optical system prior to the pattern projection to bring the surface of the second object into coincidence with an image plane of the projection optical system on the basis of the measurement, wherein the first pattern has a smaller depth of focus than that of the second pattern. The method includes bringing the surface position of the second object, at the location whereat the first pattern is to be projected, into coincidence with the image plane of the projection optical system; and correcting any tilt of the surface of the second object with respect to the image plane of the projection optical system.

59 Claims, 30 Drawing Sheets

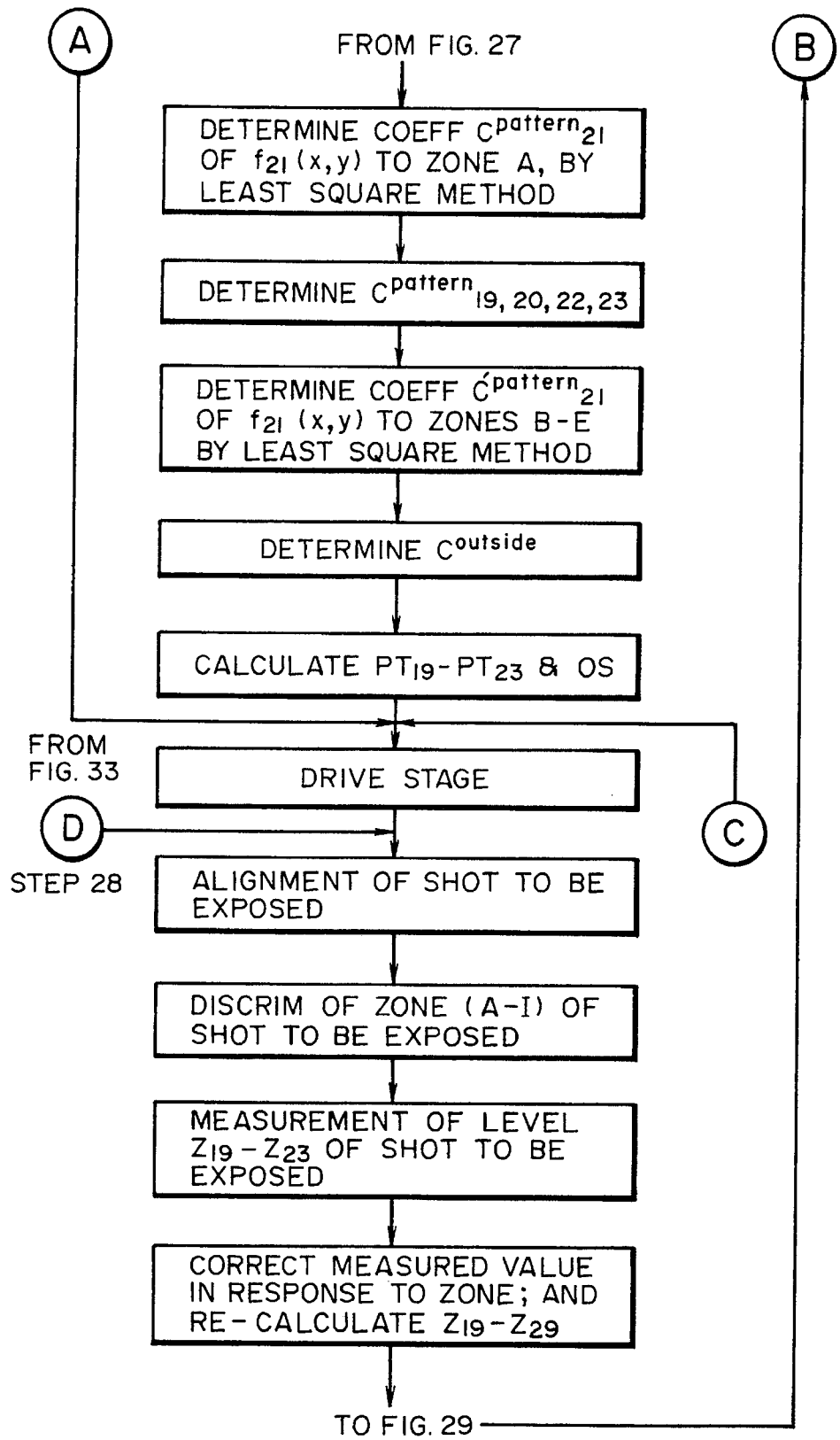
F I G. 28

SURFACE POSITION DETECTING METHOD AND APPARATUS INCLUDING DETECTION AND CORRECTION OF ERRORS, SUCH AS SURFACE POSITION ERRORS OR TILT, IN EXPOSURE REGIONS

This application is a continuation of application Ser. No. 08/541,022, filed Oct. 11, 1995, now abandoned, which is a continuation of prior application Ser. No. 08/107,609 filed Aug. 18, 1993, now abandoned.

FIELD OF THE INVENTION AND RELATED ART

This invention relates to a surface position detecting method. More particularly, the invention is concerned with a surface position detecting method usable in the manufacture of semiconductor devices, for example, for producing surface position information (level information) about different points on a wafer where an electronic circuit pattern formed on the surface of a reticle is to be projected on the wafer in a reduced scale, so that each exposure region of the wafer can be positioned along the best imaging plane of a projection optical system. In another aspect, the invention relates to an arrangement for such a position detecting system or to a projection exposure apparatus using such a position detecting method.

Projection exposure apparatuses for the manufacture of semiconductor devices need to meet requirements of a further increase in the degree of integration and thus a further reduction in linewidth of an electronic circuit pattern, to an order of submicron or half micron. In this connection, projection optical systems should provide a higher resolution. Thus, on one hand, the numerical aperture (NA) of a projection optical system used is enlarged and, on the other hand, the wavelength of the exposure light used is shortened.

Generally, enlarging the NA of a projection optical system for higher resolution results in a decrease of the depth of focus in pattern projection. In view of this, in many cases, a projection exposure apparatus is equipped with a surface position detecting device for detecting the focal surface position of a projection optical system. It is desirable for such a surface position detecting device to provide not only a function of detecting the level or height (surface position) of each exposure region of a wafer to which a pattern is to be transferred, for adjustment of the same, but also a function of detecting any tilt or the like of each exposure region of the wafer surface, for adjustment of the same.

A known example of a position detecting device for detecting the focal surface, is such that: a plurality of air sensors are provided in a peripheral portion around an exposure region of a wafer and, from the level (surface height) information about the peripheral portion obtained through the air sensors, any tilt of the exposure region as well as the height position of the same are calculated and then they are adjusted.

U.S. Pat. No. 4,558,949 discloses an oblique projection type height position detecting optical system for detecting (and adjusting) the height position at the central portion of an exposure region of a wafer surface. A separate oblique projection type tilt detecting optical system (collimator) is used to calculate and adjust any tilt within the exposure region.

SUMMARY OF THE INVENTION

In such surface position detecting devices, particular attention is not paid to topography of the wafer surface in an exposure region thereof to which a pattern is to be transferred, when the exposure region of the wafer is going to be positioned within the range of the depth of focus of a projection optical system.

More specifically, in a system wherein air sensors are used to measure different points in a peripheral portion around an exposure region or in a system which uses separately a height position detecting system for detecting the level of a central portion of an exposure region as well as a tilt detecting optical system, there is a difficulty in positioning an exposure region of a wafer within the range of the depth of focus of a projection optical system while taking into account the topography of the wafer surface in the exposure region thereof.

U.S. Pat. No. 5,118,957 shows a surface position detecting device by which different measurement points are set in a central portion and in an inside portion of an exposure region. In this device, however, if there is a surface step in the exposure region, particularly in a case where there is a surface step between a zone to which a portion of a pattern of a reticle having a relatively small depth of focus is to be transferred and a zone to which a portion of the reticle pattern having a relatively large depth of focus is to be transferred, an average surface position of that exposure region is detected and the thus detected surface position is then brought into coincidence with the image plane of a projection optical system. Thus, there is a possibility that a pattern portion having a relatively large depth of focus can be transferred but a pattern portion having a relatively small depth of focus cannot be transferred, within the depth of focus.

Usually, in a detection system of optical type, there is a problem of optical interference between the light reflected by the surface of a resist applied to a wafer and the light reflected by the surface of a substrate of the wafer. The effect of such interference differs with the pattern formed on the wafer substrate. In consideration of this, in the aforementioned U.S. Pat. No. 5,118,957, an offset peculiar to the pattern is measured beforehand with respect to each of the measuring points and, in the exposure process of each shot, the measured values are corrected and, on the basis of this, the wafer surface position measurement is carried out.

However, there is a case where, in the peripheral portion of the wafer, one or more of the measuring points are located in a region not having the pattern with respect to which the offset measurement has been done. In that case, it is necessary to effect the surface position measurement of the wafer while using the remaining measuring points excluding the point or points located in the region not having the pattern. This means that in the peripheral portion of the wafer there is a possibility of reduction in number of the measuring points which leads to degradation of precision of surface position correction.

It is accordingly a primary object of the present invention to provide a surface position detecting method or a device using the same, by which the topography of the surface of an exposure region of a wafer can be measured correctly such that the surface position can be measured precisely while taking into account the topography.

It is another object of the present invention to provide a surface position detecting method or a device using the same, by which high precision surface position detection as high as attainable in the central portion of a wafer is assured in a peripheral portion of the wafer.

It is a further object of the present invention to provide a surface position detecting method or a device using the same, by which, even in a case where a particular portion of a wafer has surface irregularity, any effect of local topography can be reduced such that the surface position can be detected correctly.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 28 is a flow chart of offset calculation in the second embodiment.

DESCRIPTION OF THE PREFERRED EMBODIMENTS

Figure 1:
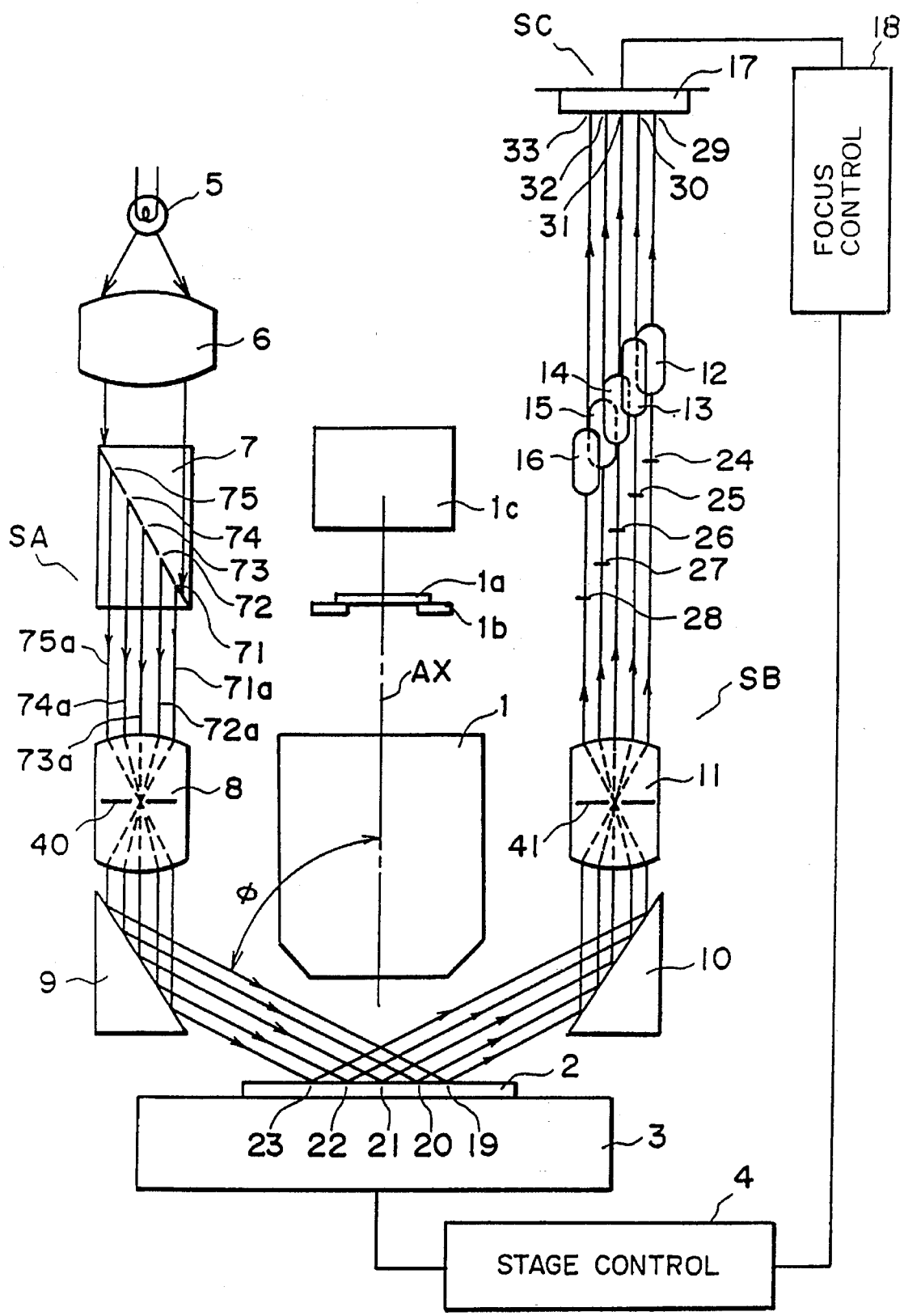
FIG. 1 is a schematic view of a main portion of a first embodiment of the present invention.
Figure 2:
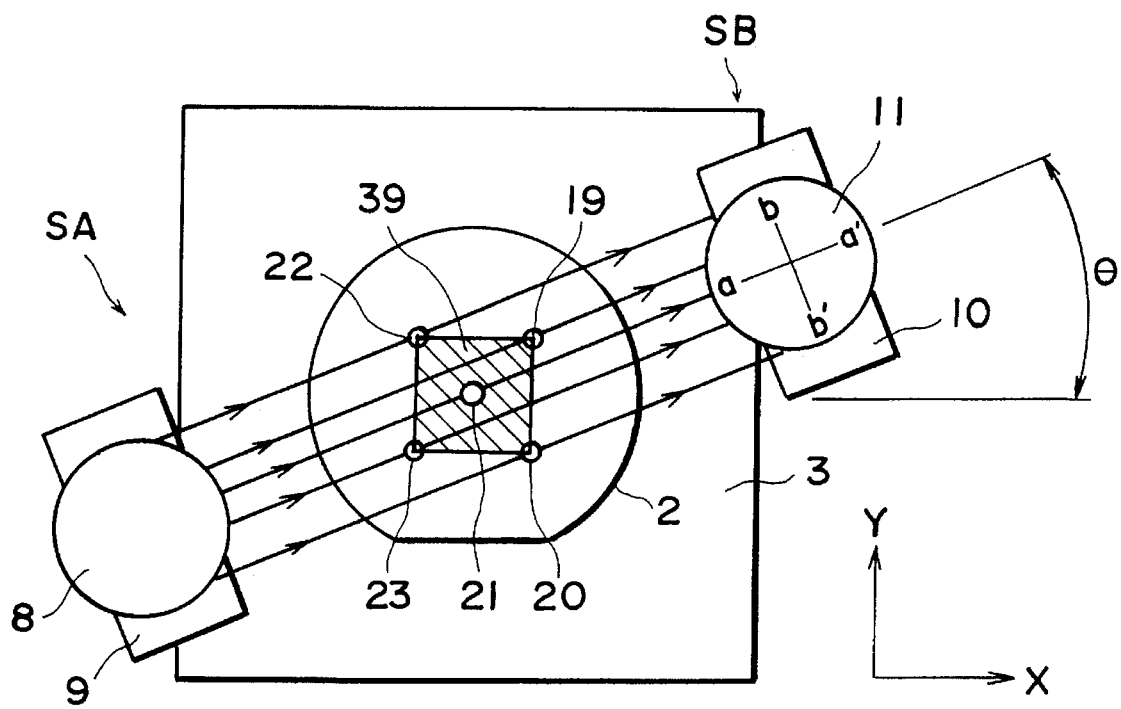
FIG. 2 is a schematic view for explaining a portion of FIG. 1.

FIG. 1 is a schematic view of a main portion of a first embodiment of the present invention, and FIG. 2 is an enlarged view of a portion of FIG. 1.

Denoted in FIG. 1 at i is a reduction type projection optical system (projection lens system), and denoted at Ax is the optical axis of the projection optical system 1. Denoted at 1a is a reticle on which a circuit pattern is formed. It is placed on a reticle stage 1b. Denoted at 1c is an illumination system for illuminating the reticle 1a surface uniformly. The projection optical system 1 serves to project, in a reduced scale, the circuit pattern of the reticle 1a upon the surface of a wafer 2. The wafer 2 is held fixed on the surface of a wafer stage 3, through attraction. The wafer stage 3 is movable along the optical axis Ax (z direction) of the projection optical system 1, as well as in two directions (x and y directions) along the plane (x-y plane) orthogonal to the optical axis Ax. Additionally, it is equipped with the function of tilt adjustment with respect to the plane (x-y plane) orthogonal to the optical axis Ax. Thus, with this structure, it is possible to adjust the surface position of a wafer 2 placed on the wafer stage 3 surface, as desired. Denoted at 4 is a stage controller which is operable to controllably drive the wafer stage 3 in response to a signal from a focus controller 18, to be described later.

Denoted at SA is a light projecting means. Denoted at SB is a projection means. Denoted at SC is a photoelectric converting means. These components constitute a portion of a surface position detecting device for detecting the surface position of a wafer 2. The projection means SB and the photoelectric converting means SC cooperate with each other to define a detecting means SBC.

In this embodiment, when the circuit pattern of the reticle la is going to be projected on the wafer 2 surface through the projection optical system 1, the surface position detecting device is used to controllably drive the wafer stage 3 so as to position the wafer 2 surface within the range of the depth of focus of the projection optical system 1. The wafer stage 3 is then moved stepwise along the x-y plane, by which pattern regions (shots) 39 of rectangular shape are defined successively on the wafer 2 surface.

Next, the components of the surface position detecting device of this embodiment will be explained. Initially, the light projecting means SA for projecting a plurality of lights upon the wafer 2 surface will be described.

Denoted at 5 is a light source which comprises a white light source or an illumination unit arranged to emit light of different wavelengths. Denoted at 6 is a collimator lens for receiving the light from the light source 1 and producing parallel light of substantially uniform sectional intensity distribution. Denoted at 7 is a slit member of prism shape, having a pair of prisms cemented to each other so that their slant surfaces are opposed to each other. At the cemented surface, a plurality of openings (five pinholes) 71–75 are formed by using a light blocking film such as chromium, for example.

Figure 3:
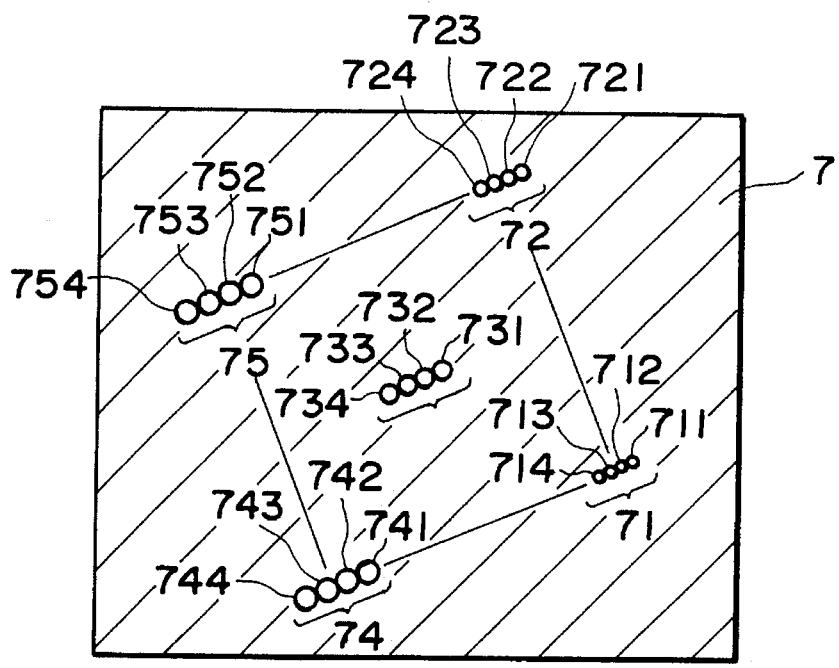
FIG. 3 is a schematic view for explaining a pinhole (and small pinholes) of FIG. 1.

FIG. 3 is a schematic view of the slit member 7 as seen from the collimator lens 6 side. As shown in FIG. 3, the pinhole 71 comprises a plurality of (four) small pinholes 711–714. Similarly, the remaining pinholes 72, 73 and 74 each comprises a plurality of (four) small pinholes 721–724, 731–734 or 741–744.

Denoted at 8 is a lens system of dual telecentric type which serves to direct five independent lights 71a–75a, passed through the pinholes 71–75 of the slit member 7, toward five measuring points 19–23 on the wafer 2 surface via a mirror 9.

Here, the arrangement is such that, with respect to the lens system 8, the plane on which the pinholes 71–75 are formed and the plane which includes the wafer 2 surface are set to satisfy the Scheimpflug's condition. Here, if the imaging magnifications of the pinholes 71–75 through the lens system 8 are denoted by $\beta_{8(71)}$–$\beta_{8(75)}$, respectively, then $\beta_{8(71)} < \beta_{8(72)} < \beta_{8(73)} < \beta_{8(74)} < \beta_{8(75)}$. Thus, the closer the pinhole is to the lens 8, the larger its imaging magnification is.

It is to be noted that, since in this embodiment the small pinholes 711–714 (721–724; 731–734; 741–744; 751–754) are so close to each other, they may be considered as having substantially the same imaging magnification $\beta_{8(71)}$ ($\beta_{8(72)}$; $\beta_{8(73)}$; $\beta_{8(74)}$; $\beta_{8(75)}$).

In this embodiment, in order to assure that images of the small pinholes 711–714, 721–724, 731–734, 741–744 and 751–754 are projected on the wafer 2 surface substantially in the same size, the diameter D of each of these small pinholes is so set to satisfy the following relation:

$$D_{71}:D_{72}:D_{73}:D_{74}:D_{75} = \beta_{8(75)}:\beta_{8(74)}:\beta_{8(73)}:\beta_{8(72)}:\beta_{8(71)}$$

where $D_{71}$ is the diameters $D_{711}$–$D_{714}$ of the small pinholes 711–714, $D_{72}$ is the diameters $D_{721}$–$D_{724}$ of the small pinholes 721–724, $D_{73}$ is the diameters $D_{731}$–$D_{734}$ of the small pinholes 731–734, $D_{74}$ is the diameters $D_{741}$–$D_{744}$ of the small pinholes 741–744, and $D_{75}$ is the diameters $D_{751}$–$D_{754}$ of the small pinholes 751–754.

Also, the lens system 8 has an inside aperture stop 40 for registration of NAs to the lights 71a–75a.

The lights 71a–75a serves to define measuring points 19–23, respectively, on the wafer 2 surface.

Figure 4:
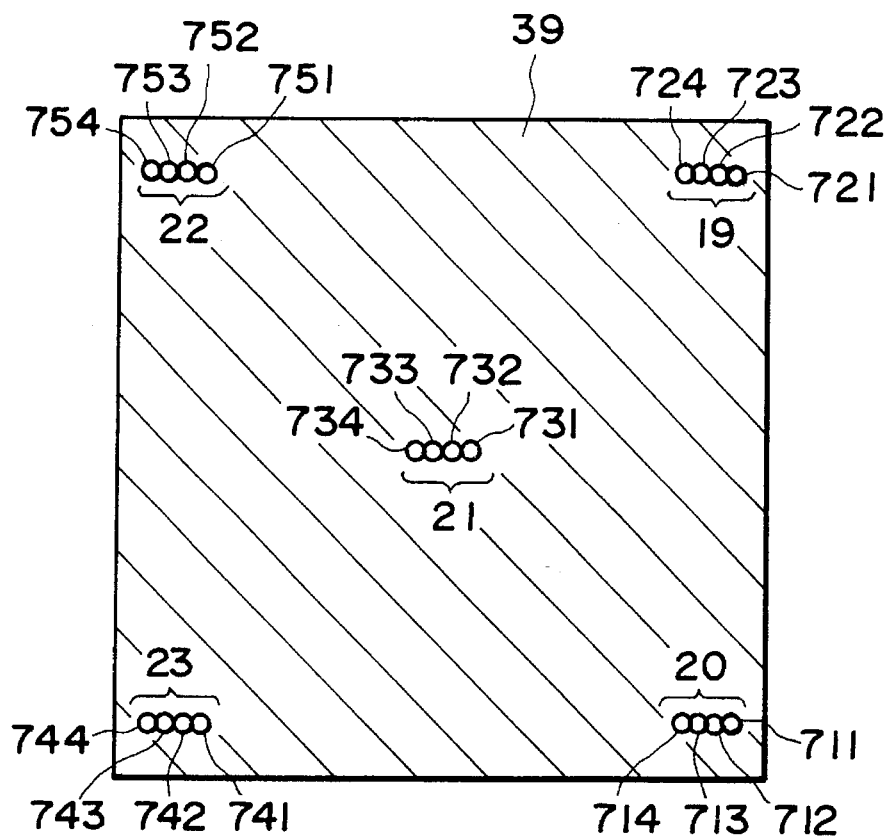
FIG. 4 is a schematic view for explaining small pinholes as projected to a wafer.

At the measuring points 19–13 on the wafer 2 surface, the images of the small pinholes 711–714, 721–724, 731–734, 741–744 and 751–754 are projected, respectively, as illustrated in FIG. 4. In this embodiment, the above-described components 5, 6, 7, 8 and 9 cooperate with each other to provide the light projecting means SA.

In this embodiment, the incidence angle $\phi$ of each light from the light projecting means impinging upon the wafer 2 surface (the angle defined with respect to a normal to the wafer surface) is $\phi$=70 deg. or more. On the wafer 2 surface, there are a plurality of pattern regions (shots of exposure regions) 39 arrayed such as shown in FIG. 2. The five lights 71a–75a passed through the lens system 8 impinge on separate measuring points 19–23, respectively, of a pattern region 39.

The five lights 71a–75a when projected on the wafer 2 surface are so projected onto the wafer 2 surface along a direction rotated by an angle $\theta$ deg. (e.g. $\theta$=22.5 deg.) in the X-Y plane from the X direction (direction of shot array), so that they can be observed independently as depicted in FIG. 2 when seen in the perpendicular direction to the wafer 2 (optical axis Ax direction).

In this manner, the components are suitably spatially disposed and thus high precision detection of surface position information is assured.

In this embodiment, a plurality of lights (pinholes) are projected on the wafer 2 surface by using the light projecting means SA which comprises the above-described components 5–9. It is to be noted that in this embodiment the number of the measuring points to be defined on the wafer 2 surface is not limited to five (5).

Next, description will be made of the projection means SB which serves to direct the lights reflected by the wafer 2 surface to the detection surface 17 of the photoelectric converting means SC (CCD position detecting device).

Denoted at 11 is a light receiving lens of dual telecentric type which cooperates with a mirror 10 to direct the five reflection lights reflected by the wafer 2 surface. The light receiving lens 11 serves to form pinhole images at the positions 24–28, respectively, corresponding to the measuring points 19–23, respectively.

Denoted at 41 is a stopper (stop) provided inside the light receiving lens 11. It is provided in common in relation to the measuring points 19–23. It serves to block higher order diffraction light (noise light) which may be produced by a circuit pattern on the wafer 2 when the lights are reflected by the wafer 2. The lights from the pinhole images at the positions 24–28 are then projected on five separate correction optical systems 12–16, respectively.

The light receiving lens 11 is of dual telecentric type, and the correction optical systems 12–16 have their optical axes placed parallel to each other. Thus, they serve to re-image the pinhole images, defined at the positions 24–28, upon the detection surface 17 of the photoelectric converting means SC such that light spots of the same size are formed thereon. The photoelectric converting means SC comprises a single area CCD, in this embodiment. As described, in this embodiment, the components 10, 11 and 12–16 cooperate with each other to provide the projection means SB.

The correction optical systems 12–16 each comprises a lens system and a parallel flat plate of predetermined thickness, and it is in a coaxial or eccentric relation with the optical axis of the light receiving lens 11. Here, the parallel flat plate is used to correct the optical length of each corresponding lens system. Also, each lens system is provided for magnification correction, such that substantially the same imaging magnification (projection magnification) is assured upon the detection surface 17 with respect to all the measuring points 19–23.

Namely, in an oblique projection imaging optical system as in the present embodiment wherein a plurality of lights are projected obliquely upon the surface of a wafer, as different measuring points 19–23 having different distances with respect to the light receiving lens 11 are imaged on the detection surface 17 of the photoelectric converting means SB, they are imaged at different imaging magnifications.

In this embodiment, in consideration thereof, the correction optical systems 12–16 are provided in relation to the measuring points, respectively, by which substantially the same projection magnification is assured upon the detection surface 17 to the measuring points 19–23.

Here, the positions of the pinhole images (light spots) impinging on the detection surface 17 are changeable with the surface positions (in the direction of level (height) and along the optical axis Ax) of the wafer 2 surface at the measuring points 19–23, respectively. The photoelectric converting means SC serves to detect such a change in the pinhole image position. Thus, in the present embodiment, the surface position information at each measuring point 19–23 on the wafer 2 surface can be detected, with the same precision.

Further, through the projection means SB, the measuring points 19–23 on the wafer 2 surface and the detection surface 17 of the photoelectric converting means SC are placed in a conjugate relation (inclination correction being made to the measuring points 19–23), such that even with any local tilt at the measuring point 19–23 the pinhole image position on the detection surface 17 does not change. Namely, in response to a change in the local level (height position) at each measuring point of the wafer 2 surface in the direction of the optical axis Ax, that is, in response to the level of each measuring point 19–23, the pinhole image position on the detection surface 17 is changeable.

The photoelectric converting means SC serves to detect the positional information about each pinhole image incident on the detection surface 17, and the pinhole image position information corresponding to the measuring points 19–23 obtained through the converting means SC is supplied to the focus controller 18.

In response to the level (surface position) information about the measuring points 19–23 applied from the converting means SC, the focus controller 18 determines the positional information about the wafer 2 surface, i.e., the position with respect to the optical axis AX direction (z direction) or the tilt thereof with respect to the X-Y plane.

Then, it applies a signal related to a drive of the wafer stage 3 to the stage controller 4 so as to bring the wafer 2 surface substantially into coincidence with the projection plane of the reticle 1a through the projection optical system 1. In response to the signal applied from the focus controller 18, the stage controller 4 controllably drives the wafer stage 3 to adjust the position and/or the attitude of the wafer 2.

In this embodiment, with respect to the light receiving lens system 11, the measuring points 19–23 on the wafer surface and the plane which includes the positions 24–28 are set to satisfy the Scheimpflug's condition. Here, if the imaging magnifications of the pinhole images on the measuring points 19–23 through the light receiving lens system 11 are denoted by $\beta_{11(19)}$–$\beta_{11(23)}$, respectively, then $\beta_{11(19)} < \beta_{11(20)} < \beta_{11(21)} < \beta_{11(22)} < \beta_{11(23)}$. Thus, the closer the pinhole is to the lens system 11, the larger its imaging magnification is.

On the other hand, if the imaging magnifications, to the incidence positions 29–33, of the pinhole images formed respectively at the positions 24–28 through respective correction optical systems 12–16 are denoted by $\beta_{12(24)}$, $\beta_{13(25)}$, $\beta_{14(26)}$, $\beta_{15(27)}$ and $\beta_{16(28)}$, then these imaging magnifications are so set that the following relation is satisfied in the combined imaging magnifications of the pinhole images on the measuring points 19–23 to the incidence positions 29–33:

$$\beta_{11(19)} \times \beta_{12(24)} = \beta_{11(20)} \times \beta_{13(25)} = \beta_{11(21)} \times \beta_{14(26)} = \beta_{11(22)} \times \beta_{15(27)} = \beta_{11(23)} \times \beta_{16(28)}$$

In this embodiment, the correction optical systems 12–16 are used to allow selection of different measuring points in a projection optical system of oblique projection type, and substantially the same resolution or precision is assured to the detection of height at each measuring point.

Before explaining specific features of this embodiment, description will be made of a case where in a surface position detecting device of known type, the topography measurement is to be made to a region on a wafer surface, to be examined.

Figure 20:
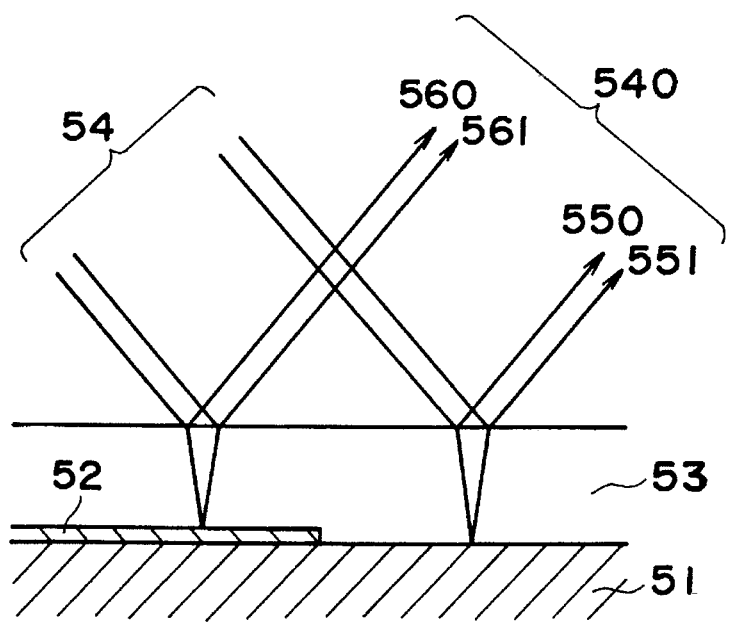
FIG. 20 is a schematic view for explaining the action of lights on a wafer surface, in a known example.

FIG. 20 is a schematic view, showing a case where light 54 having a constant beam diameter and having a uniform intensity distribution within the beam diameter impinges on a wafer having a resist 53 applied thereto and a pattern 52 formed on its substrate 51 through the preceding process. In the illustration, the light 54 is reflected by the surface of the resist 53 and also by the surfaces of the pattern 52 and the substrate 51, whereby reflection light 540 having a non-uniform intensity distribution within its beam diameter is produced.

Here, since the surface step of the pattern 52 is small and the applied resist 53 has a sufficient thickness, the surface of the resist 53 is flat.

Figure 21:
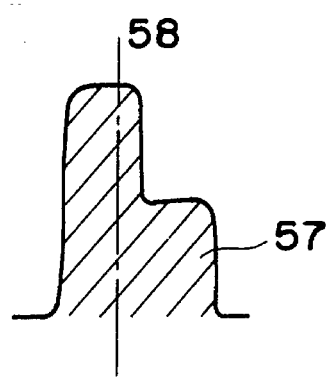
FIG. 21 is a schematic view of intensity distribution of light on a position detecting element, as reflected by a wafer, in a known example.

FIG. 21 shows an intensity distribution 57 of the reflection light 540 as imaged upon a light receiving element (not shown), the light being provided through reflection by the surfaces of the resist 53, the pattern 52 and the substrate 51.

In FIG. 20, as the light 54 having a constant beam diameter and uniform intensity distribution within the beam diameter is obliquely projected on the wafer coated with the resist 53, the light 54 is divided into a component 550 (560) reflected by the resist 53 surface, a component 551 passing through the resist 53 and, after being reflected by the substrate 51 surface, going outwardly of the resist 53, and a component 561 passing through the resist 53 and, after being reflected by the pattern 52 surface, going outwardly of the resist 53.

In this manner, in the wafer reflected light 540, the component 550 reflected by the resist 53 surface and the component 551 reflected by the substrate 51 surface are combined with each other while, on the other hand, the component 560 reflected by the resist 53 surface and the component 561 reflected by the pattern 52 surface are combined with each other.

Thus, if in FIG. 20, due to thin film interference, the combined light of the component 560 reflected by the resist 53 surface and the component 561 reflected by the pattern 52 surface has a reflectivity higher than that of the combined light of the component 550 reflected by the resist 53 surface and the component 551 reflected by the substrate 51 surface (the relation may be reversed due to a thin film interference condition), then a reflection light 540 such as shown in FIG. 21 as having a non-uniform intensity distribution 57 within the beam diameter may be produced.

In this manner, the intensity distribution of the reflection light within the beam diameter is changeable with the position of the pattern located within the beam diameter of projected light. Further, even if the position of the pattern located within the beam diameter of projected light is unchanged, the intensity distribution of the reflection light within its beam diameter is changeable with a change in the resist thickness which causes a change in the interference condition.

On this occasion, if the gravity center of the intensity distribution of the reflection light in its beam diameter as imaged on a light receiving element is detected to determine the position of incidence of the reflection light upon the light receiving element, there is a possibility that the gravity center 58 of the intensity of the reflection light changes with the relative position of the pattern 52 and the projected light or a change in the resist thickness, while the wafer position with respect to the direction of the optical axis AX of a projection lens is unchanged. Finally, the measured value contains an error corresponding to the relative position of the pattern 52 and the projected light or the thickness of the resist.

Namely, if the pattern 52 has a small surface step and the applied resist has a sufficient thickness, such as shown in FIG. 20, the surface of the resist is flat and, in terms of topography, the region is uniform. Nevertheless, if in such a case a method based on detecting the intensity gravity center 58 of reflection light is used, there is a possibility of detection error during topography measurement to the wafer surface.

In consideration of this, in the present embodiment, a CCD sensor is used as a position detecting means and an image of reflection light incident on its detection surface 17 is image-processed, by which a measurement error resulting from distortion of the reflection light image due to some optical factor (e.g. thin film interference by the resist) can be avoided and by which correct topography measurement in the region of the wafer, being examined, is assured.

Now, the specific features of the present embodiment will be explained.

Figure 5:
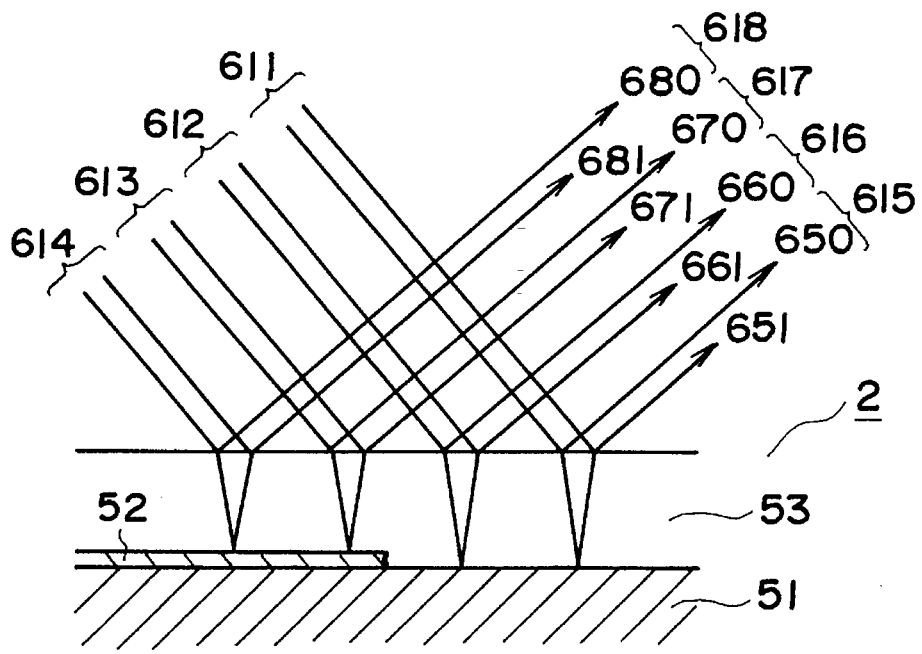
FIG. 5 is a schematic view for explaining the action on a wafer of lights from small pinholes.

FIG. 5 is a schematic view of a path of light being projected on the wafer 2 of FIG. 1. In FIG. 5, the wafer 2 has a resist 53 applied thereto and a pattern 52 formed on its substrate 51 through the preceding process. In the illustration, a plurality of (four) small lights 611–614 having substantially the same intensity as defined by a plurality of (four) small pinholes of one pinhole, are projected on the wafer 2. These (four) lights 611–614 are reflected by the surface of the resist 53, the surface of the pattern 52 or the surface of the substrate 51, by which small reflection lights 615–618 of different intensities are produced.

Here, the pattern 52 has a small surface step and the applied resist 53 has a sufficient thickness. Thus, the surface of the resist 53 is flat.

Figure 6:
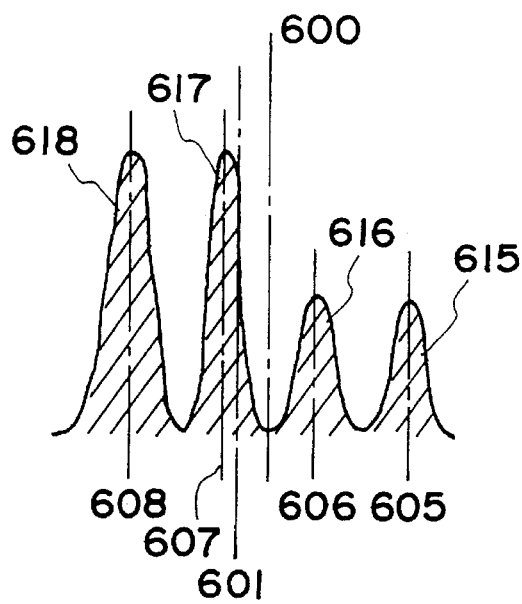
FIG. 6 is a schematic view for explaining small pinhole images on a detection surface of FIG. 1, as reflected by the wafer.

FIG. 6 is a schematic view for explaining the intensity distribution of the reflection lights 615–618 as imaged on the detection surface 17, the lights being provided through the reflection by the surfaces of the resist 53, the pattern 52 and the substrate 51.

In FIG. 5, small lights 611, 612, 613 and 614 provided by the small pinholes and having substantially the same intensity, are projected obliquely onto the wafer coated with the resist 53. Here, each of the lights 611 and 612 is divided into a component 650 (660) reflected by the surface of the resist 53 and a component 651 (661) passing through the resist 53 and, after being reflected by the surface of the substrate 51, going outwardly of the resist 53. Also, each of the lights 613 and 614 is divided into a component 670 (680) reflected by the resist 53 surface and a component 671 (681) passing through the resist 53 and, after being reflected by the pattern 52 surface, going outwardly of the resist 53.

In this manner, in the small reflection light 615 (616) being reflected by the wafer 2, the component 650 (660) reflected by the resist 53 surface and the component 651 (661) reflected by the substrate 51 surface are combined with each other. Also, in the small reflection light 617 (618) being reflected by the wafer 2, the component 670 (680) reflected by the resist 53 surface and the component 671 (681) reflected by the pattern 52 surface are combined with each other.

Thus, if in FIG. 5 due to thin film interference the reflection light 617 (618) reflected by the wafer 2 has a reflectivity higher than that of the reflection light 615 (616) reflected by the wafer 2 (the relation may be reversed due to a thin film interference condition), it results in eccentricity of intensity of the reflection lights 615–618 such as illustrated in FIG. 6.

Here, considering the intensity gravity center 601 upon the detection surface 17 of the reflection lights 615–618 having such an intensity eccentricity therewithin, like the case of the gravity center 58 of the intensity distribution 57 of the reflection light 540 as described with reference to FIG. 20, the intensities of the reflection lights 615–618 are changeable with the position of the pattern located at the reflection points of the small lights 611–614. Further, even if the position of the pattern located at the reflection points of the lights 611–614 is unchanged, the intensities of the reflection lights 615–618 are changeable (eccentricity is caused between the light 615 (616) and the light 617 (618)) with a change in the resist thickness which causes a change in the interference condition.

In this embodiment, in consideration thereof, a CCD sensor is used as a position detecting element and, respective centers 605, 606, 607 and 60 of the small reflection lights 615–618 are detected. And, an average of these centers 605–608 is determined as the center 600 of the whole. This center 600 is constant irrespective of any eccentricity of intensity among the reflection lights 615–618.

Next, description will be made of a case wherein, in FIG. 5, one small light 614 of the lights 611–614 is reflected at the boundary between the substrate 51 and the pattern 52 so that the resultant small reflection light 618 has a distorted intensity distribution.

Figure 7:
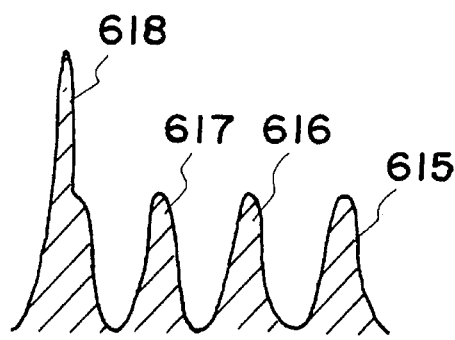
FIG. 7 is a schematic view for explaining small pinhole images on a detection surface of FIG. 1, as reflected by the wafer.

FIG. 7 is a schematic view wherein the small diameter reflection lights 615–617 formed by reflection at the resist 53 surface and the substrate 51 surface and the small diameter reflection light 618 formed by reflection at the boundary between the substrate 51 and the pattern 52 and the resist 53, are imaged on the detection surface 17.

Since in this case the centers of the lights 615–618 are determined independently of each other, due to the averaging effect, a measurement error resulting from the distortion of intensity distribution of the light 618 is reduced to a quarter (¼).

Further, when the respective centers 605–608 of the reflection lights 615–618 are determined, measurement with the error being considerably reduced irrespective of distortion of intensity distribution of the reflection light is assured.

Namely, any one of the following examples may be adopted in this embodiment: a method in which a slice level of a certain proportion to each of the small reflection lights 611–614 is set and, on the basis of the points of intersection between that slice level and the opposite side edges of the reflection light image, the center is determined; a similar method in which the center is determined on the basis of the point of intersection between that slice level and the one side edge of the reflection light image; a method in which an upper limit slice level and a lower limit slice level, each of a certain proportion, are set and, on the basis of the area as enclosed by these levels and the reflection light image, the center is determined; and a method in which the reflection light image in a case where the surface being examined comprises an idealistic mirror surface is memorized in a memory beforehand and, from the matching with the reflected light image having a distorted intensity distribution, the center is determined.

In this embodiment as described, a CCD sensor is used as the position detecting element and an image of the reflection light upon the detection surface 17 is image-processed. By suitably selecting the number of the lights to be used for the detection, the topography within the zone of the wafer to be examined can be measured correctly.

Now, description will be made of an example wherein measurement is made with respect to plural points on a wafer 2 and results of topography measurement to a zone to be examined on the wafer 2 are reflected to the measured values of these points.

Figure 8:
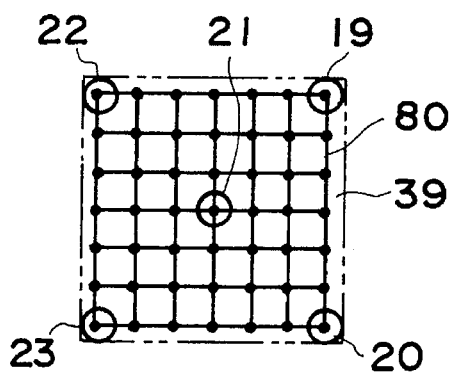
FIG. 8 is a schematic view for explaining the position of a pattern region and grids for topography measurement.

FIG. 8 shows the positional relationship among a certain pattern region 39 on the wafer 2 of FIG. 2, plural measuring points 19–23 and a grid 80 for topography measurement in a zone to be examined.

In the state shown in FIG. 8, the pattern region 39 of the wafer 2 is placed in alignment with the pattern of the reticle 1a with respect to the X-Y plane. In this embodiment, the grid 80 as illustrated includes the measuring points 19–23 (although it may not include them). Also, the wafer stage 3 is moved along the X-Y plane with the height position of the wafer 2 in the direction of the optical axis Ax of the projection lens being held fixed, and the surface position measurement is done successively while using the measuring point 21. Here, by suitably selecting the number of grid points as well as the interval of the grid points, for measurement of the surface position of the pattern region 39, the topography in the pattern region 39 can be measured correctly.

Figure 9A:
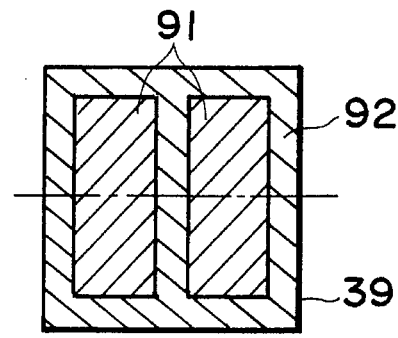
FIGS. 9A and 9B are schematic views for explaining the topography in a pattern region.
Figure 9B:
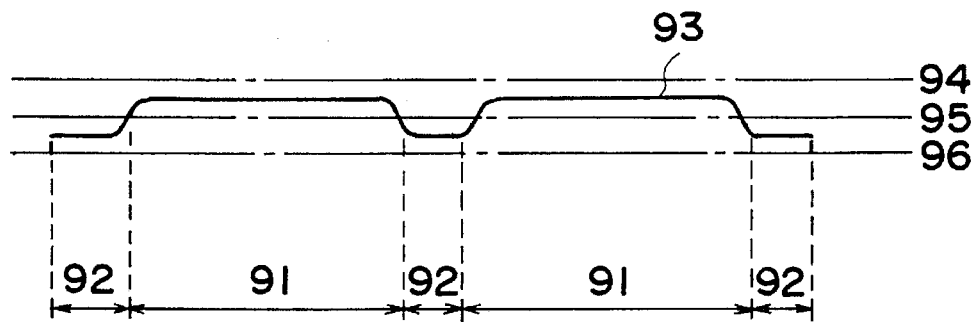

FIG. 9A shows the topography of the pattern region 39, and FIG. 9B shows the topography section at the position depicted by a broken line in FIG. 9A.

In this embodiment, by using a plurality of such surface position data, an offset (correction amount) for detection of the surface position of each pattern region 39 of the wafer 2 is calculated.

Figure 10:
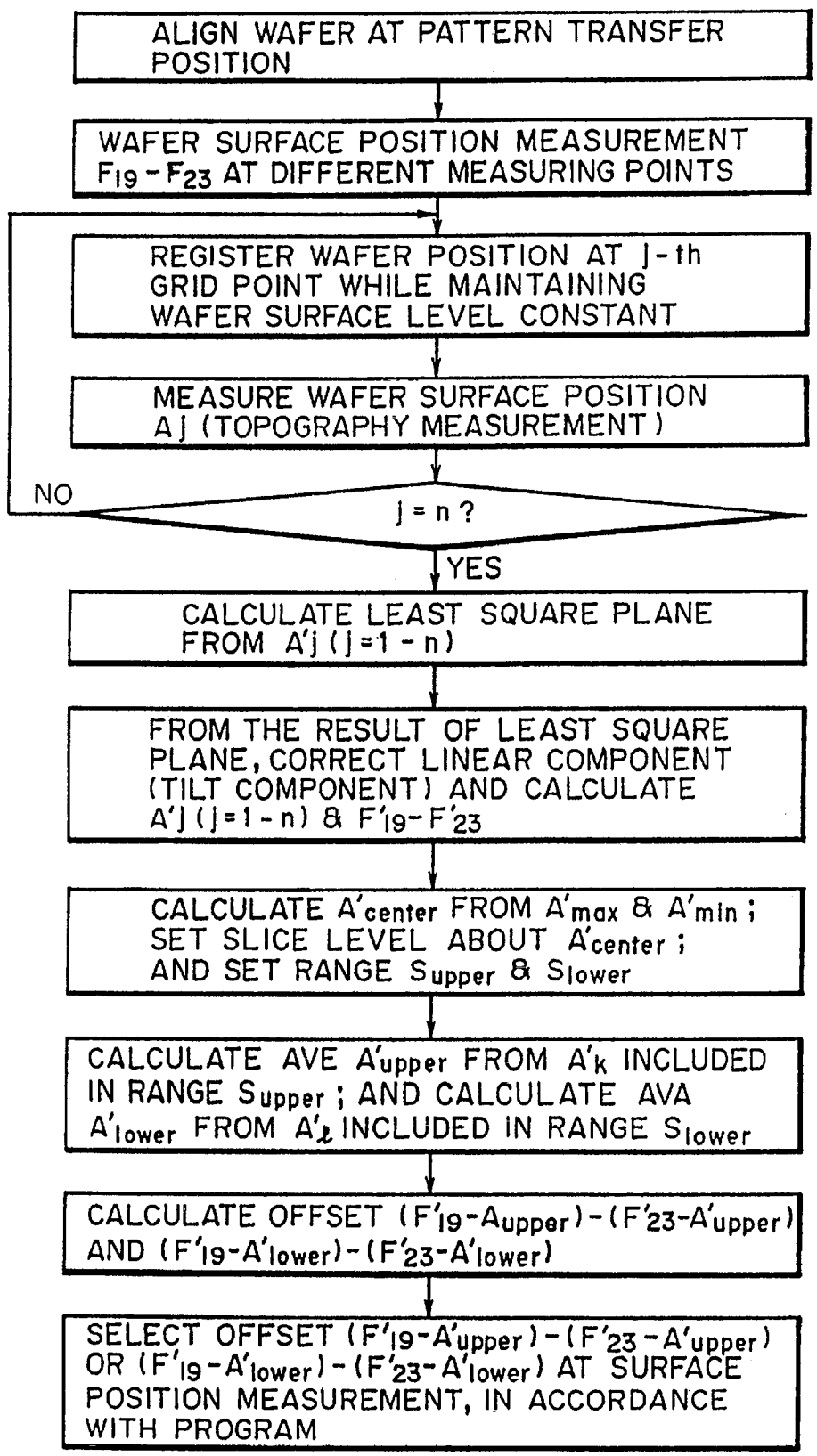
FIG. 10 is a flow chart of offset (correction) calculation.

FIG. 10 is a flow chart of the calculation of this offset (correction amount). Now, referring to this flow chart of FIG. 10 as well as FIGS. 2, 8 and 9, the calculation of offset will be explained.

Initially, the wafer stage 3 is moved under the control of the stage controller 4 to move the wafer 2 along the X-Y plane so that a particular pattern region 39 of the wafer 2 (e.g. a first shot of the wafer 3) is aligned with the pattern of the reticle 1a.

Then, at that position, the surface position of the pattern region 39 of the wafer 2 is measured with respect to the measuring points 19, 20, 21, 22 and 23, whereby measured values $f_{19}$, $f_{20}$, $f_{21}$, $f_{22}$ and $f_{23}$ are obtained. Subsequently, while maintaining the wafer 2 position in the direction of the optical axis Ax of the projection lens 1, i.e., in the height direction, the wafer 2 is moved successively along the X-Y plane so that the grid points (number n) of the grid 80 of FIG. 8 are successively registered with the pinhole image forming position (position of incidence of the small lights) of the measuring point 21.

For each of the grid points of the number n, the wafer 2 surface is measured at the measuring point 21, whereby measured values (surface position data) of a number n are obtained. These measured values of number n are denoted hereinafter by Aj (j=1 to n).

Here, calibration is made to the measured values of the measuring points 19–23 with reference to the X-Y plane along which the stage 3 is driven, so that all the measured values take the same value.

Namely, if there are grid points (of the grid points of a number n) being registered with the measuring points 19, 20, 21, 22 and 23 and if the measured values of the corresponding grid points are denoted by Ao, Ap, Aq, Ar and As, then since calibration has not been effected there are the following relations:

$f_{19} \neq Ao$, $f_{20} \neq Ap$, $f_{21} \neq Aq$, $f_{22} \neq Ar$ and $f_{23} \neq As$ (if calibration is done, the relations are $f_{19}=Ao$, $f_{20}=Ap$, $f_{21}=Aq$, $f_{22}=Ar$ and $f_{23}=As$).

Here, while assuming $C_{19}=f_{19}-Ao$, $C_{20}=f_{20}-Ap$, $C_{21}=f_{21}-Aq=0$, $C_{22}=f_{22}-Ar$ and $C_{23}=f_{23}-As$, those measured values of the points 19–23 as corrected such as follows are determined as new measured values $F_{19}-F_{23}$, respectively:

$F_{19}=f_{19}-C_{19}$ $F_{20}=f_{20}-C_{20}$ $F_{21}=f_{21}$ $F_{22}=f_{22}-C_{22}$ $F_{23}=f_{23}-C_{23}$

By using them, the following calculation of topography offset correction is done.

If there is no grid point (of the grid points of number n) being registered with the measuring points 19–23, the interpolation may be made to measured values of those grid points adjacent to the measuring points 19–23 and, by using measured values Ao(inter.), Ap(inter.), Aq(inter.), Ar(inter.) and As(inter.) determined by the interpolation, correction may be made in a similar manner to determine new measured values $F_{19}-F_{23}$.

Calibration may not be done if, with reference to the X-Y plane along which the stage 3 is moved, the measuring points 19–23 of this embodiment is adjusted beforehand so that the measured values of them are equal to each other. On that occasion:

$F_{19}=f_{19}$ $F_{20}=f_{20}$ $F_{21}=f_{21}$ $F_{22}=f_{22}$ $F_{23}=f_{23}$ and then the following calculation of topography offset correction is done (the flow charts of FIGS. 10, 11, 14, 15 and 16 are based on an assumption that such a preparatory calibration has been done).

Subsequently, least square plane approximation is made to the data Aj of a number n, being measured. Then, by using the linear component of the pattern region 39 of the wafer 2, tilt correction is done to the data Aj of a number n and five data $F_{19}$–$F_{23}$, whereby new data A'j of a number n as well as five new data $F'_{19}$–$F'_{23}$ are determined.

In the pattern region 39 of FIG. 9A, each zone 91 is such an area in which a memory or the like is provided and it is protruded in terms of topography, whereas a zone 92 is such an area in which a scribe line, a bonding pad or the like is provided and it is recessed in terms of topography.

Here, the maximum $A'_{max}$ and the minimum $A'_{min}$ of the data A'j of number n are detected with respect to the direction of the topography section 93 in FIG. 9B, that is, in the height direction, and an average $A'_{center}$ 95 of them (corresponding to the middle of the data A7) is calculated. Then, about this, slice levels 94 and 96 are set with the same interval.

Assuming the ranges sandwiched by the slice levels 94, 95 and 96 of the same interval as being $S_{upper}$ and $S_{lower}$, respectively, and assuming the data included in the range $S_{upper}$ and the data included in the range $S_{lower}$ as being $A'_k$ and $A'_1$, respectively (where k=1 to h, l=1 to i and h+i=n), an average $A'_{upper}$ of the data $A'_k$ of number h and an average $A'_{lower}$ of the data $A'_{lower}$ of number i are calculated.

For example, in a case where a wiring pattern is to be transferred to a protruded region 91 having a memory formed thereon, since such a wiring pattern has a small depth of focus as compared with the pattern to be transferred to the recessed region 91, the offset (correction amount) is set to the measuring points 19–23 in the following manner, to be subtracted from the measured value:

$F_{19}'-A'_{upper}$ $F_{20}'-A'_{upper}$ $F_{21}'-A'_{upper}$ $F_{22}'-A'_{upper}$ $F_{23}'-A'_{upper}$ Namely, by using $F_{19}-(F_{19}'-A'_{upper})$ $F_{20}-(F_{20}'-A'_{upper})$ $F_{21}-(F_{21}'-A'_{upper})$ $F_{22}-(F_{22}'-A'_{upper})$ $F_{23}-(F_{23}'-A'_{upper})$, the surface position of the pattern region 39 is controlled and the pattern transfer to the pattern region 91 and to the pattern region 92 is effected simultaneously.

As the offset (correction amount) for detection of the wafer surface position with regard to the remaining regions of the wafer 2, the above-described values $F_{19}'-A'_{upper}$ to $F_{23}'-A'_{upper}$ may be subtracted from the measured values of the measuring points 19–23 in each pattern region, whereby detection of surface position of the region 91 which is protruded in terms of topography is enabled.

Similarly, one or more bonding pads are to be transferred to the recessed region 92, since the pattern of such a bonding pad has a small depth of focus as compared with the pattern to be transferred to the protruded region 91, the offset (correction amount) to the measured values of the measuring points 19–23 are set as follows:

$F_{19}'-A'_{lower}$ $F_{20}'-A'_{lower}$ $F_{21}'-A'_{lower}$ $F_{22}'-A'_{lower}$ $F_{23}'-A'_{lower}$ The processes described above are programmed beforehand in the focus controller 18 of FIG. 1, and values of offset (correction amount) are stored into a memory of the focus controller 18.

Whether $F_{19}'-A'_{upper}$ to $F_{23}'-A'_{upper}$ or $F_{19}'-A'_{lower}$ to $F_{23}'-A'_{lower}$ are to be used as the offset (correction amount), is predetermined in the program corresponding to the process to be executed.

Subsequently, on the basis of the surface position data about the measuring points within the pattern region of the wafer 2 and the offset (correction amount), having been determined in the system shown in FIG. 1, the surface position of the pattern region (region to be examined) is detected. Then, the wafer 2 is displaced in the direction of the optical axis AX and also it is inclined with respect to the plane (x-y plane) orthogonal to the optical axis AX, so as to reduce to zero the difference between the thus determined surface position and the image plane position of the projection lens 1 predetected. By this, the pattern image of the reticle 1a can be focused on the pattern region of the wafer 2.

Here, the surface position of the pattern region (position of the surface being examined) may be determined as the least square plane as can be calculated from the surface position data on the measuring points within the pattern region.

The above-described operation is done sequentially with respect to each of the pattern regions of the wafer 2, and the pattern of the reticle 1a is transferred successively by projection to these regions.

It is not necessary to execute the measurement for offset calculation, for all wafers. It may be done to at least one wafer of the wafers having been treated in the same process. Thus, as an example, the correction amount may be calculated by using a certain pattern region of a first wafer in the same lot; it may be memorized into a memory; and the thus memorized offset may be used in the surface position detection for a second and the remaining wafers in the same lot.

Alternatively, measurement for offset calculation may be done only to a first wafer to be processed just after replacement of the reticles. In any case, there is a very small effect to the throughput of the whole semiconductor manufacturing processes.

Figure 11:
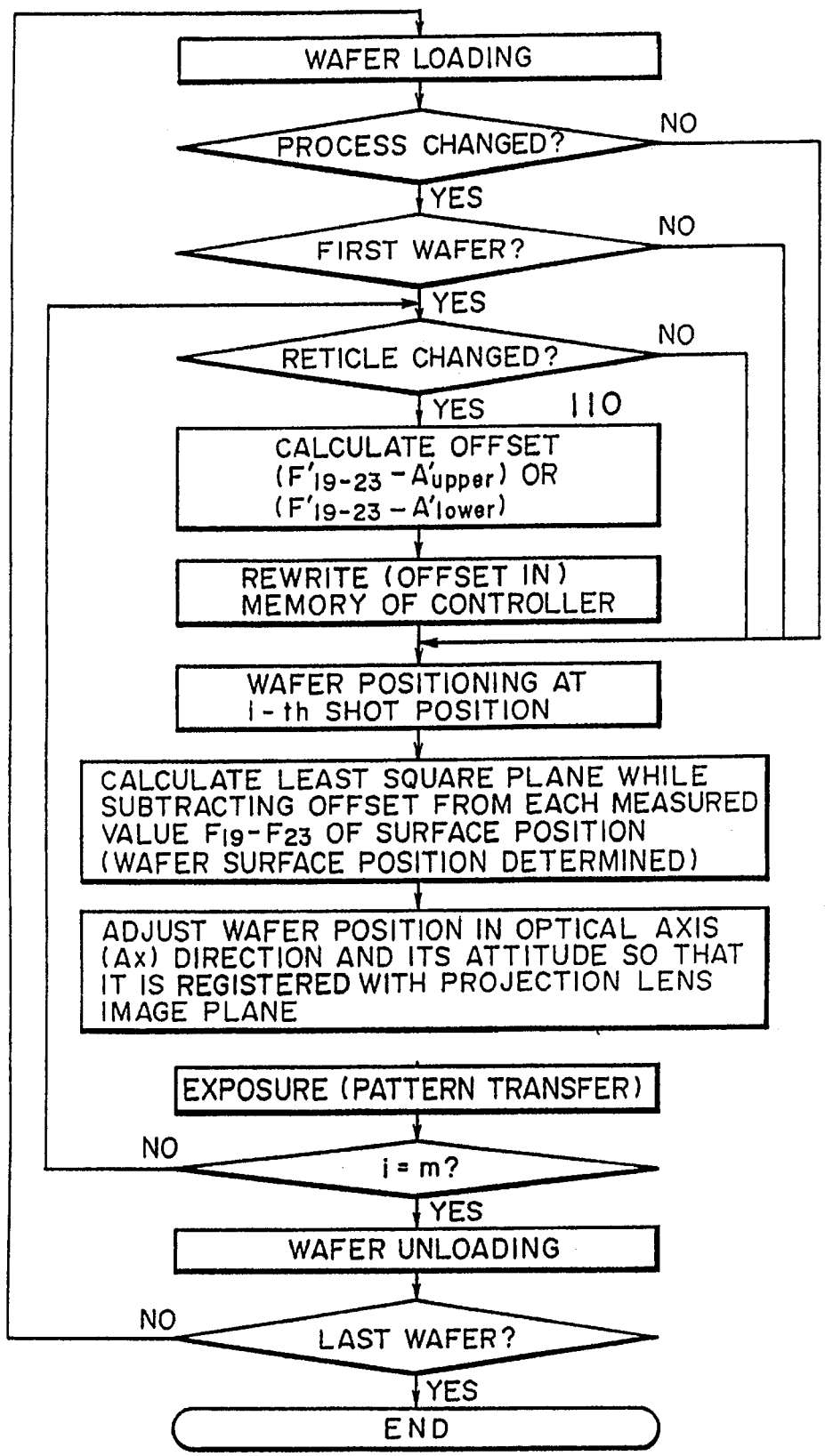
FIG. 11 is a flow chart of an exposure process including offset setting.

FIG. 11 is a flow chart of an exposure operation in a case where, for each lot, the offset calculation is done. The offset calculation step 110 in this drawing is executed in accordance with the sequence of FIG. 10.

In this embodiment as described, whether the range $S_{upper}$ or the range $S_{lower}$ is to be selected in accordance with the process, is predetermined and predesignated in the program for the pattern exposure, but it may be automatically selected and determined independently of the process, such as described below.

A first example is simply such that: the offset of the one of the ranges $S_{upper}$ and $S_{lower}$ that has data of a number larger than that of the other, may be automatically selected.

A second example is such that: a least square plane of the data measured in response to the grid point is detected; the data with its linear component being corrected is denoted by A'j(j=1 to n), wherein those included in the range $S_{upper}$ are denoted by $A'_k$ while those included in the range $S_{lower}$ are denoted by $A'_1$ (where k=1 to h, l=1 to i, and h+i=n); and an average $A'_{upper}$ of the data $A'_k$ of number h as well as an average $A'_{lower}$ of the data $A'_1$ of number i are calculated.

Here, to each of the measured values of the measuring points 19–23, the offset is determined automatically as follows:

$F_{19}'-(k \times A'_{upper}+l \times A'_{lower})/n$ $F_{20}'-(k \times A'_{upper}+l \times A'_{lower})/n$ $F_{21}'-(k \times A'_{upper}+l \times A'_{lower})/n$ $F_{22}'-(k \times A'_{upper}+l \times A'_{lower})/n$ $F_{23}'-(k \times A'_{upper}+l \times A'_{lower})/n$ Thus, particular attention is paid to the wide-area portion of the pattern region 39 and the surface position is set at the gravity position of the occupied area ratio.

Figure 12:
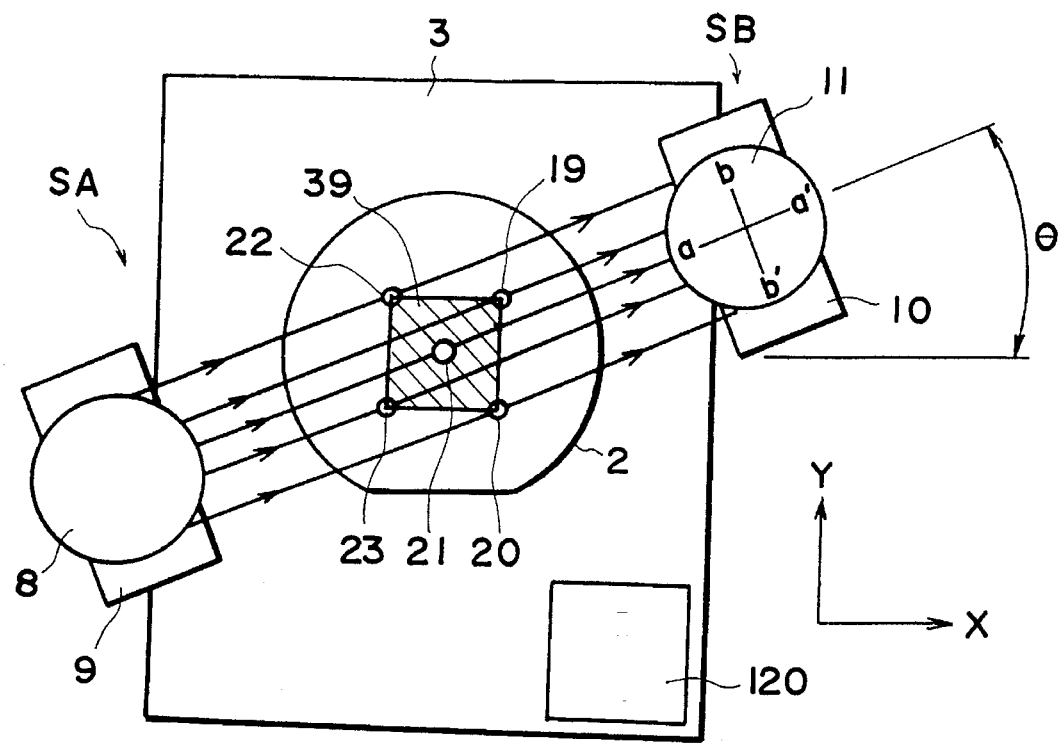
FIG. 12 is a schematic view of a portion in which an area CCD sensor 120 is disposed on a stage 3.

A third example is such that: as shown in FIG. 12, an area (two-dimensional) CCD sensor 120 is provided on the stage 3, for this purpose. In this case, the stage 3 is moved along the X-Y plane, and the CCD sensor 120 is placed just below the projection lens 1. Then, the stage 3 is moved in the direction of the optical axis AX of the projection lens 1 and, also, it is tilted with respect to the plane (x-y plane) orthogonal to the optical axis AX. The reticle 1a is illuminated by the illumination system 1c, and the pattern of the reticle 1a is imaged upon the area CCD sensor 120 mounted on the stage 3. From a two-dimensional light intensity distribution of the pattern image formed on the CCD sensor 120, two-dimensional information about the position distribution of the pattern of the reticle 1a projected on and transferred to the pattern region 39 is produced.

The two-dimensional information of this pattern image is stored into a memory, and that portion of the pattern region 39 to which the pattern image is to be transferred is discriminated. Then, those of the grid points A'j at which the pattern image is present are discriminated; and whether the topography (height of the optical axis AX) of those grid points where the pattern image is present is included in the range $S_{upper}$ or in the range $S_{lower}$, is discriminated. Finally, the offset is selected automatically ($F_{19}'-A'_{upper}$ to $F_{23}'-A'_{upper}$ or $F_{19}'-A'_{lower}$ to $F_{23}'-A'_{lower}$).

Figure 14:
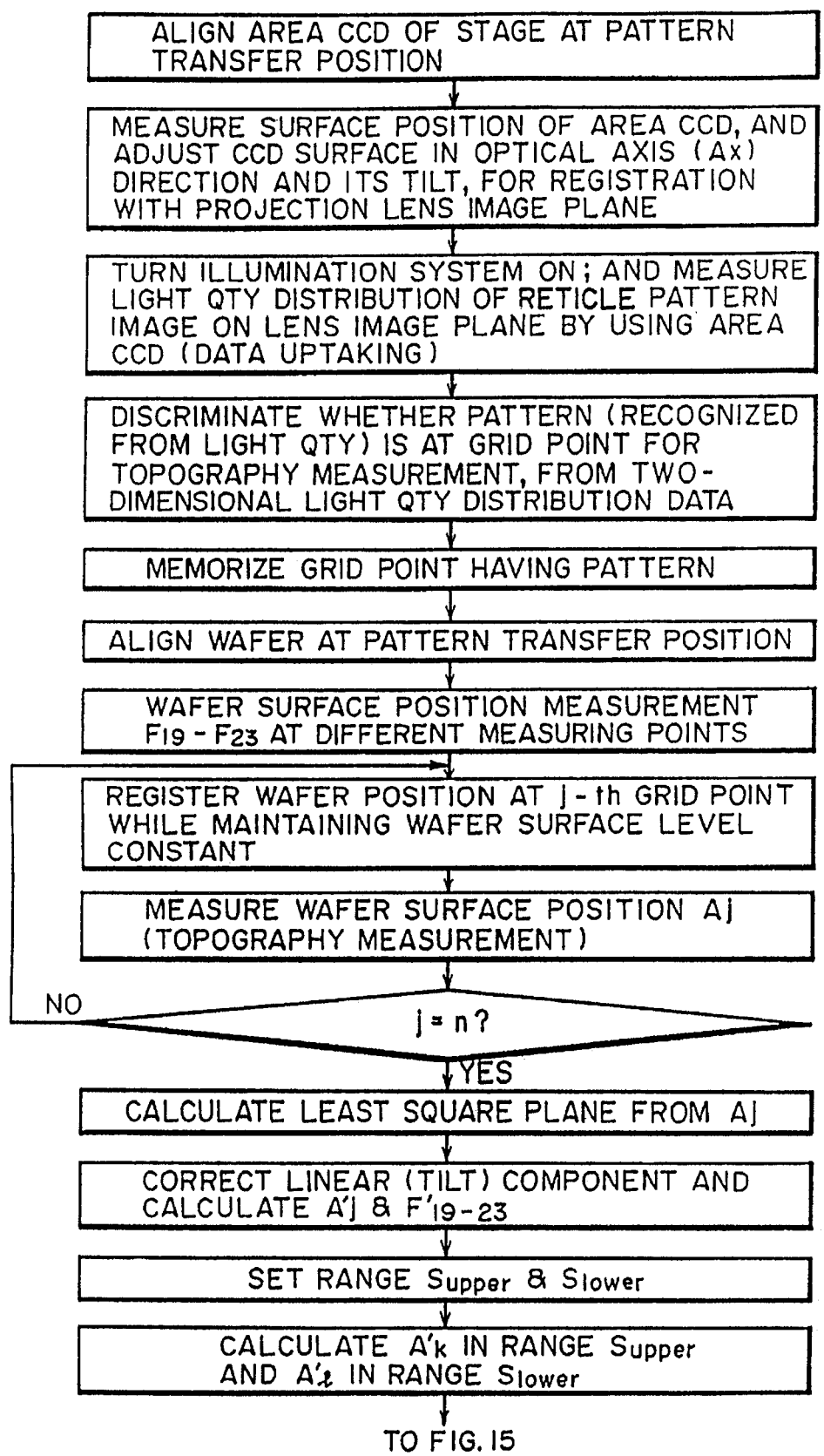
FIG. 14 is a flow chart of automatic offset (correction) setting.
Figure 15:
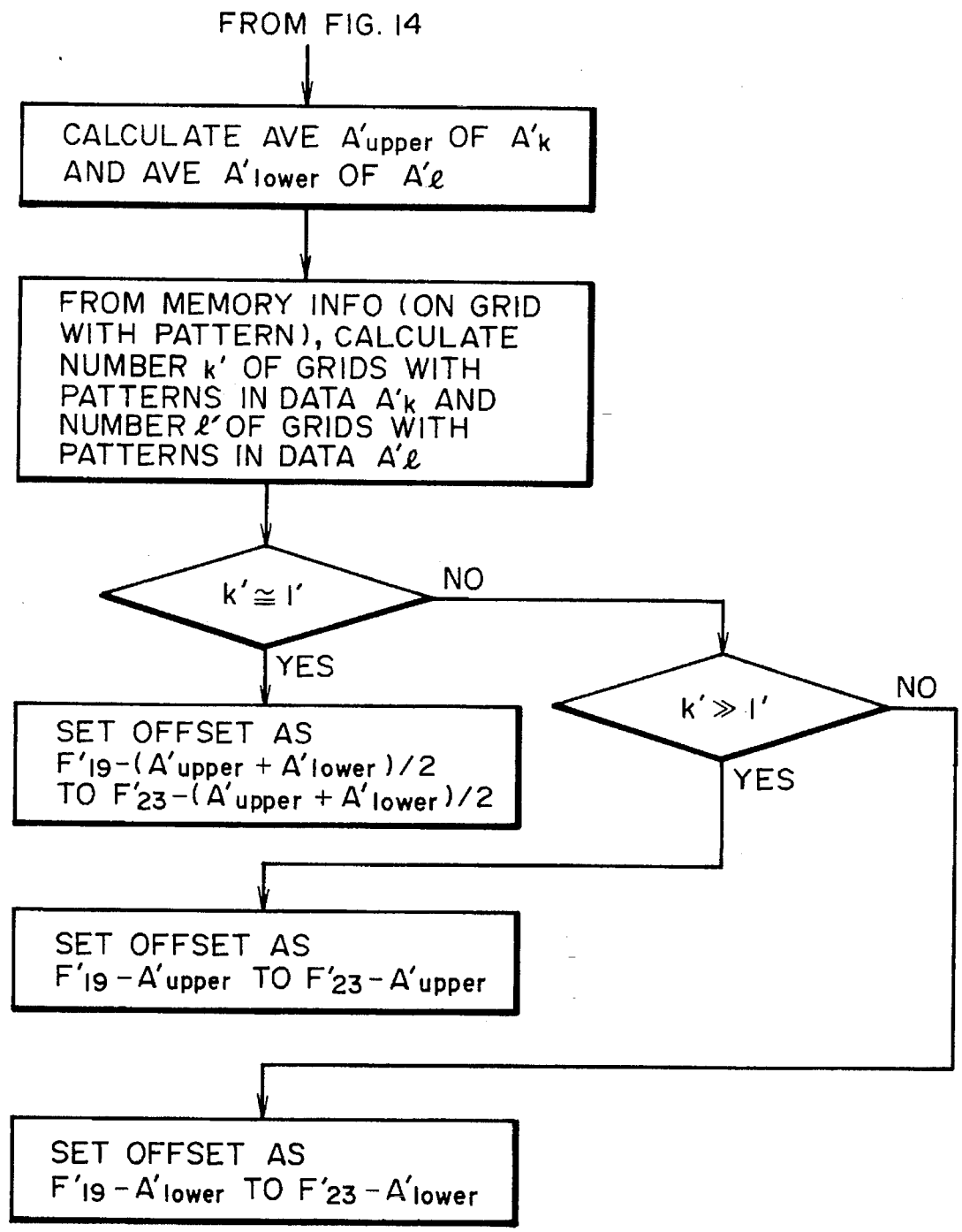
FIG. 15 is a flow chart of automatic offset (correction) setting.

If the two-dimensional distribution of the pattern image is positioned in both of the ranges $S_{upper}$ and $S_{lower}$, an average offset of them is used such as follows:

$F_{19}'-(A'_{upper}+A'_{lower})/2$ $F_{20}'-(A'_{upper}+A'_{lower})/2$ $F_{21}'-(A'_{upper}+A'_{lower})/2$ $F_{22}'-(A'_{upper}+A'_{lower})/2$ $F_{23}'-(A'_{upper}+A'_{lower})/2$ FIGS. 14 and 15 are the flow charts of automatic offset setting in this case.

Figure 13:
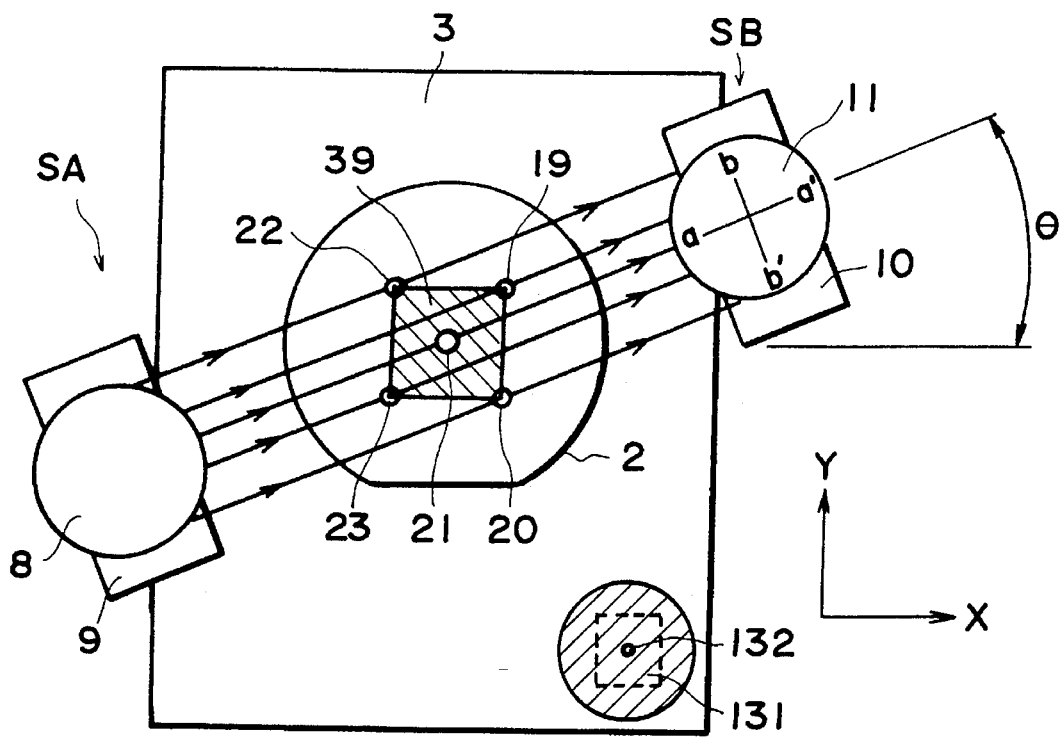
FIG. 13 is a schematic view of a portion in which a photoreceptor 131 having a pinhole 132 is provided on a stage 13.

In the third example described above, the area CCD sensor 120 provided on the stage 13 may be replaced by a light-receiving element 131 with a pinhole 132, such as shown in FIG. 13.

On that occasion, the stage 3 may be moved along the X-Y plane so that, within the region on which the pattern image of the reticle 1a is projected by the projection lens 1, each grid point of the grid 130 is registered with the position of the light-receiving element 131 having a pinhole. Thus, at each grid point position, the light-receiving element 131 measures the quantity of light passed through the pinhole 132.

Here, the light-receiving element 131 with pinhole 132 is held approximately at the height of the image plane of the projection lens 1, with respect to the optical axis AX direction.

The diameter of the pinhole 132 may be made sufficiently larger than the pattern image of the reticle 1a projected on the pinhole 132 (diameter φ may be about 100 microns, like the size of the scribe line). The grid 130 may be of the same number and of the same pitch as the topography measurement grid 80, or it may be one that includes the grid 80.

On that occasion, two-dimensional information of the position distribution of the pattern of the reticle 1a projected on and transferred to the pattern region 39 can be produced from the light intensity distribution of each grid point. The information about the light intensity distribution of each grid point is stored into a memory, and that portion of the pattern region to which the pattern image is to be transferred is discriminated. The offset setting is similar to that described above.

Figure 16:
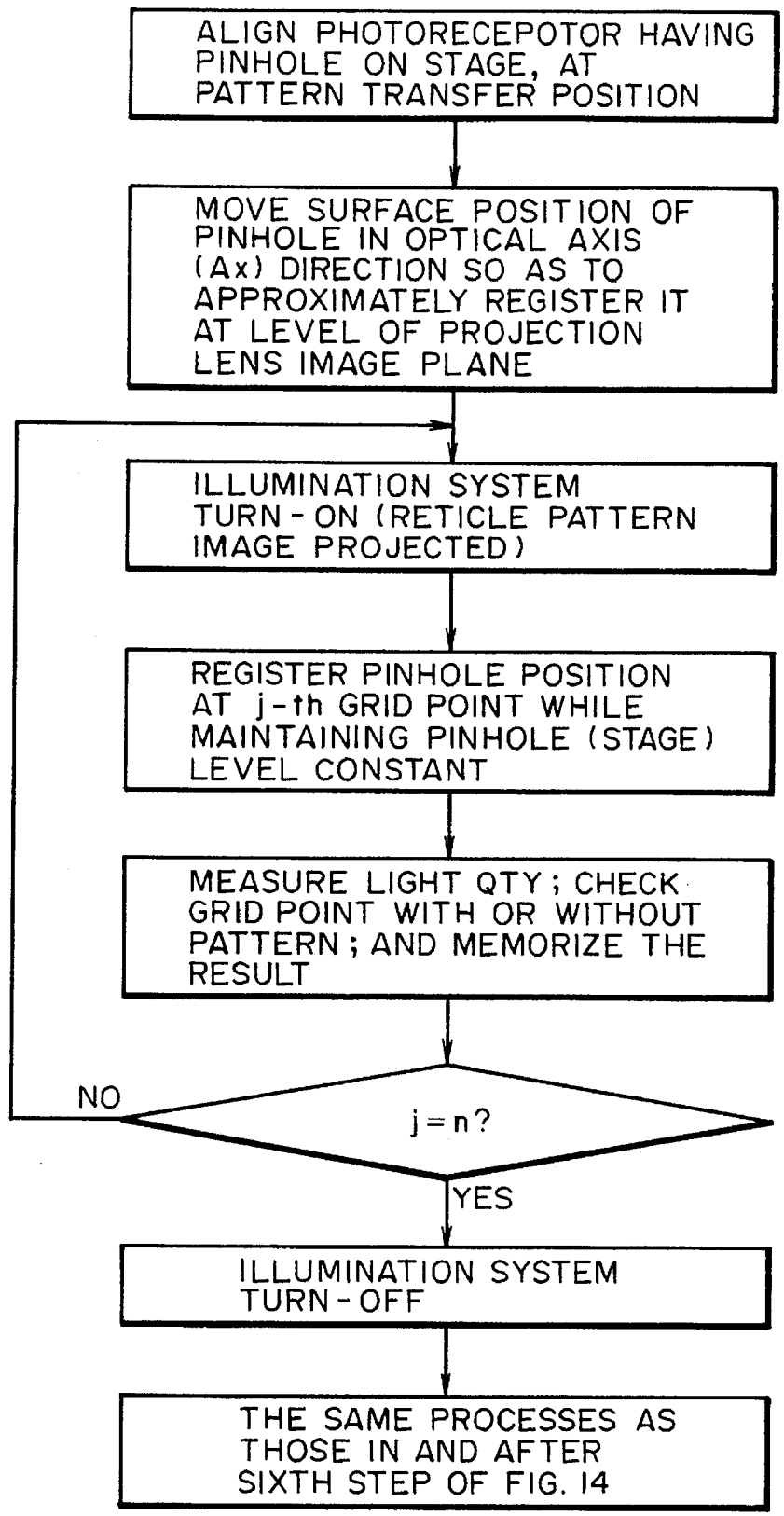
FIG. 16 is a flow chart of automatic offset (correction) setting.

FIG. 16 is a flow chart of automatic offset setting in this case.

In the examples shown in FIGS. 13, 14 and 15, topography measurement grid points may be set after two-dimensional information of the pattern image is memorized into a memory and that portion of the pattern region 39 to which the pattern image is to be transferred is discriminated.

Figure 17:
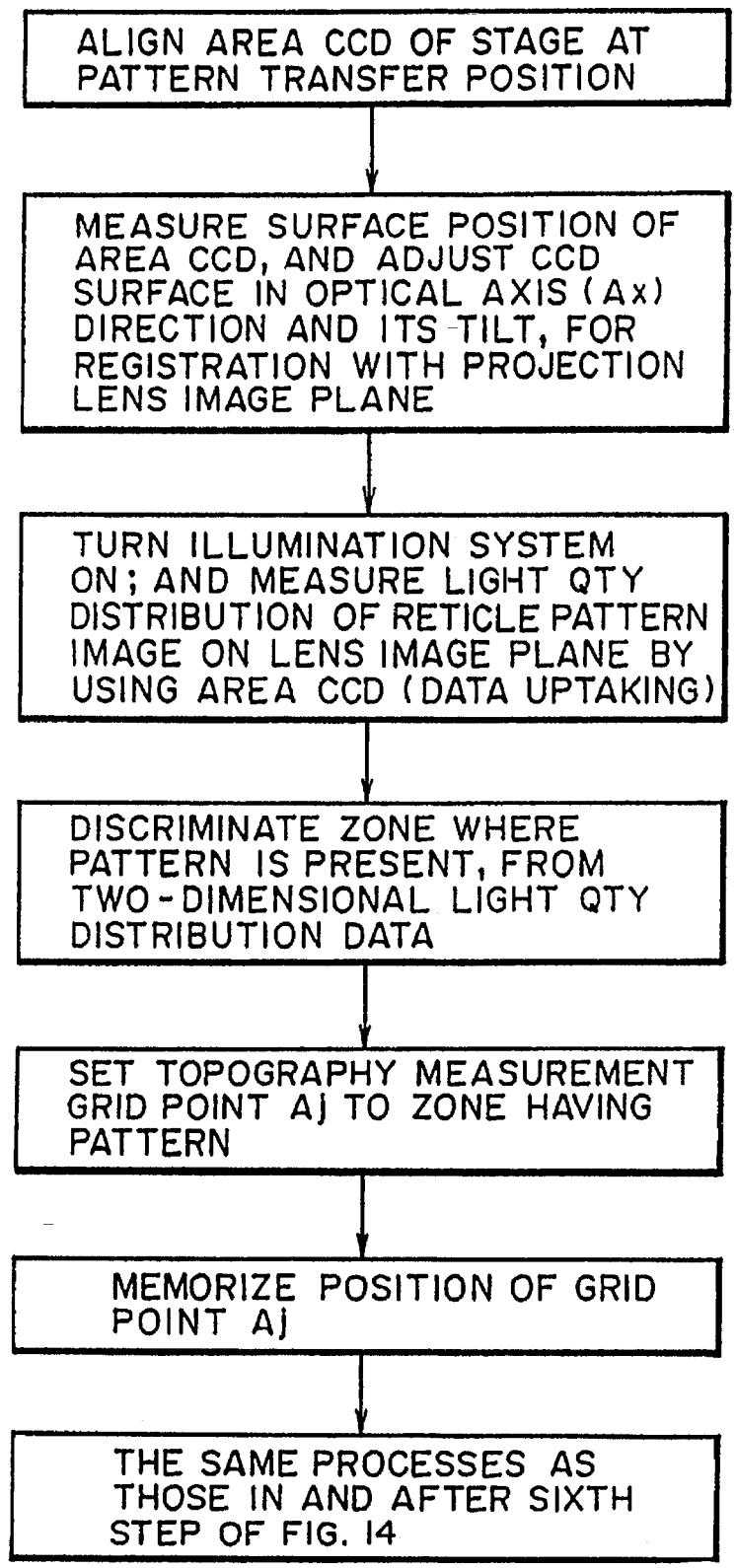
FIG. 17 is a flow chart of automatic offset (correction) setting.

FIG. 17 is a flow chart of automatic offset setting in such a case.

While in this embodiment the manner of determining an offset (correction amount) with respect to a memory chip whose wafer surface topography is relatively simple has been explained, for a chip such as ASIC having a relatively complex wafer surface topography the offset may be determined in the manner described below.

Figure 18A:
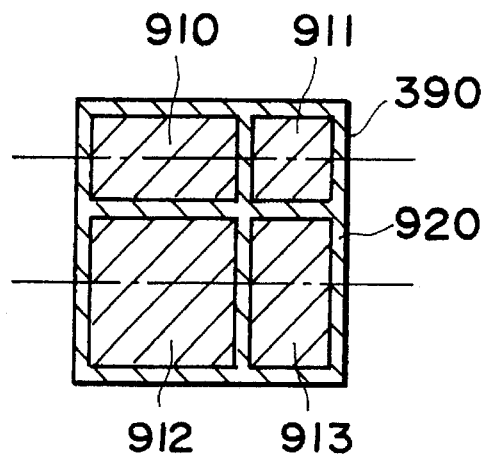
FIGS. 18A–18C are schematic views for explaining topography in a pattern region.
Figure 18B:
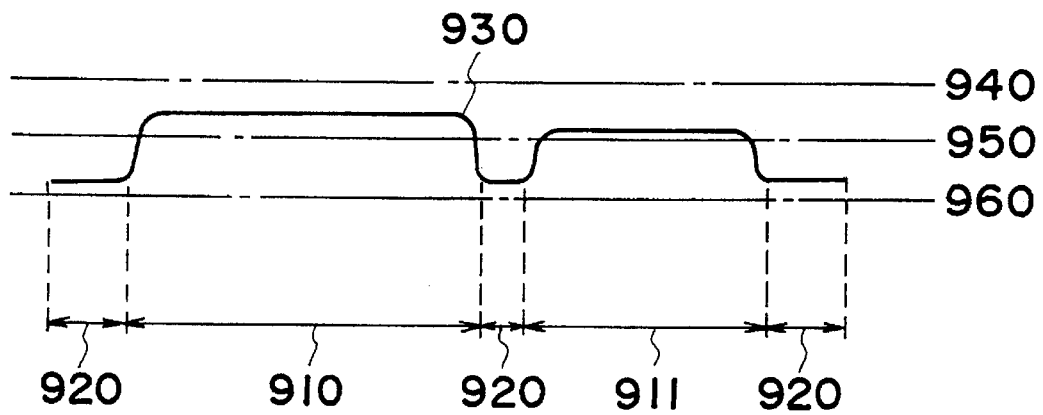

FIG. 18A is a schematic view of topography of a pattern region 390 of a chip such as ASIC. FIG. 18B is a schematic view of a topography section, taken along a dash-and-dots line in FIG. 18A, and FIG. 18B is a similar view taken on a dash-and-dot line in FIG. 18A.

In the pattern region 390 of FIG. 18A, zones 910–913 are such areas which are protruded in terms of topography, with different heights. Zone 920 is such an area which is recessed in terms of topography and in which a scribe line or a bonding pad or pads are formed. Also in this case, the operation up to calculation of tilt-corrected data A'j of a number n as well as five data $F'_{19}$ to $F'_{23}$ is the same as described above.

Figure 18C:
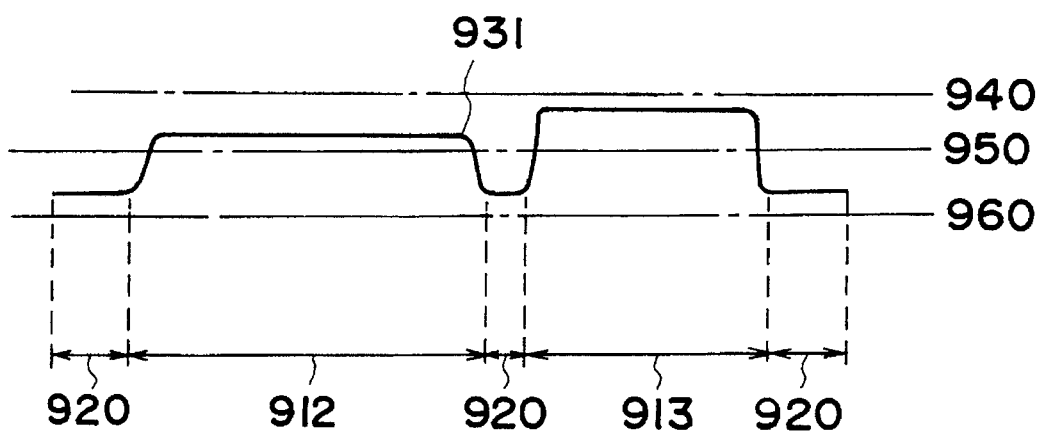

Here, a maximum $A'_{max}$ and a minimum $A'_{min}$ in the direction depicted in the topography section 930 or 931 of FIG. 18B or 18C, i.e., in the direction of height are determined and then an average $A'_{center}$ 950 (corresponding to the middle of the data A'j) is calculated. About this average, slice levels 940 and 960 are set with regular intervals.

The ranges as sandwiched by these slice levels 940, 950 and 960 of regular intervals are denoted by $S_{upper}$ and $S_{lower}$, respectively.

Figure 19A:
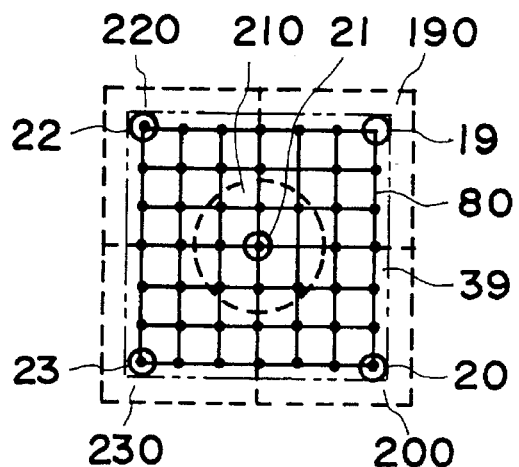
FIGS. 19A and 19B are schematic views for explaining the position of a pattern region and grids for topography measurement.

FIG. 19A is a schematic view showing the positional relationship among a certain pattern region of a wafer 2 (FIG. 2), measuring points 19–23, a topography measurement grid 80, and regions 190, 200, 210, 220 and 230 by which grids of the topography measurement grid 80 are divided.

Figure 19B:
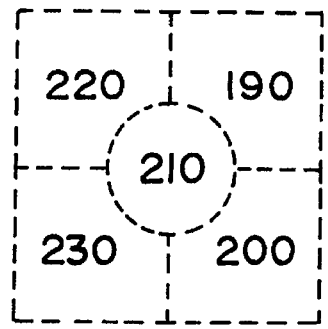

FIG. 19B is a schematic view showing only the regions 190–230 with which the grid points are divided into five portions corresponding to the number of the measuring points 19–23.

In this embodiment, different offsets (correction amounts) are set with respect to the measuring points 19–23, respectively: that is, data $A'_{190j}$, $A'_{200j}$, $A'_{210j}$, $A'_{220j}$ and $A'_{230j}$ of number n (the data at the boundary between adjacent regions is included duplicately in both of them).

Of the data $A'_{190j}$ included in the region 190, an average of the data within the range $S_{upper}$ defined by the slice levels 940 and 950 is denoted by $A'_{190upper}$, while an average of the data within the range $S_{lower}$ defined by the slice levels 950 and 960 is denoted by $A'_{190lower}$.

Similarly, for the data $A'_{200j}$, $A'_{210j}$, $A'_{220j}$ and $A'_{230j}$ included in the regions 200, 210, 220 and 230, respectively, averages $A'_{200upper}$, $A'_{210upper}$, $A'_{220upper}$ and $A'_{230upper}$ of the data within the range $S_{upper}$ as well as averages $A'_{200lower}$, $A'_{210lower}$, $A'_{220lower}$ and $A'_{230lower}$ of the data within the range $S_{lower}$ are calculated (generally in this case, $A'_{190upper} \neq A'_{200upper} \neq A'_{210upper} \neq A'_{220upper} \neq A'_{230upper}$, and $A'_{190lower} \neq A'_{200lower} \neq A'_{210lower} \neq A'_{220lower} \neq A'_{230lower}$).

For reflection of the offset, if for example a pattern of a smaller depth of focus than the pattern to be transferred to the recessed region 920 is to be transferred to the protruded regions 910–913, the following offsets may be set to the measuring points 19–23 and they may be subtracted from the measured values, respectively:

$F_{19}' - A'_{190upper}$ $F_{20}' - A'_{200upper}$ $F_{21}' - A'_{210upper}$ $F_{22}' - A'_{220upper}$ $F_{23}' - A'_{230upper}$ Namely, by using $F_{19} - (F_{19}' - A'_{190upper})$ $F_{20} - (F_{20}' - A'_{200upper})$ $F_{21} - (F_{21}' - A'_{210upper})$ $F_{22} - (F_{22}' - A'_{220upper})$ $F_{23} - (F_{23}' - A'_{230upper})$, the surface position of the pattern region 39 is controlled, and pattern transfer is executed.

Similarly, if to the recessed region 920 a pattern of a smaller depth of focus than that of a pattern to be transferred to the other region is to be transferred, the following offsets may be set to the measuring points 19–23:

$F_{19}' - A'_{190lower}$ $F_{20}' - A'_{200lower}$ $F_{21}' - A'_{210lower}$ $F_{22}' - A'_{220lower}$ $F_{23}' - A'_{230lower}$ The above-described sequence is programmed beforehand in the focus controller 18 of FIG. 1; the quantities of offsets are memorized in the memory of the focus controller 18; whether $F_{19}' - A'_{190upper}$ to $F_{23}' - A'_{230upper}$ or $F_{19}' - A'_{190lower}$ to $F_{23}' - A'_{230lower}$ is to be used for the offset is predetermined in the process in accordance with a process to be done; all being similar to the preceding example. Further, also in this example, the offset may be selected and determined automatically as in the preceding example.

If a pattern region to be examined has distortion such as local warp, for example, the determined offset includes an error resulting from such distortion.

In order to reduce such an error to improve the precision of offset, the above-described measurement and calculation operations may be done to plural regions on a wafer so that plural correction amounts may be determined, such that an average of them may be actually used as an offset. Of course, an offset may be determined on the basis of an average of plural offsets for different wafers (having the same pattern structure formed through the same process). This assures a further increase of offset precision.

While in this embodiment the central measuring point 21, of the plural measuring points, is used for measurement of values Aj (j=1 to n) of the grid points on the pattern region, in place of using the center measuring point 21, any one of the peripheral measuring points 19, 20, 21, 22 and 23 may be used.

Further, the wafer may be moved so that the center measuring point 21 of the plural measuring points may be registered with each grid point on the pattern region and, by using the data of all of (or some of) these measuring points of a number 5×n (or 4×n), averages $A'_{upper}$ and $A'_{lower}$ may be calculated. On that occasion, the number of data increase five times (or four times) with a single moving operation for movement to each grid point in the pattern region. Thus, there is an advantage of enhanced offset measurement precision without decreasing the throughput.

Further, while in this embodiment only the measured values Aj (j=1 to n) of a number n at the grid points on the pattern region are used for calculation of the averages $A'_{upper}$ and $A'_{lower}$, as an alternative the measured values Aj (j=1 to n) of a number n of the grid points on the pattern region as well as the measured values $F_{19}$–$F_{23}$ of the measuring points 19–23 in the pattern region may be used for calculation of these averages.

Further, while in this embodiment for determination of offset the topography of the wafer surface is binarized into the ranges $S_{upper}$ and $S_{lower}$ sandwiched by the slice levels 94–96 of regular intervals and, on the basis of this, the number of slice levels may be increased such that, for example, narrower ranges $S_{upper}$, $S_{middle}$ and $S_{lower}$ may be defined for offset determination, and such that the offset in the surface position measurement may be set on the basis of the data included in these ranges.

Further, while in this embodiment the wafer stage is stopped relative to the surface position measuring system when the surface position at each grid point is measured, the measurement may be repeated at certain sampling intervals while continuously moving the wafer stage without stoppage, for the surface position measurement at each grid point. On that occasion, the light source 5 and the position detecting element 17 may be so controlled that the former emits light periodically and the latter uptakes the surface position data periodically.

The measurement grid points of this embodiment are not limited to the form of a square grid of regular intervals. It may be an aggregation of measuring points having different coordinates distributed along a two-dimensional plane.

If in this embodiment the measured values of the grid points in the pattern region include one largely deviated from the others and away from the wafer surface topography (i.e. an extraordinary value resulting from a foreign particle, for example), such a value may advantageously be avoided from being used in the offset calculation. Thus, the offset calculation may be done without such an extraordinary value.

Figure 22:
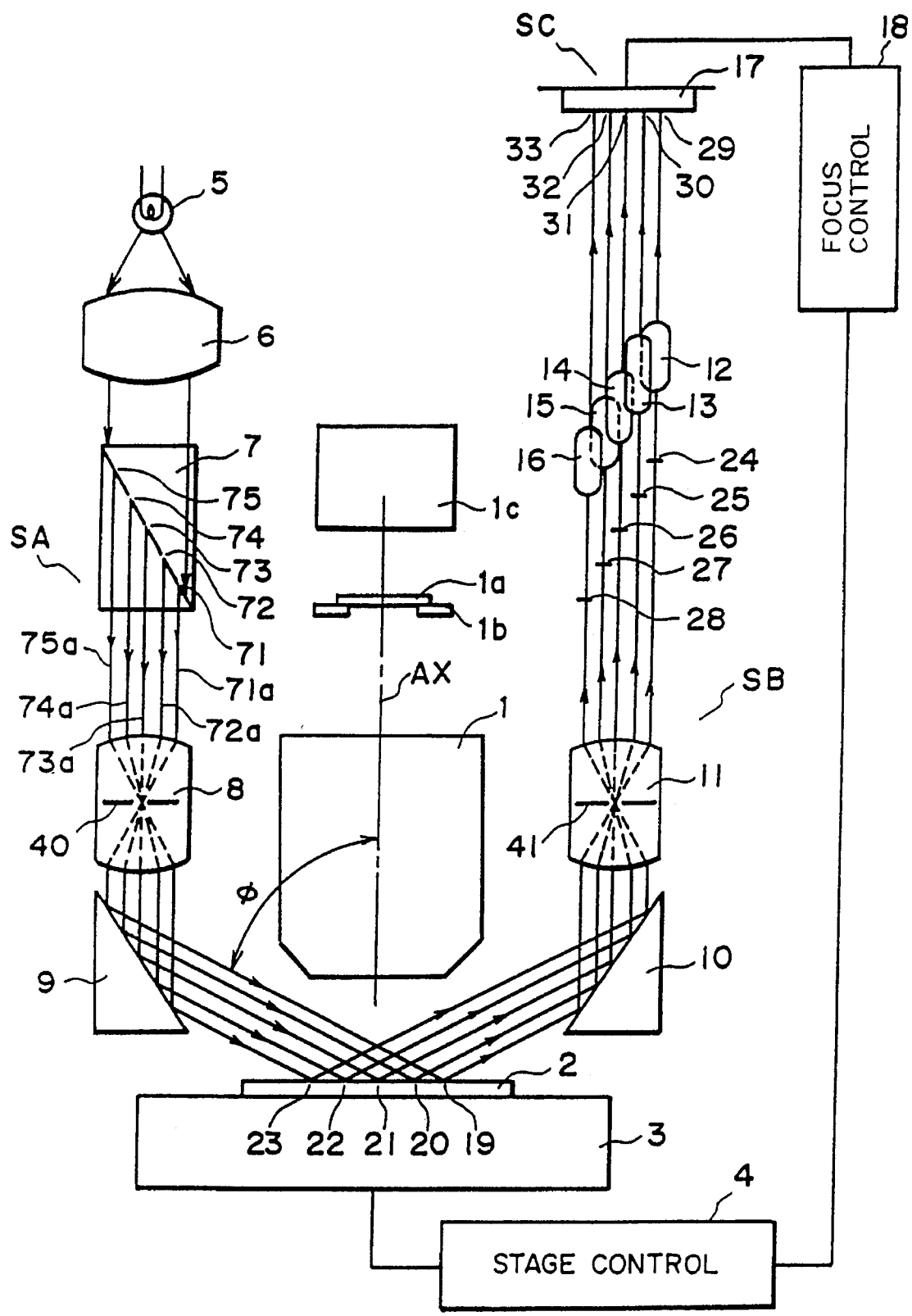
FIG. 22 is a schematic view of a main portion of a second embodiment of the present invention.
Figure 23:
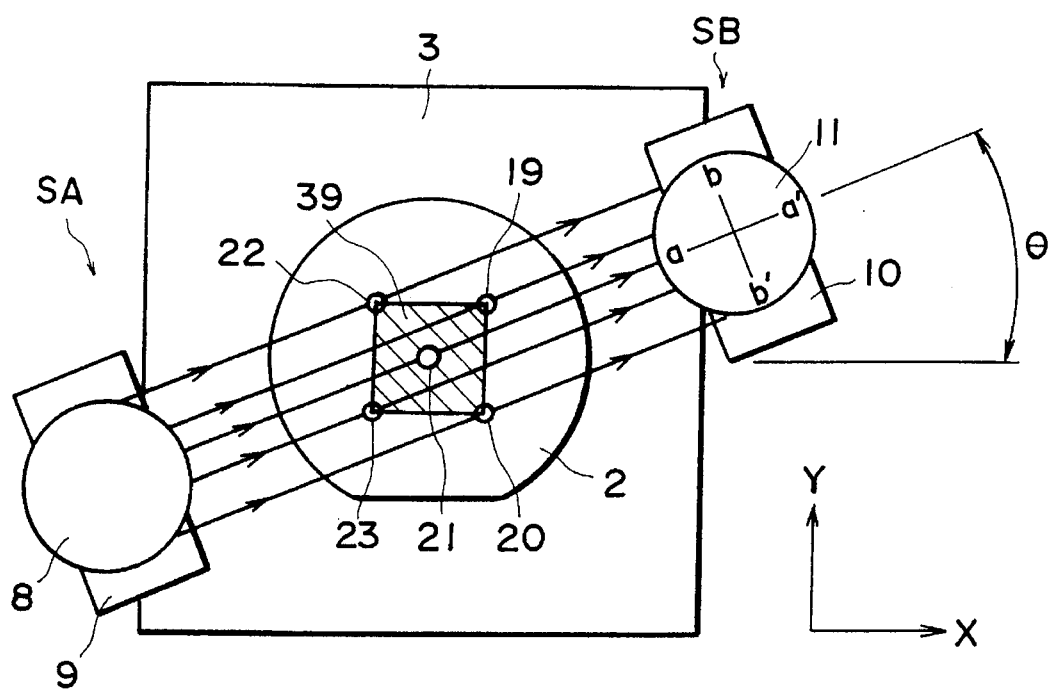
FIG. 23 is a schematic view for explaining a portion of FIG. 22.

FIG. 22 is a schematic view of a second embodiment of the present invention, and FIG. 23 is an enlarged view of a portion of FIG. 22. In FIGS. 22 and 23, the same reference numerals as those of FIGS. 1 and 2 are assigned to corresponding elements. Now the structure of this embodiment will explained below, while it may be somewhat duplicate the description of the embodiment of FIGS. 1 and 2.

Denoted in FIG. 22 at 1 is a reduction type projection optical system (projection lens system), and denoted at Ax is the optical axis of the projection optical system 1. Denoted at 1a is a reticle on which a circuit pattern is formed. It is placed on a reticle stage 1b. Denoted at 1c is an illumination system for illuminating the reticle 1a surface uniformly. The projection optical system 1 serves to project, in a reduced scale, the circuit pattern of the reticle la upon the surface of a wafer 2. The wafer 2 is held fixed on the surface of a wafer stage 3, through attraction. The wafer stage 3 is movable along the optical axis Ax (z direction) of the projection optical system 1, as well as in two directions (x and y directions) along the plane (x-y plane) orthogonal to the optical axis Ax. Additionally, it is equipped with the function of tilt adjustment with respect to the plane (x-y plane)

orthogonal to the optical axis Ax. Thus, with this structure, it is possible to adjust the surface position of a wafer 2 placed on the wafer stage 3 surface, as desired. Denoted at 4 is a stage controller which is operable to controllably drive the wafer stage 3 in response to a signal from a focus controller 18, to be described later.

Denoted at SA is a light projecting means. Denoted at SB is a projection means. Denoted at SC is a photoelectric converting means. These components constitute a portion of a surface position detecting device for detecting the surface position of a wafer 2. The projection means SB and the photoelectric converting means SC cooperate with each other to define a detecting means SBC.

In this embodiment, when the circuit pattern of the reticle 1a is going to be projected on the wafer 2 surface through the projection optical system 1, the surface position detecting device is used to controllably drive the wafer stage 3 so as to position the wafer 2 surface within the range of the depth of focus of the projection optical system 1. The wafer stage 3 is then moved stepwise along the x-y plane, by which pattern regions (shots) 39 of rectangular shape are defined successively on the wafer 2 surface.

Next, the components of the surface position detecting device of this embodiment will be explained. Initially, the light projecting means SA for projecting a plurality of lights upon the wafer 2 surface will be described.

Denoted at 5 is a light source which comprises a white light source or an illumination unit arranged to emit light of different wavelengths. Denoted at 6 is a collimator lens for receiving the light from the light source 1 and producing parallel light of substantially uniform sectional intensity distribution.

Denoted at 7 is a slit member of prism shape, having a pair of prisms cemented to each other so that their slant surfaces are opposed to each other. At the cemented surface, a plurality of openings (five pinholes) 71–75 are formed. Denoted at 8 is a lens system of dual telecentric type which serves to direct five independent lights 71a–75a, passed through the pinholes 71–75 of the slit member 7, toward five measuring points 19–23 on the wafer 2 surface via a mirror 9, substantially at the same angle of incidence. Here, the optical components are so set that the projected images comprise pinhole images of substantially the same size. Further, the lens system 8 includes an inside aperture stop 40 which serves to adjust or makes uniform the NAs of the lights 71a–75a. In this embodiment, these components 5–9 cooperate to provide the light projecting means SA.

In this embodiment, the incidence angle $\phi$ of each light from the light projecting means SA impinging upon the wafer 2 surface (the angle defined with respect to a normal to the wafer surface) is $\phi=70$ deg. or more. On the wafer 2 surface, there are a plurality of pattern regions (shots of exposure regions) 39 arrayed such as shown in FIG. 23. The five lights 71a–75a passed through the lens system 8 impinge on separate measuring points 19–23, respectively, of a pattern region 39.

The five lights 71a–75a when projected on the wafer 2 surface are so projected onto the wafer 2 surface along a direction rotated by an angle $\theta$ deg. (e.g. $\theta=22.5$ deg.) in the X-Y plane from the X direction (direction of shot array), so that they can be observed independently as depicted in FIG. 23 when seen in the perpendicular direction to the wafer 2 (optical axis Ax direction), whereby substantially the same advantageous effect as that of the first embodiment is assured.

The five pinholes 71–75 of the slit member 7 are defined on a plane conjugate with the wafer 2 surface so as to satisfy the Scheimpflug's condition with respect to the wafer 2 surface. Also, the size and shape of the pinholes 71–75 of the slit member 7 as well as the distance thereof from the lens system 8 are so set that pinhole images of substantially the same size are formed on the wafer 2 surface.

In this embodiment, a plurality of lights (pinholes) are projected on the wafer 2 surface by using the light projecting means SA which comprises the above-described components 5–9. It is to be noted that in this embodiment the number of the measuring points to be defined on the wafer 2 surface is not limited to five (5).

Next, description will be made of the projection means SB which serves to direct the lights reflected by the wafer 2 surface to the detection surface 17 of the photoelectric converting means SC (CCD position detecting device).

Denoted at 11 is a light receiving lens of dual telecentric type which cooperates with a mirror 10 to direct the five reflection lights reflected by the wafer 2 surface. The light receiving lens 11 serves to form pinhole images at the positions 24–28, respectively, corresponding to the measuring points 19–23, respectively.

Denoted at 41 is a stopper (stop) provided inside the light receiving lens 11, and it provides substantially the same advantageous effect as that of the first embodiment. The lights from the pinhole images at the positions 24–28 are then projected on five separate correction optical systems 12–16, respectively.

The light receiving lens 11 is of dual telecentric type, and the correction optical systems 12–16 have their optical axes placed parallel to each other. Thus, they serve to re-image the pinhole images, defined at the positions 24–28, upon the detection surface 17 of the photoelectric converting means SC such that light spots of the same size are formed thereon. The photoelectric converting means SC comprises a single area CCD, in this embodiment. As described, in this embodiment, the components 10, 11 and 12–16 cooperate with each other to provide the projection means SB.

The correction optical systems 12–16 each comprises a lens system and a parallel flat plate of predetermined thickness, and it is in a coaxial or eccentric relation with the optical axis of the light receiving lens 11. Here, the parallel flat plate is used to correct the optical length of each corresponding lens system. Also, each lens system is provided for magnification correction, such that substantially the same imaging magnification (projection magnification) is assured upon the detection surface 17 with respect to all the measuring points 19–23.

Namely, in an oblique projection imaging optical system as in the present embodiment wherein a plurality of lights are projected obliquely upon the surface of a wafer, as different measuring points 19–23 having different distances with respect to the light receiving lens 11 are imaged on the detection surface 17 of the photoelectric converting means SB, they are imaged at different imaging magnifications.

In this embodiment, in consideration thereof, the correction optical systems 12–16 are provided in relation to the measuring points, respectively, by which substantially the same projection magnification is assured upon the detection surface 17 to the measuring points 19–23.

Here, the positions of the pinhole images (light spots) impinging on the detection surface 17 are changeable with the surface positions (in the direction of level (height) and along the optical axis Ax) of the wafer 2 surface at the measuring points 19–23, respectively. The photoelectric converting means SC serves to detect such a change in the pinhole image position. Thus, in the present embodiment, the surface position information at each measuring point 19–23 on the wafer 2 surface can be detected, with the same precision.

Further, through the projection means SB, the measuring points 19–23 on the wafer 2 surface and the detection surface 17 of the photoelectric converting means SC are placed in a conjugate relation (inclination correction being made to the measuring points 19–23), such that even with any local tilt at the measuring point 19–23 the pinhole image position on the detection surface 17 does not change. Namely, in response to a change in the local level (height position) at each measuring point of the wafer 2 surface in the direction of the optical axis Ax, that is, in response to the level of each measuring point 19–23, the pinhole image position on the detection surface 17 is changeable.

The photoelectric converting means SC serves to detect the positional information about each pinhole image incident on the detection surface 17, and the pinhole image position information corresponding to the measuring points 19–23 obtained through the converting means SC is supplied to the focus controller 18.

In response to the level (surface position) information about the measuring points 19–23 applied from the converting means SC, the focus controller 18 determines the positional information about the wafer 2 surface, i.e., the position with respect to the optical axis AX direction (z direction) or the tilt thereof with respect to the X-Y plane.

Then, it applies a signal related to a drive of the wafer stage 3 to the stage controller 4 so as to bring the wafer 2 surface substantially into coincidence with the projection plane of the reticle 1a through the projection optical system 1. In response to the signal applied from the focus controller 18, the stage controller 4 controllably drives the wafer stage 3 to adjust the position and/or the attitude of the wafer 2.

Displacement of the wafer stage 3 in the x or y direction is measured in a known method using a laser interferometer, not shown, and a signal representing the amount of displacement of the wafer stage 3 is applied from the interferometer to the stage controller 4 through a signal line.

The stage controller 4 controls the position of the wafer stage 3 in the x and y directions and also it controls motion of the stage 3 in the z direction as well as the tilt thereof on the basis of a signal applied thereto from the focus controller 18 through a signal line. This is also the case with the first embodiment.

Now, the manner of detecting the surface position of a pattern region 39 of the wafer 2 in this embodiment will be explained.

As described hereinbefore, the major factor of detection error in the detection of the surface position of the wafer 2 with the optical surface position detecting system of FIG. 22 is the interference between the light reflected by the surface of a resist of the wafer 2 and the light reflected by the surface of the wafer 2 substrate. Since the effect of this interference differs with the pattern formed on the wafer substrate, for the respective measuring point 19–23, the measurement errors due to the interference differ from each other.

In a reduction projection exposure apparatus such as shown in FIG. 22, the pattern of the reticle 1a is transferred to exposure regions of the wafer 2 sequentially through the step-and-repeat method. Prior to the surface position detection and pattern transfer, the alignment operation is made to align an IC pattern previously formed on each exposure region of the wafer 2 with the pattern of the reticle.

The optical type surface position detecting system is fixed to the projection lens system 1, and the reticle 1a is held at a fixed position relative to the projection lens system 1. Therefore, by executing the surface position detection after aligning the reticle pattern and the exposure region of the wafer 2, it is assured that the measuring points 19–23 act to measure the height position substantially at the same location in each exposure region arrayed on the wafer 2. This means that the measuring points 19–23 serve to measure the height position at such a location in each exposure region, having the same substrate (pattern) structure.

Therefore, the effect upon the detection result of the interference between the light reflected by the resist surface of the wafer 2 and the light reflected by the substrate surface of the wafer 2 can be expected as being a quantity which is peculiar to each measuring point in the exposure region. Actually, it has been confirmed by the inventors through experiments that a substantially constant detection error occurs in each measurement.

U.S. Pat. No. 5,118,957 proposes a method in which this phenomenon is applied to the surface position detection: the detection error with respect to each measuring point is measured beforehand and the error in surface position data of each measuring point in the exposure region is corrected to thereby provide correct surface position information.

Figures 24, 25:
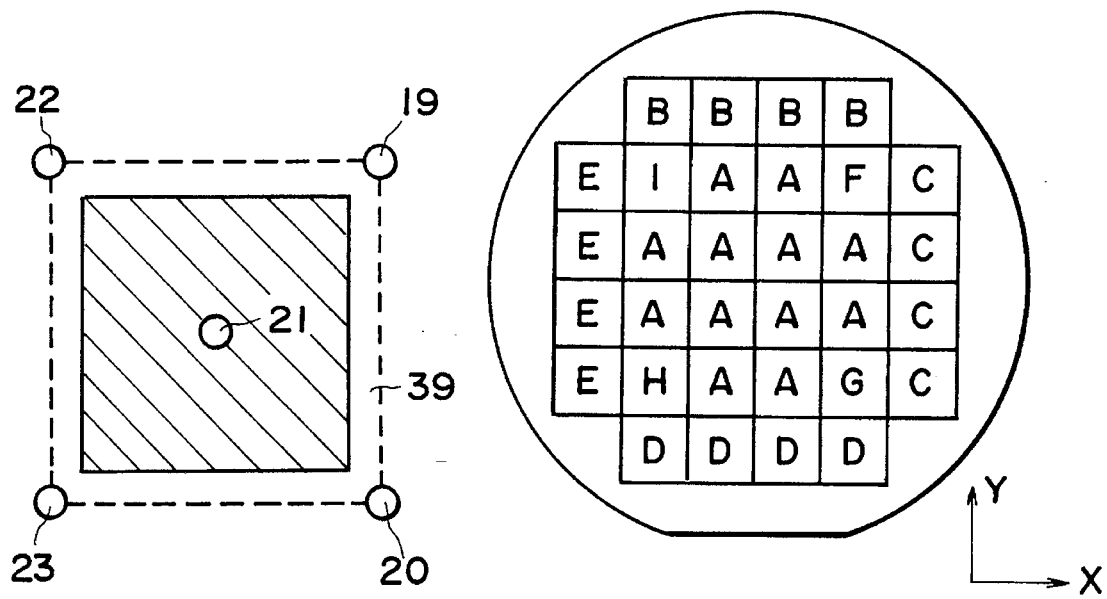
FIG. 24 is a schematic view for explaining the positional relationship between an exposure region and measuring points, in the second embodiment.
FIG. 25 is a schematic view of a layout of exposure regions defined regularly on a wafer and classified in a particular manner, in the second embodiment.

In the method proposed by the aforementioned U.S. patent, if an exposure region 39 and the measuring points 19–23 of the surface position detecting system are in such positional relation shown in FIG. 24 wherein the exposure region 39 of a rectangular shape is smaller than the rectangle defined by connecting the measuring points 19, 20, 22 and 23, there is a case where one or more of the measuring points in the peripheral portion of the wafer are at such a position in the wafer region whereat no pattern is present.

On that occasion, there is a possibility that if, in an exposure region in the peripheral portion of the wafer where one or more measuring points are at such a position whereat no pattern is present, the detection errors of the respective measuring points are corrected from the surface position data related to the respective measuring points, then correct surface position data is not produced.

For this reason, in an exposure region in the peripheral portion of the wafer, the wafer surface measurement has to be executed by using the measuring points excluding that or those points in the wafer region where no pattern is present. This necessarily results in a decrease in the number of measuring points in the case of wafer peripheral portion, and thus the precision of surface position correction degrades.

In accordance with the present embodiment, such degradation of precision of surface position correction in an exposure region in the peripheral portion of the wafer can be avoided in the manner described below.

FIG. 25 shows an example of a layout of exposure regions regularly formed on a wafer 2 along x and y axes.

Figure 26:
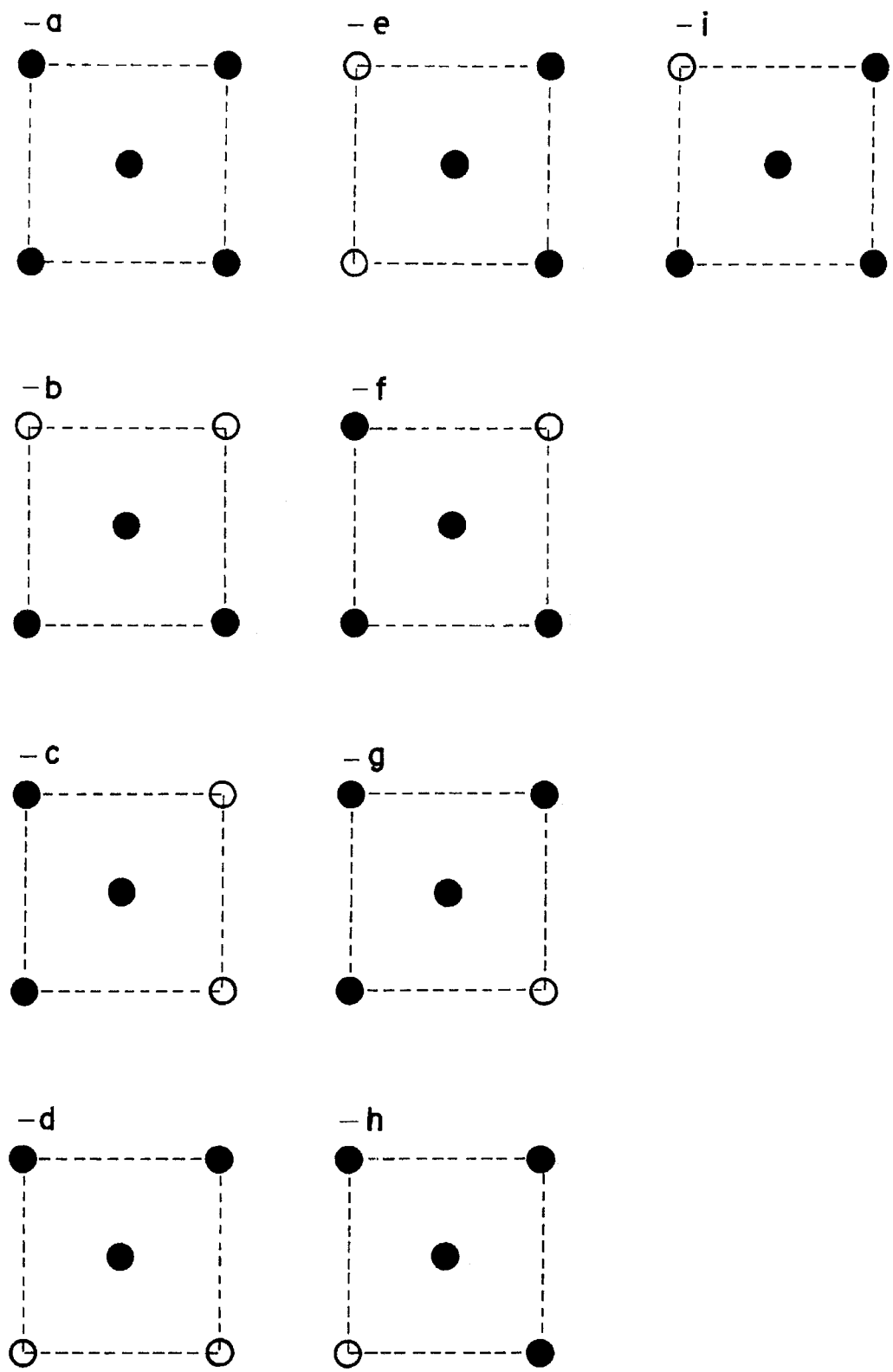
FIG. 26 is a schematic view for explaining the positional relationship of measuring points with exposure regions.

Here, it is assumed that the positional relation between an exposure region 39 and the measuring points 19–23 of the surface position detecting system is such that as shown in FIG. 24 wherein the exposure region 39 of a rectangular shape is smaller than the rectangle defined by connecting the measuring points 19, 20, 22 and 23. Then, depending on whether the measuring points 19–23 are on a pattern or not, exposure regions can be classified into nine zones A–I as shown in FIG. 25. FIG. 26 shows in portions (a) to (i) the positional relation between exposure regions 39 and the measuring points 19–23 in each of the zones A–I. In FIG. 26, each painted circle corresponds to a case where a measuring point is on a pattern, and each non-painted circle represents a case where a measuring point is not on a pattern.

Considering each zone in which each measuring point is on or not on a pattern, the following relation is obtained:

TABLE 1

|  | zones on a pattern | zones not on a pattern |
|---|---|---|
| point 19 | A,D,E,G,H,I | B,C,F |
| point 20 | A,B,E,F,H,I | C,D,G |
| point 21 | A–I (all) |  |
| point 22 | A,C,D,F,G,H | B,E,I |
| point 23 | A,B,C,F,G,I | D,E,H |

Now, detection error (offset) of each measuring point 19–23 where it is in the zone on a pattern or in the zone not on a pattern, is to be detected.

First, the manner of detecting the detection error in the zone in which the measuring points 19–23 are on a pattern, will be explained.

In FIG. 24, measuring points 19–23 are set to an exposure region 39, wherein the measuring point 21 is approximately at the center of the exposure region. The mounting position of the surface position detecting system is adjusted beforehand so that during the surface position measurement it intersects with the optical axis AX perpendicularly.

The remaining measuring points 19, 20, 22 and 23 are in a peripheral portion (outside) of the exposure region 39. The origins for measurement of height of the measuring points 19–23 are placed on the same plane through preparatory adjustment, and this plane is substantially coincident with the best imaging plane of the projection lens system 1.

Here, if the measuring point 21 is at the point (x, y) in the x-y coordinate system, the measuring points 19, 20, 22 and 23 are those points $(x+\delta x, y+\delta y)$, $(x+\delta x, y-\delta y)$, $(x-\delta x, Y+\delta y)$ and $(x-\delta x, y-\delta y)$ in the x-y coordinates, respectively. Here, the origin of the x-y coordinate system is at the intersection between the x-y plane and the optical axis AX.

Then, out of the zones A in which all the measuring points 19–23 are on a pattern, those exposure regions 39 to be used for measurement of offsets peculiar to the measurement points and resulting from the wafer structure are determined.

Initially, the wafer stage 3 is moved so as to place the measuring point 21 in a region of the wafer outside the exposure region, not having a pattern, and the wafer 2 is held at such a height position whereat the measured height position of the measuring point 21 (in the optical axis AX direction) is substantially equal to zero. The position in the optical axis AX direction is held constant during measurement of the predetermined exposure regions 39.

This operation is necessary for the setting of origin for height position measurement (in the optical axis AX direction) to the measuring point 21 in a region free from the effect of the pattern.

Then, the wafer stage 3 is moved stepwise so as to successively place each of the predetermined exposure regions 39 of the wafer just below the projection lens system 1, and there it is aligned with the reticle pattern. The wafer stage 3 movement is controlled by an output signal from the laser interferometer.

Subsequently, the positions of the measuring points 19–23 in the exposure region 39 of the wafer in the optical axis AX direction, i.e., their height positions $z^{pattern}_{19}$–$z^{pattern}_{23}$, are detected through the surface position detecting system. Signals corresponding to these height positions $z^{pattern}_{19}$–$z^{pattern}_{23}$, are supplied from the position detecting element 17 to the focus controller 18.

This measurement operation is executed successively to all of the predetermined exposure regions 39.

Here, the surface positions $z^{pattern}_{19}$–$z^{pattern}_{23}$ at the measuring points 19–23 of each exposure region of the wafer 2 can be represented by surface shape functions such as follows:

$$z^{pattern}_{19}=f_{19}(x+\delta x, y+\delta y)+c^{pattern}_{19}$$
$$z^{pattern}_{20}=f_{20}(x+\delta x, y-\delta y)+c^{pattern}_{20}$$
$$z^{pattern}_{21}=f_{21}(x, y)+c^{pattern}_{21}$$
$$z^{pattern}_{22}=f_{22}(x-\delta x, y+\delta y)+c^{pattern}_{22}$$
$$z^{pattern}_{23}=f_{23}(x-\delta x, y-\delta y)+c^{pattern}_{23}$$

The x-y coordinates of these functions may be taken such as shown in FIGS. 24 and 25. Since the surface position measurement is actually executed to each particular exposure region determined as the subject of detection, values (surface position data) of $z^{pattern}_{19}$–$z^{pattern}_{23}$ become discrete with respect to x and y. Denoted by $\delta x$ and $\delta y$ are distances between the measuring points as described with reference to FIG. 24.

In this manner from the values $z^{pattern}_{19}$–$z^{pattern}_{23}$ obtained with respect to the measuring points 19–23 of the plural exposure regions 39, for each set of $z^{pattern}_{19}$–$z^{pattern}_{23}$ (each set of measuring points) the surface shape of the wafer can be estimated. In the above equations, $f_{19}$ to $f_{23}$ each denotes the function of only x or y which does not include a constant term of surface shape function obtainable with reference to each measuring point 19–23 by polynomial approximation, for example; and $c^{pattern}_{19}$ to $c^{pattern}_{23}$ each denotes the constant term of this surface shape function.

Although the measured values of the measuring points 19–23 are affected by the interference between the light reflected by the resist surface of the wafer 2 and the light reflected by the substrate surface of the wafer 2, the measuring points 19–23 still serve to detect the position of the wafer surface having the same surface shape.

From the standpoint of that measurement is made to physically the same surface, i.e. the same wafer surface, the exposure regions the wafer 2 as estimated from the values of $z^{pattern}_{19}$–$z^{pattern}_{23}$ at the measuring points should have exactly the same surface shape. However, since the surface position detection at each measuring point is affected by the effect of interference by the substrate structure, peculiar to that measuring point, there exist a constant-number shift of a certain quantity.

In consideration of this, if the true function representing the surface shape of the wafer 2 is denoted by f(x, y), then $z^{pattern}_{19}$–$z^{pattern}_{23}$ can be rewritten as follows:

$$z^{pattern}_{19}=f(x+\delta x, y+\delta y)+c^{pattern}_{19}$$
$$z^{pattern}_{20}=f(x+\delta x, y-\delta y)+c^{pattern}_{20}$$
$$z^{pattern}_{21}=f(x, y)+c^{pattern}_{21}$$
$$z^{pattern}_{22}=f(x-\delta x, y+\delta y)+c^{pattern}_{22}$$
$$z^{pattern}_{23}=f(x-\delta x, y-\delta y)+c^{pattern}_{23}$$

Since the order of curved surface or the equation of expansion of the surface shape function f(x, y) is predetermined in the form of a predetermined polynomial, the measured values $z^{pattern}_{19}$–$z^{pattern}_{23}$ are used as the surface position data and, through the least square method, constant terms $z^{pattern}_{19}$–$z^{pattern}_{23}$ and the coefficient of the surface shape function f(x, y) of each measuring point are calculated.

In this method, with regard to the measuring point 21, for example, the operation is made to solve the following least square method:

$$\iint [\{f_{21}(x, y)+c^{pattern}_{21}\}-z^{pattern}_{21}(x, y)]^2 dx dy=0$$

and the constant term $c^{pattern}_{21}$ and the coefficient of the surface shape function $f_{21}(x, y)$ are determined.

Subsequently, while assuming here the surface shape function as $f(x, y)=f_{21}(x, y)$, with regard to the remaining measuring points 19, 20, 22 and 23, the operation is made to solve the following least square method:

$$\iint [\{f_{21}(x+\delta x, y+\delta y)+c^{pattern}_{19}\}-z^{pattern}_{19}(x+\delta x, y+\delta y)]^2 dxdy=0;$$

$$\iint [\{f_{21}(x+\delta x, y-\delta y)+c^{pattern}_{20}\}-z^{pattern}_{20}(x+\delta x, y-\delta y)]^2 dxdy=0$$

$$\iint [\{f_{21}(x-\delta x, y+\delta y)+c^{pattern}_{22}\}-z^{pattern}_{22}(x-\delta x, y+\delta y)]^2 dxdy=0; \text{ and}$$

$$\iint [\{f_{21}(x-\delta x, y-\delta y)+c^{pattern}_{23}\}-z^{pattern}_{23}(x-\delta x, y-\delta y)]^2 dxdy=0$$

It is to be noted that, with regard to these measuring points 19, 20, 22 and 23, only the constant terms $c^{pattern}_{19}$, $c^{pattern}_{23}$, $c^{pattern}_{23}$ and $c^{pattern}_{23}$ are determined through the least square method with the coefficient of the surface shape function $f_{21}(x, y)$ handled as being fixed(fixed value) relative to the measuring point 21.

Then, by using the obtained constant terms $c^{pattern}_{19}$–$c^{pattern}_{23}$, the offset correction amount to be reflected to the surface position measurement, to be described later, is determined.

Since the precision of calculation of the coefficient of the surface shape function $f(x, y)$ becomes higher with a larger number of measurement values (surface position data), the number of exposure regions to be examined may be determined in light of the correction precision required.

The method of determining the detection error on the basis of the constant term of the surface shape function $f(x, y)$ has been proposed in U.S. Pat. No. 5,118,957. Hereinafter, this method will be referred to as "surface shape function constant method".

Next, the manner of detecting a detection error in a zone where the measuring points 19, 20, 22 and 23 are not on a pattern, will be explained.

As described hereinbefore, in the surface position detecting system of this embodiment, the formed pinhole images of the measuring points 19–23 are substantially equal to each other and, by providing correction optical systems respective to the measuring points, substantially the same magnification, resolution and precision are assured for detection of the height positions of the measuring points. Further, by means of the aperture stop 40 provided within the lens system 8, NAs are substantially registered. Also, the lens system 8 is telecentric on its exit side, and the lights 71a–75a are incident on the measuring points 19–23 substantially at the same angle.

Namely, the surface position detecting system of this embodiment is structured to provide the same optical performance with respect to the measuring points 19–23.

As a consequence, the detection errors in a region in which the measuring points 19–23 are not on a pattern have the same value provided that the substrate structures under the measuring points are equivalent to each other. Thus, the same result is obtainable by measurement using any one of the measuring points.

Based on this, a detection error in a region which is not on a pattern can be determined.

Initially, exposure regions 39 for detection error measurement are selected beforehand out of the zones B, C, D and E in each of which the measuring point 19 is not upon a pattern. To these exposure regions 39 thus predetermined, the above-described "surface shape function constant term method" is executed. In that case, all the measuring points 19–23 are used.

Here, a measured value of the exposure region 39 of the wafer 2, measured at the measuring points 19, 20, 22 and 23 in the optical axis AX direction, is denoted by $z^{outside}$, and the surface shape function is denoted by $f(X, Y)$. Also, a measured value of the exposure region 39 of the wafer 2, measured at the measuring point 21 in the optical axis AX direction, is denoted by $z^{'pattern}_{21}$, and the surface shape function is denoted by $f(x, y)$.

Then, the surface positions $z^{outside}$ and $z^{'pattern}_{21}$ are expressed as follows:

$$z^{outside}=f(X, Y)+c^{outside}$$

$$z^{'pattern}_{21}=f(x, y)+c^{'pattern}_{21}$$

Here, $z^{outside}$ and $f(X, Y)$ take the following values. Namely, in the zone B, they take those of the measuring points 19 and 22, i.e.:

$z^{outside}(X, Y)=z^{outside}_{19}(x+\delta x, y+\delta y) f(X, Y)=f(x+\delta x, y+\delta y)$; and $z^{outside}(X, Y)=z^{outside}_{22}(x-\delta x, y+\delta y) f(X, Y)=f(x-\delta x, y+\delta y)$.

In the zone C, they take the values of the measuring points 19 and 20, i.e.:

$z^{outside}(X, Y)=z^{outside}_{19}(x+\delta x, y+\delta y) f(X, Y)=f(x+\delta x, y+\delta y)$; and $z^{outside}(X, Y)=z^{outside}_{20}(x+\delta x, y-\delta y) f(X, Y)=f(x+\delta x, y-\delta y)$.

In the zone D, they take those of the measuring points and 23, i.e.:

$z^{outside}(X, Y)=z^{outside}_{20}(x+\delta x, y-\delta y) f(X, Y)=f(x+\delta x, y-\delta y)$; and $z^{outside}(X, Y)=z^{outside}_{23}(x-\delta x, y-\delta y) f(X, Y)=f(x-\delta x, y-\delta y)$.

In the zone E, they take those of the measuring points 22 and 23, i.e.:

$z^{outside}(X, Y)=z^{outside}_{22}(x-\delta x, y+\delta y) f(X, Y)=f(x-\delta x, y+\delta y)$; and $z^{outside}(X, Y)=z^{outside}_{23}(x-\delta x, y-\delta y) f(X, Y)=f(x-\delta x, y-\delta y)$.

By using the measured values $z^{outside}$ and $z^{'pattern}_{21}$ as the surface position data, the constant term $c^{outside}_{19}$ and the coefficient of the surface shape function $f(X, Y)$ as well as the constant term $c^{pattern}_{21}$ and the coefficient of the surface shape function $f(x, y)$ are then calculated.

In this method, like that described above, the operation is made to the measuring point 21 so as to solve the following least square method:

$$\iint [\{f_{21}(x, y)+c^{'pattern}_{21}\}-z^{'pattern}_{21}(x,y)]^2 dxdy=0, \text{ and the constant term } c^{'pattern}_{21} \text{ and the coefficient of the surface shape function } f_{21}(x, y) \text{ are determined.}$$

Then, while assuming here the surface shape function as being $f(X, Y)=f_{21}(X, Y)$, the operation is made to solve the following least square method:

$$\iint [\{f_{21}(X, Y)+c^{outside}\}-z^{outside}(X,Y)]^2 dXdY=0$$

In this operation, only the constant term $c^{outside}$ is determined through the least square method while taking the coefficient of the shape function $f_{21}(x, y)$ as being fixed (fixed value) relative to the measuring point 21.

In this manner, a detection error in a peripheral zone in which the measuring points 19–23 are not upon a pattern is determined, and it is seen that in the layout of exposure regions 39 shown in FIG. 25 shots of a number up to sixteen (16) can be selected for the detection error measurement, which number is larger than the number twelve (12) of the shots that can be selected in the zone A lying on a pattern. Thus, even in a zone at a peripheral portion, it is possible to detect a detection error with a precision equal to or higher than the precision attainable in zone A.

Then, by using the obtained constant terms $c^{outside}$ and $c^{'pattern}_{21}$, the offset correction amount to be reflected to the surface position measurement, to be described later, is determined.

In the foregoing description, detection errors in a zone in which the measuring points are on a pattern and in a zone in which the measuring points 19, 20, 22 and 23 are not on a pattern, are determined. Now, the manner of calculating the offset to be reflected to the surface position measurement will be explained.

The obtained constant terms $c^{pattern}_{19}$ to $c^{pattern}_{23}$, $c^{outside}$ and $c'^{pattern}_{21}$ may be directly used as the offset.

Namely, if the offset in a case where the measuring points 19–23 are on a pattern is denoted by $PT_{19}$–$PT_{23}$, then:

$PT_{19}=c^{pattern}_{19}$ $PT_{20}=c^{pattern}_{20}$ $PT_{21}=c^{pattern}_{21}$ $PT_{22}=c^{pattern}_{22}$ $PT_{23}=c^{pattern}_{23}$ In the case where the measuring points 19, 20, 22 and 23 are not on a pattern, they have a common offset OS which is expressed as follow:

$OS=c^{outside}$ (here since $c^{pattern}_{21}=c'^{pattern}_{21}$, $c^{pattern}_{21}$ is used as the offset $PT_{21}$ of the measuring point 21).

Alternatively, the offset of the measuring point 21 may be determined beforehand through experiments of exposing a wafer to a pattern, or it may be automatically measured in accordance with a method as proposed in U.S. Pat. No. 5,124,562 also assigned to the assignee of the subject application. The determined value is denoted by CT which may be stored into a memory beforehand.

Thus, $PT_{21}=CT$.

Here, the offset in a case where the measuring points 19, 20, 22 and 23 are upon a pattern is expressed as follows:

$PT_{19}=c^{pattern}_{19}-c^{pattern}_{21}+CT$ $PT_{20}=c^{pattern}_{20}-c^{pattern}_{21}+CT$ $PT_{22}=c^{pattern}_{22}-c^{pattern}_{21}+CT$ $PT_{23}=c^{pattern}_{23}-c^{pattern}_{21}+CT$ In a case where the measuring points 19, 20, 22 and 23 are not on a pattern, the offset for each measuring point is:

$OS=c^{outside}-c'^{pattern}_{21}+CT$

As described, the offset for the measuring point 21 can be determined through experiments, for example, and, by determining the remaining offset $PT_{19}$–$PT_{23}$ as the difference of the constant term $c^{pattern}_{21}$ of the measuring point 21 and by determining the offset OS as the difference of the constant term $c'^{pattern}_{21}$ of the measuring point 21, the reliability of the offset $PT_{19}$–$PT_{23}$ and OS of each measuring point can be improved.

The thus determined offset $PT_{19}$–$PT_{23}$ and OS is stored into a memory.

With these operations, the offset to be reflected to each measuring point is completed. Next, the manner of reflecting the offset during the exposure operation will be explained.

After completion of offset setting, the wafer stage 3 is moved so as to place a first exposure region of the wafer 2 just below the projection lens system 1, and the first exposure region is brought into alignment with the pattern of the reticle. After this alignment operation, by using the surface position detecting system, the surface position measurement is made to five measuring points 19–23 of the first exposure region. On the basis of output signals from the photoelectric converting means SC, the focus controller 18 produces surface position data related to each measuring point.

The focus controller 18 reads the offset $OFS_{19}$–$OFS_{23}$ corresponding to the measuring points 19–23 out of the memory. Here, depending on the zone (of zones A–I) to which the first exposure region belongs, the offset $OFS_{19}$–$OFS_{23}$ to be read out is different, such as follows:

TABLE 2

|  | Point 19 | Point 20 | Point 21 | Point 22 | Point 23 |
| --- | --- | --- | --- | --- | --- |
| Zone A | $PT_{19}$ | $PT_{20}$ | $PT_{21}$ | $PT_{22}$ | $PT_{23}$ |
| Zone B | OS | $PT_{20}$ | $PT_{21}$ | OS | $PT_{23}$ |
| Zone C | OS | OS | $PT_{21}$ | $PT_{22}$ | $PT_{23}$ |
| Zone D | $PT_{19}$ | OS | $PT_{21}$ | $PT_{22}$ | OS |
| Zone E | $PT_{19}$ | $PT_{20}$ | $PT_{21}$ | OS | OS |
| Zone F | OS | $PT_{20}$ | $PT_{21}$ | $PT_{22}$ | $PT_{23}$ |
| Zone G | $PT_{19}$ | OS | $PT_{21}$ | $PT_{22}$ | $PT_{23}$ |
| Zone H | $PT_{19}$ | $PT_{20}$ | $PT_{21}$ | $PT_{22}$ | OS |
| Zone I | $PT_{19}$ | $PT_{20}$ | $PT_{21}$ | OS | $PT_{23}$ |

By correcting the surface position data $z_{19}$–$z_{23}$ of the first exposure region with the thus read offset $OFS_{19}$–$OFS_{23}$, data $Z_{19}$–$Z_{23}$ are calculated. Namely, $Z_{19}=z_{19}-OFS_{19}$ $Z_{20}=z_{20}-OFS_{20}$ $Z_{21}=z_{21}-OFS_{21}$ $Z_{22}=z_{22}-OFS_{22}$ $Z_{23}=z_{23}-OFS_{23}$ On the basis of the corrected surface position data $Z_{19}$–$Z_{23}$, the focus controller 18 determines the least square surface of the first exposure region.

Additionally, the focus controller 18 supplies to the stage controller 14 a signal corresponding to the result of least square surface calculation, by which the tilt and the position of the wafer 2, placed on the wafer stage 3, with respect to the optical axis AX direction are adjusted (corrected). By this, the first exposure region of the wafer 2 can be positioned at the best imaging plane of the projection lens system 1. After such a final adjustment of surface position, an exposure operation of the first exposure region is executed whereby the pattern of the reticle is transferred to it.

After completion of the exposure process to the first exposure region, the wafer stage 3 is moved so as to place a second exposure region of the wafer 2 just below the projection lens system 1, and similar surface position detecting operation, surface position adjusting operation and exposure operation as described are executed. Such sequential operations are carried out repeatedly until the exposure process to the last exposure region is completed. Then, the wafer 2 is off-loaded from the wafer stage 3.

Determination of detection error (offset correction) for each measuring point on the wafer surface as described above, has to be done in each process where a different pattern is to be formed.

However, as for frequency, it is sufficient to make such a determination once in each process. At an initial stage of each process, the detection error (offset correction) may be determined and stored into a memory and, by doing so, semiconductor chips can be manufactured substantially without a loss of throughput.

Further, since each offset correction amount to be produced with the detection has a particular value peculiar to each measuring point, the number of exposure regions (shots) to be used for determination of surface shape function (including a constant term) may appropriately determined in accordance with the focus precision required.

Namely, the number may be small in a process wherein the required focus precision is not so high, but a large number is necessary in a process wherein the required precision is high. Even on an occasion when the total number of the shots in the zone A and the peripheral zones is twenty-four (24) while the time period necessary for stepwise motion from one shot to another is 0.4 sec. and the measurement time is 0.2 sec., the time period necessary for determination of detection offset correction is only about 15 seconds or shorter. Thus, by executing the detection offset determination only to a first wafer in each lot and by using the thus determined value also for the remaining wafers, the decrease of throughput can be made so small as can be disregarded.

Alternatively, measurements to the zone A and the zones B–E may be done simultaneously and, after that detection errors $c^{pattern}_{19}$–$c^{pattern}_{23}$ and $c^{outside}$ may be calculated at once.

Figure 27:
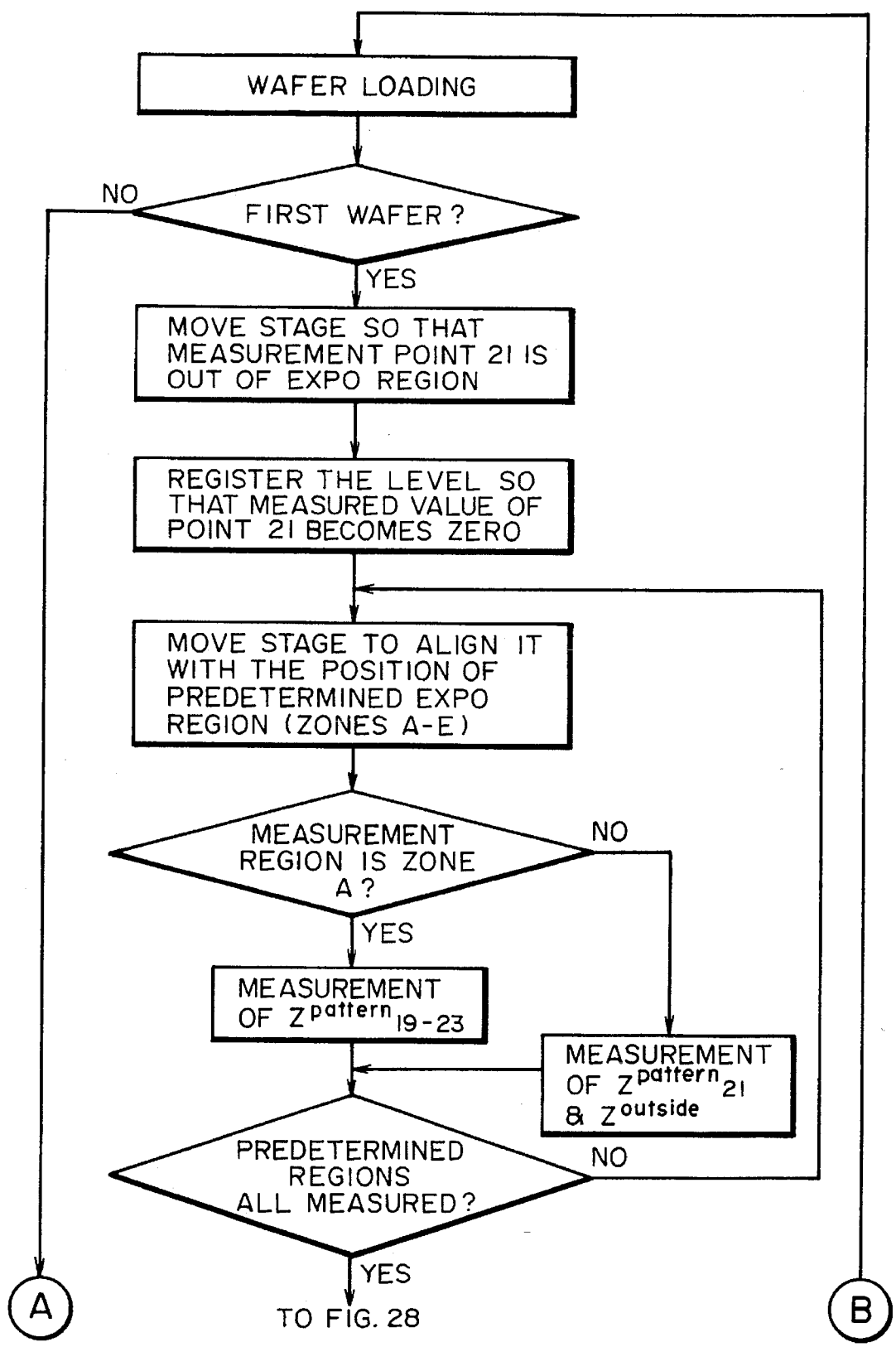
FIG. 27 is a flow chart of offset calculation in the second embodiment.
Figure 29:
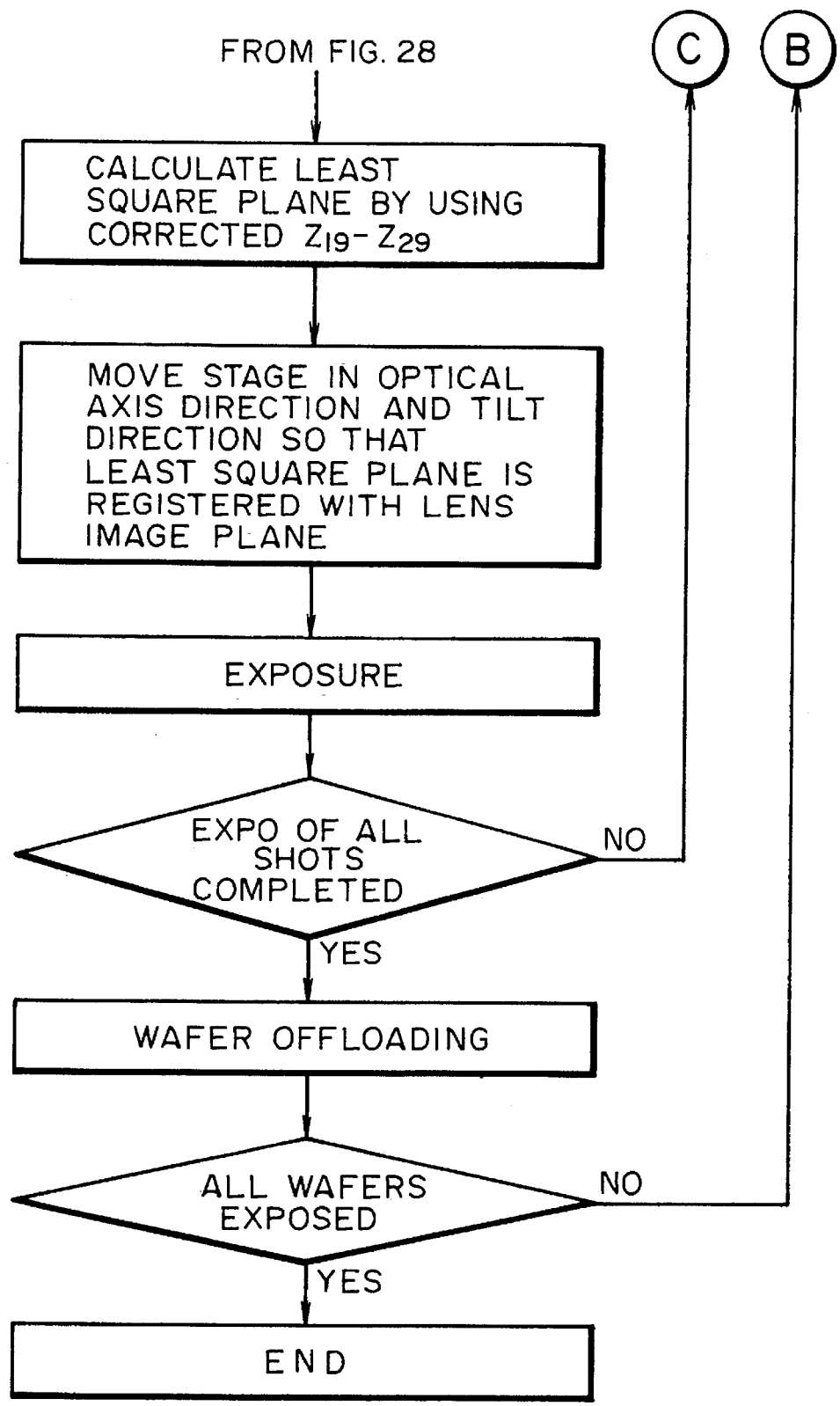
FIG. 29 is a flow chart of offset calculation in the second embodiment.

Flow charts of FIGS. 27, 28 and 29 depict the sequence of measurement on that occasion.

In the embodiment described above, with regard to the measuring point 21, the operation is made to solve the following least square method:

$$\iint\{(f_{21}(x, y)+c^{pattern}_{21}-z^{pattern}_{21}(x, y)\}^2 dxdy=0$$

and the constant term $c^{pattern}_{21}$ and the coefficient of the surface shape function $f_{21}(x, y)$ are determined. Also, for determination of the constant terms $c^{pattern}_{19, 20, 22, 23}$ of the remaining measuring points, the surface shape function is taken as $f(x, y)=f_{21}(x, y)$.

Here, the least square method may be solved with regard to another point in the zone A and, by using the surface shape function obtained with respect to that point, the constant terms for the remaining points may be determined.

Further, the least square method may be solved with regard to each of the measuring points 19–23 in the zone A, and surface shape functions $f_{19}(x, y)$–$f_{23}(x, y)$ may be determined, the function obtainable through averaging the coefficients of the orders of $f_{19}(x, y)$–$f_{23}(x, y)$ being denoted as $f_{average}(x, y)$.

Then, while taking the surface shape function $f(x, y)=f_{average}(x, y)$, the least square method may be solved again with respect to all the measuring points 19–23 to determine constant terms $c^{pattern}_{19}$–$c^{pattern}_{23}$. Since on that occasion the number of samples is large, the precision of calculation of the surface shape function $f(x, y)$ increases and thus the precision of calculation of the constant terms $c^{pattern}_{19}$–$c^{pattern}_{23}$ also increases.

Figure 30:
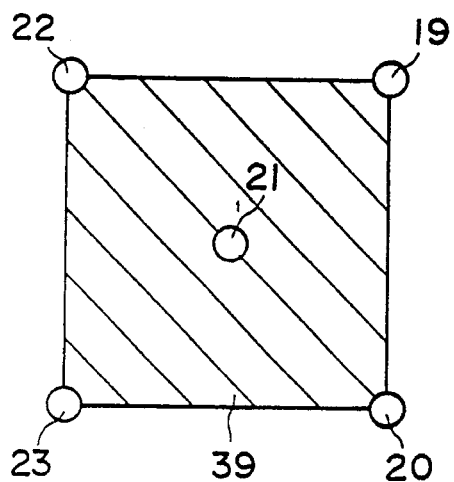
FIG. 30 is a schematic view for explaining the positional relationship between an exposure region and measuring points, in a third embodiment.

FIG. 30 is a schematic view for explaining pattern regions on a wafer 2 in a third embodiment of the present invention. In this embodiment, the positional relation between each exposure region 39 and the measuring points 19–23 of the surface position detecting system is such as shown in FIG. 7 wherein a rectangle defined by connecting the points 19, 20, 22 and 23 approximately corresponds to the rectangular shape of the exposure region 39.

Figure 31:
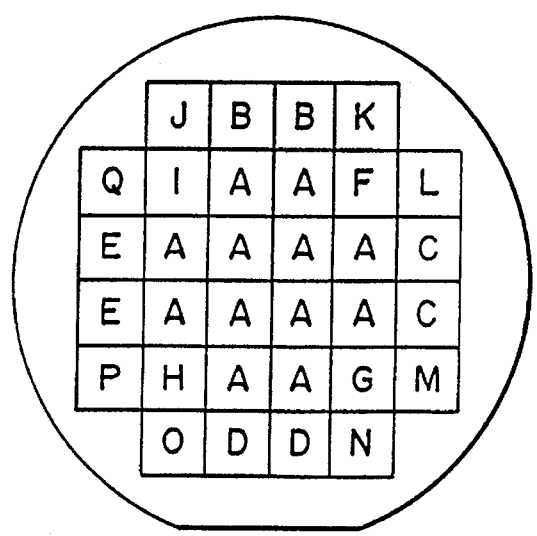
FIG. 31 is a schematic view of a layout of exposure regions defined regularly on a wafer and classified in a particular manner, in the third embodiment.

Depending on whether each measuring point 19–23 is on a pattern or a boundary thereof, exposure regions can be classified into seventeen (17) zones A–Q such as shown in FIG. 31.

Figure 32:
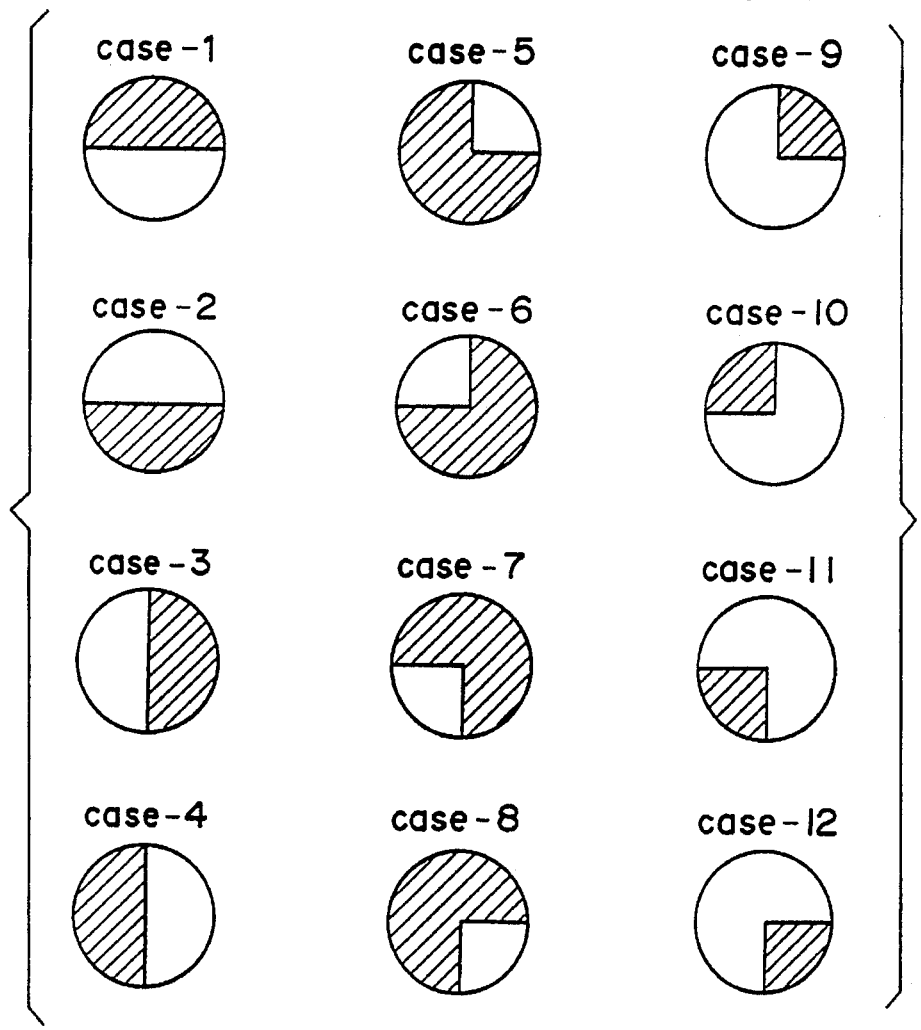
FIG. 32 is a schematic view for explaining the positional relationship of measuring points with the pattern boundary.
Figure 33:
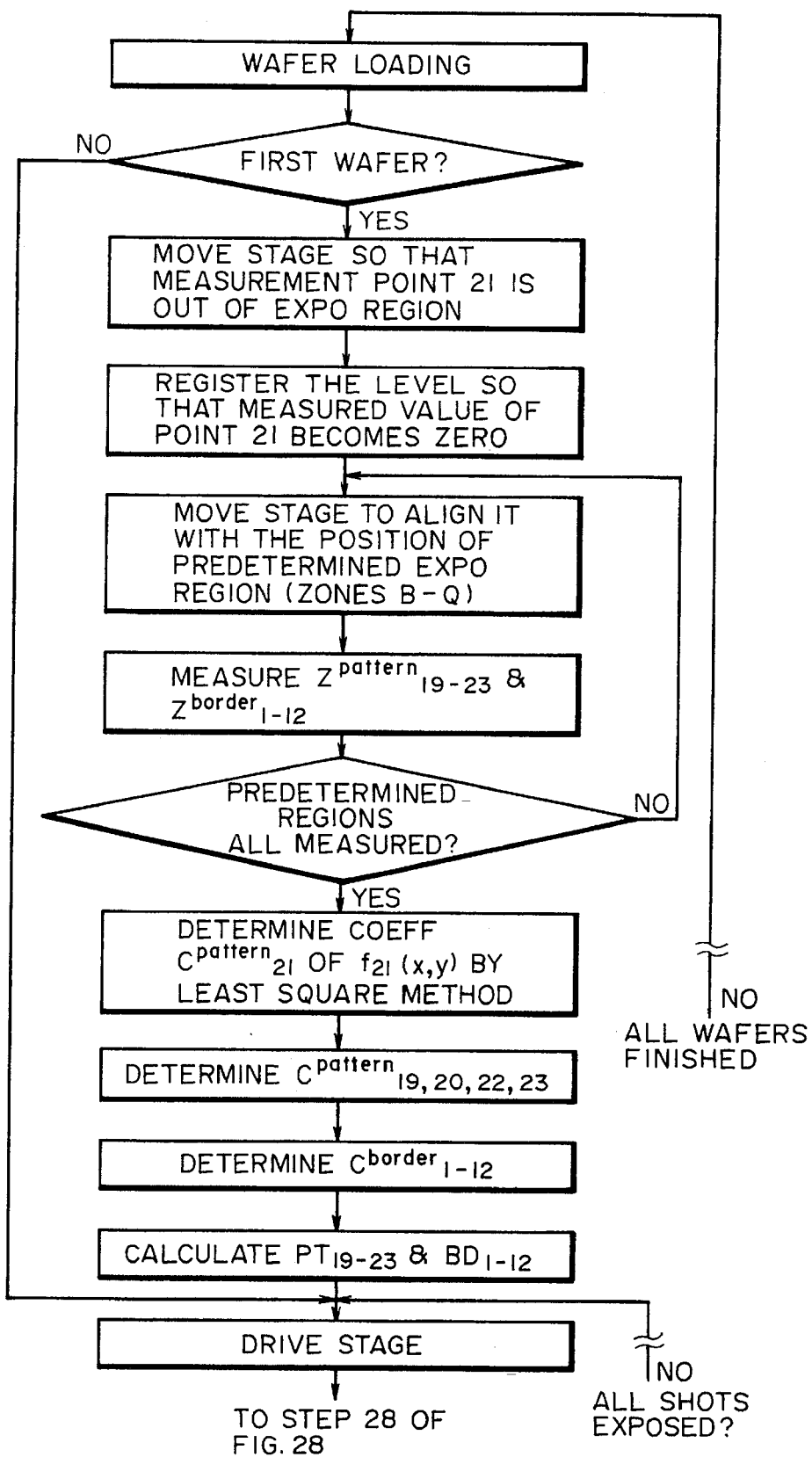
FIG. 33 is a flow chart of offset calculation in the third embodiment.

If each measuring point lies on the pattern boundary, there may be twelve (12) cases of positional relationship such as depicted in FIG. 32 (case 1 to case 12). Namely, there may be twelve types of pattern structures at the measuring point. In FIG. 32, each painted circle depicts a measuring point, and each hatched area corresponds to the portion of the measuring point lying on a pattern. The presence of twelve types of positional relations between the measuring point and the pattern boundary means that there may be twelve types of detection errors (offset correction amounts) in a zone in which a measuring point lies on a boundary.

Here, considering a zone lying on a pattern and a zone lying on a boundary, with respect to each measuring point 19–23 the following relations are obtained:

TABLE 3

|  | Zone On A Pattern | Zone On A Boundary |
|---|---|---|
| Point 19 | A,D,E,G,H,I,O,P | B,C,F,J,K,L,M,N,Q |
| Point 20 | A,B,E,F,H,I,J,Q | C,D,G,K,L,M,N,O,P |
| Point 21 | A–Q (all) |  |
| Point 22 | A,C,D,F,G,H,M,N | B,E,I,J,K,L,O,P,Q |
| Point 23 | A,B,C,F,G,I,K,L | D,E,H,J,M,N,O,P,Q |

Further, in a zone lying on a boundary, for the measuring points 19, 20, 22 and 23 the positional relation between the measuring point and the pattern is different, such as follows:

TABLE 4

|  | Point 19 | Point 20 | Point 22 | Point 23 |
|---|---|---|---|---|
| Case 1 | B,J |  | B,K |  |
| Case 2 |  | D,O |  | D,N |
| Case 3 | C,M | C,L |  |  |
| Case 4 |  |  | E,P | E,Q |
| Case 5 | F | K | L |  |
| Case 6 | Q |  | I | J |
| Case 7 |  | P | O | H |
| Case 8 | N | G |  | M |
| Case 9 |  |  |  | O,P |
| Case 10 |  | M,N |  |  |
| Case 11 | K,L |  |  |  |
| Case 12 |  |  | J,Q |  |

Thus, it is necessary to detect detection errors totalling seventeen (17), i.e., five detection errors in the zone lying on a pattern and twelve detection errors in a the zone lying on a boundary.

Now, the manner of simultaneously determining detection errors in a zone in which measuring points are on a pattern and detection errors in a zone in which measuring points are on a pattern boundary, will be explained.

Initially, one or more exposure regions 39 are selected beforehand out of the zones B–Q, for detection error measurement (in this case, it takes not less than sixteen (16) shots, and zone A may be included).

Then, the wafer stage 3 is moved so as to place the measuring point 21 in a region of the wafer outside the exposure region, not having a pattern, and the wafer 2 is held at such a height position whereat the measured height position of the measuring point 21 (in the optical axis AX direction) is substantially equal to zero. The position in the optical axis AX direction is held constant during measurement of the exposure regions 39 in the remaining zones B–Q.

This operation is necessary for the setting of origin for height position measurement (in the optical axis AX direction) to the measuring point 21 in a region free from the effect of the pattern.

Then, the wafer stage 3 is moved stepwise so as to successively place each of the predetermined exposure regions 39 in the zone B just below the projection lens system 1, and there it is aligned with the reticle pattern. The wafer stage 3 movement is controlled by an output signal from the laser interferometer.

Subsequently, the positions of the measuring points 19–23 in the exposure region 39 in the zone B in the optical axis AX direction, i.e., their height positions $z_{19}$–$z_{23}$, are detected through the surface position detecting system. Signals corresponding to these height positions are supplied from the photoelectric converting means SC to the focus controller 18. This measurement operation is executed successively to all the predetermined exposure regions 39 in the zones B–Q.

Subsequently, calculation is made by using the measuring point 21, lying on a pattern, in each of the exposure regions 39 in the zones B–Q.

Namely, in a similar way as described, the surface position $z_{21}$ of the measuring point 21 in each exposure region 39 of the zones B–Q is expressed by a surface shape function such as follows:

$$z^{pattern}{}_{21} = f_{21}(x\ y) + c^{pattern}{}_{21}$$

In this equation, $f_{21}(x, y)$ denotes the function of only x or y which does not include a constant term of surface shape function, obtainable with reference to each measuring point 21 by polynomial approximation for example; and $c^{pattern}{}_{21}$ denotes the constant term of this surface shape function.

Here, since the equation of expansion or the order of curved surface of the surface shape function $f_{21}(x, y)$ is predetermined in the form of a polynomial, the measured values $z_{21}$ of the zones B–Q are used as the surface position data and, by using the least square method the constant term $c^{pattern}{}_{21}$ and the coefficient of the surface shape function $f_{21}(x, y)$ are calculated.

This may be done so as to solve the following equation:

$$\iint [\{f_{21}(x, y) + c^{pattern}{}_{21}\} - z_{21}(x, y)]^2 dxdy = 0$$

The determined constant term $c^{pattern}{}_{21}$ is to be used in determination of offset correction, to be reflected to the surface position measurement to be described later, and the surface shape function $f_{21}(x, y)$ thus determined is to be used for determination of offset in relation to the detection of the measuring points 19, 20, 22 and 23.

Now, the manner of determining the detection error in a zone in which the measuring points 19, 20, 22 and 23 lie on a pattern, will be explained.

As regards the measuring point 19, the measured value of the surface position in each of the zones D, E, G, H, I, O and P in which the point 19 is on a pattern, is denoted by $z^{pattern}{}_{19}$. Also, the surface shape function at the measuring point 19 in these zones is denoted by $f(X, Y) + c^{pattern}{}_{19}$, wherein $c^{pattern}{}_{19}$ is the constant term of the surface shape function.

Here, in the zones described above, $z^{pattern}{}_{19}$ and the surface shape function $f(X, Y)$, not including the constant term, take the following values:

$$z^{pattern}{}_{19}(X, Y) = z^{pattern}{}_{19}(x+\delta x, y+\delta y)$$

$$f(X, Y) = f_{21}(x+\delta x, y+\delta y)$$

where $f_{21}(x+\delta x, y+\delta y)$ is obtainable by substituting coordinates $(x+\delta x, y+\delta y)$ corresponding to the measuring point 19 into the surface shape function $f_{21}(x, y)$ which is obtained by executing the least square method to the measuring point 21 as described.

Then, like that described hereinbefore, the following expression is derived:

$$z^{pattern}{}_{19}(x+\delta x, y+\delta y) = f_{21}(x+\delta x, y+\delta y) + c^{pattern}{}_{19}$$

The coefficient of the surface shape function $f_{21}(x, y)$ is fixed with respect to the value obtained by executing the least square method to the measuring point 21 as described, and, while using the measured values $z^{pattern}{}_{19}$ of the zones D, E, G, H, I, O and P as the surface position data, only the constant term $c^{pattern}{}_{19}$ is calculated again through the least square method.

This may be done, while taking the coefficient of $f_{21}(x, y)$ as being fixed (not to be processed by the least square method), so as to solve the following equation with respect to the constant term $c^{pattern}{}_{19}$:

$$\iint [\{f_{21}(x+\delta x, y+\delta y) + c^{pattern}{}_{19}\} - z^{pattern}{}_{19}(x+\delta x, y+\delta y)]^2 dxdy = 0$$

Similarly, as regards the measuring point 20, the measured values $z^{pattern}{}_{20}$ in the zones B, E, F, H, I, J and Q in each of which the point 20 is on a pattern, are used as the surface position data while taking the coefficient of $f_{21}(x, y)$ as being fixed (not to be processed by the least square method), to solve the following relation with respect to the constant term $c^{pattern}{}_{20}$:

$$\iint [\{f_{21}(x+\delta x, y-\delta y) + c^{pattern}{}_{20}\} - z^{pattern}{}_{20}(x+\delta x, y-\delta y)]^2 dxdy = 0$$

Similarly, as regards the measuring point 22, the measured values $z^{pattern}{}_{22}$ in the zones C, D, F, G, H, M and N in each of which the point 22 is on a pattern, are used as the surface position data while taking the coefficient of $f_{21}(x, y)$ as being fixed (not to be processed by the least square method), to solve the following relation with respect to the constant term $c^{pattern}{}_{22}$:

$$\iint [\{f_{21}(x-\delta x, y+\delta y) + c^{pattern}{}_{22}\} - z^{pattern}{}_{22}(x-\delta x, y+\delta y)]^2 dxdy = 0$$

Similarly, as regards the measuring point 23, the measured values $z^{pattern}{}_{23}$ in the zones B, C, F, G, I, K and L in each of which the point 23 is on a pattern, are used as the surface position data while taking the coefficient of $f_{21}(x, y)$ as being fixed (not to be processed by the least square method), to solve the following relation with respect to the constant term $c^{pattern}{}_{23}$:

$$\iint [\{f_{21}(x-\delta x, y-\delta y) + c^{pattern}{}_{23}\} - z^{pattern}{}_{23}(x-\delta x, y-\delta y)]^2 dxdy = 0$$

By using the constant terms $c^{pattern}{}_{19}$, $c^{pattern}{}_{20}$, $c^{pattern}{}_{21}$ and $c^{pattern}{}_{23}$, the offset correction to be reflected to the surface position measurement is determined.

Next, the manner of determining the detection offset in a zone in which the measuring points 19, 20, 22 and 23 lie on a pattern boundary, will be explained.

Here, description will be made of a case in which the measuring points and a pattern are in such positional relation as depicted in Case 1 of FIG. 32. Those of the measuring points which are in the disposition depicted in Case 1 of FIG. 32 are the point 19 in zones B and J and the point 22 in zones B and K. Measured values of the surface position at the measuring points 19 and 22 in these zones are denoted here by $z^{border}{}_1$, and the surface shape function is denoted by $f(X, Y) + c^{border}{}_1$, wherein $c^{border}{}_1$ is the constant term of the surface shape function.

The surface position $z^{border}{}_1$ can be expressed as:

$$z^{border}{}_1 = f(X, Y) + c^{border}{}_1$$

wherein $z^{border}{}_1$ and the surface shape function $f(X, Y)$, not including the constant term, take the following values in the zone B:

$$z^{border}{}_1(X, Y) = z^{pattern}{}_{19}(x+\delta x, y+\delta y)\ f(X, Y) = f_{21}(x+\delta x, y+\delta y); \text{ and}$$

$$z^{border}{}_1(X, Y) = z^{pattern}{}_{22}(x-\delta x, y+\delta y)\ f(X, Y) = f_{21}(x-\delta x, y+\delta y)$$

where $f_{21}(x+\delta x, y+\delta y)$ is obtainable, similar to the case described before, by substituting coordinates $(x+\delta x, y+\delta y)$ and $(x-\delta x, y+\delta y)$ corresponding to the measuring points 19 and 22 into the surface shape function $f_{21}(x, y)$.

Similarly, in zone J:

$$z^{border}{}_1(X, Y) = z^{pattern}{}_{19}(x+\delta x, y+\delta y)\ f(X, Y) = f_{21}(x+\delta x, y+\delta y)$$

In zone K:

$$z^{border}{}_1(X, Y) = z^{pattern}{}_{22}(x-\delta x, y+\delta y)\ f(X, Y) = f_{21}(x-\delta x, y+\delta y)$$

Then, the measured values $z^{border}{}_1$ in the zones B, J and K are used as the surface position data while taking the coefficient of $f_{21}$ as being fixed (not to be processed by the least square method), and the least square method is executed to the constant term $c^{border}{}_1$, that is, to solve the relation:

$$\iint[\{f(X, Y)+c^{border}\}-z^{border}{}_1(X, Y)]^2 dXdY=0$$

Those of the measuring points which are in the disposition depicted in Case 2 of FIG. 32 are the point 20 in zones D and O and the point 23 in zones D and N. Measured values of the surface position at the measuring points 20 and 23 in these zones are denoted here by $z^{border}{}_2$, and the surface shape function is denoted by $f(X, Y)+c^{border}{}_2$.

Then the measured values $z^{border2}$ in the zones D, N and O are used as the surface position data while taking the coefficient of $f_{21}$ as being fixed (not to be processed by the least square method), and the least square method is executed to the constant term $c^{border}{}_2$, that is, to solve the relation:

$$\iint[\{f(X, Y)+c^{border}{}_2\}-z^{border}{}_2(X, Y)]^2 dXdY=0$$

Those of the measuring points which are in the disposition depicted in Case 3 of FIG. 32 are the point 19 in zones C and M and the point 20 in zones C and L. Measured values of the surface position at the measuring points 19 and 20 in these zones are denoted here by $z^{border}{}_3$, and the surface shape function is denoted by $f(X, Y)+c^{border}{}_3$.

Then the measured values $z^{border}{}_3$ in the zones C, M and L are used as the surface position data while taking the coefficient of $f_{21}$ as being fixed (not to be processed by the least square method), and the least square method is executed to the constant term $c^{border}{}_3$, that is, to solve the relation:

$$\iint[\{f(X, Y)+c^{border}{}_3\}-z^{border}{}_3(X, Y)]^2 dXdY=0$$

Those of the measuring points which are in the disposition depicted in Case 4 of FIG. 32 are the point 22 in zones E and P and the point 23 in zones E and Q. Measured values of the surface position at the measuring points 22 and 23 in these zones are denoted here by $z^{border}{}_4$, and the surface shape function is denoted by $f(X, Y)+c^{border}{}_4$.

Then the measured values $z^{border}{}_4$ in the zones E, P and Q are used as the surface position data while taking the coefficient of $f_{21}$ as being fixed (not to be processed by the least square method), and the least square method is executed to the constant term $c^{border}{}_4$, that is, to solve the relation:

$$\iint[\{(f(X, Y)+c^{border}{}_4\}-z^{border}{}_4(X, Y)]^2 dXdY=0$$

It is to be noted here that, in Case 2 to Case 4 the measured values $z^{border}{}_1 - z^{border}{}_4$ and the surface shape functions $f(X, Y)$ take different values, although they are defined in a similar way as in Case 1. Detailed explanation is omitted here, in order to avoid duplicate description.

Now, a case wherein the measuring points and a pattern are in such a positional relation as depicted in Case 5 of FIG. 32 will be explained. Those of the measuring points which are in the disposition depicted in Case 5 of FIG. 32 are the point 19 in zone F, the point 20 in zone K and the point 22 in zone L. Measured values of the surface position at the measuring points 19, 20 and 22 in these zones are denoted here by $z^{border}{}_5$, and the surface shape function is denoted by $f(X, Y)+c^{border}{}_5$, where $c^{border}{}_5$ is the constant term of the surface shape function.

The surface position $z^{border}{}_5$ can be expressed as:

$$z^{border}{}_5=f(X, Y)+c^{border}{}_5$$

wherein $z^{border}{}_5$ and the surface shape function $f(X, Y)$, not including the constant term, take the following values in the zone F:

$z^{border}{}_5(X, Y)=z^{pattern}{}_{19}(x+\delta x, y+\delta y)$  $f(X, Y)=f_{21}(x+\delta x, y+\delta y)$ where $f_{21}(x+\delta x, y+\delta y)$ is obtainable, similar to the case described before, by substituting coordinates $(x+\delta x, y+\delta y)$ corresponding to the measuring point 19 into the surface shape function $f_{21}(x, y)$.

Similarly, in zone K:

$z^{border}{}_5(X, Y)=z^{pattern}{}_{20}(x+\delta x, y-\delta y)$  $f(X, Y)=f_{21}(x+\delta x, y-\delta y)$ In zone L:

$z^{border}{}_5(X,Y)=z^{pattern}{}_{22}(x-\delta x, y+\delta y)$  $f(X, Y)=f_{21}(x-\delta x, y+\delta y)$ Then, the measured values $z^{border}{}_5$ in the zones F, K and L are used as the surface position data while taking the coefficient of $f_{21}$ as being fixed (not to be processed by the least square method), and the least square method is executed to the constant term $c^{border}{}_5$, that is, to solve the relation:

$$\iint[\{f(X, Y)+c^{border}{}_5\}-z^{border}{}_5(X, Y)]^2 dXdY=0$$

Those of the measuring points which are in the disposition depicted in Case 6 of FIG. 32 are the point 19 in zone Q, the point 22 in zone I and the point 23 in zone J. Measured values of the surface position at the measuring points 19, 22 and 23 in these zones are denoted here by $z^{border}{}_6$, and the surface shape function is denoted by $f(X, Y)+c^{border}{}_6$.

Then the measured values $z^{border}{}_6$ in the zones Q, I and J are used as the surface position data while taking the coefficient of $f_{21}$ as being fixed, and the least square method is executed to the constant term $c^{border}{}_6$, that is, to solve the relation:

$$\iint[\{f(X, Y)+c^{border}{}_6\}-z^{border}{}_6(X, Y)]^2 dXdY=0$$

Those of the measuring points which are in the disposition depicted in Case 7 of FIG. 32 are the point 20 in zone P, the point 22 in zone O and the point 23 in zone H. Measured values of the surface position at the measuring points 20, 22 and 23 in these zones are denoted here by $z^{border}{}_7$, and the surface shape function is denoted by $f(X, Y)+c^{border}{}_7$.

Then the measured values $z^{border}{}_7$ in the zones P, O and H are used as the surface position data while taking the coefficient of $f_{21}$ as being fixed, and the least square method is executed to the constant term $c^{border}{}_7$, that is, to solve the relation:

$$\iint[\{f(X, Y)+c^{border}{}_7\}-z^{border}{}_7(X, Y)]^2 dXdY=0$$

Those of the measuring points which are in the disposition depicted in Case 8 of FIG. 32 are the point 19 in zone N, the point 20 in zone G and the point 23 in zone M. Measured values of the surface position at the measuring points 19, 20 and 23 in these zones are denoted here by $z^{border}{}_8$, and the surface shape function is denoted by $f(X, Y)+c^{border}{}_8$.

Then the measured values $z^{border}{}_8$ in the zones N, G and M are used as the surface position data while taking the coefficient of $f_{21}$ as being fixed, and the least square method is executed to the constant term $c^{border}{}_8$, that is, to solve the relation:

$$\iint[\{f(X, Y)+c^{border}{}_8\}-z^{border}{}_8(X, Y)]^2 dXdY=0$$

It is to be noted here that, in Case 6 to Case 8 the measured values $z^{border}{}_6 - z^{border}{}_8$ and the surface shape functions $f(X, Y)$ take different values, although they are defined in a similar way as in Case 5. Detailed explanation is omitted here, in order to avoid duplicate description.

Now, a case wherein the measuring points and a pattern are in such a positional relation as depicted in Case 9 of FIG. 32 will be explained. That of the measuring points which is in the disposition depicted in Case 9 of FIG. 32 is the point 23 in zones O and P. Measured values of the surface position at the measuring point 23 in these zones are denoted here by $z^{border}{}_9$, and the surface shape function is denoted by $f(X, Y)+c^{border}{}_9$, where $c^{border}{}_9$ is the constant term of the surface shape function.

The surface position $z^{border}{}_9$ can be expressed as:

$$z^{border}{}_9=f(X, Y)+c^{border}{}_9$$

wherein $z^{border}{}_9$ and the surface shape function $f(X, Y)$, not including the constant term, take the following values in the zones O and P:

$z^{border}_9(X, Y) = z^{pattern}_{23}(x-\delta x, y-\delta y) f(X, Y) = f_{21}(x-\delta x, y-\delta y)$ where $f_{21}(x-\delta x, y-\delta y)$ is obtainable, similar to the case described before, by substituting coordinates $(x-\delta x, y-\delta y)$ corresponding to the measuring point 23 into the surface shape function $f_{21}(x, y)$.

Then the measured values $z^{border}_9$ in the zones O and P are used as the surface position data while taking the coefficient of $f_{21}$ as being fixed (not to be processed by the least square method), and the least square method is executed to the constant term $c^{border}_9$, that is, to solve the relation:

$\iint [\{f(X, Y) + c^{border}_9\} - z^{border}_9(X, Y)]^2 dXdY = 0$

That of the measuring points which is in the disposition depicted in Case 10 of FIG. 32 is the point 20 in zones M and N. Measured values of the surface position at the measuring point 20 in these zones are denoted here by $z^{border}_{10}$, and the surface shape function is denoted by $f(X, Y) + c^{border}_{10}$.

Then the measured values $z^{border}_{10}$ in the zones M and N are used as the surface position data while taking the coefficient of $f_{21}$ as being fixed, and the least square method is executed to the constant term $c^{border}_{10}$, that is, to solve the relation:

$\iint [\{f(X, Y) + c^{border}_{10}\} - z^{border}_{10}(X, Y)]^2 dXdY = 0$

That of the measuring points which is in the disposition depicted in Case 11 of FIG. 32 is the point 19 in zones K and L. Measured values of the surface position at the measuring point 19 in these zones are denoted here by $z^{border}_{11}$, and the surface shape function is denoted by $f(X, Y) + c^{border}_{11}$.

Then the measured values $z^{border}_{11}$ in the zones K and L are used as the surface position data while taking the coefficient of $f_{21}$ as being fixed, and the least square method is executed to the constant term $c^{border}_{11}$, that is, to solve the relation:

$\iint [\{f(X, Y) + c^{border}_{11}\} - z^{border}_{11}(X, Y)]^2 dXdY = 0$

That of the measuring points which is in the disposition depicted in Case 12 of FIG. 32 is the point 22 in zones J and O. Measured values of the surface position at the measuring point 22 in these zones are denoted here by $z^{border}_{12}$, and the surface shape function is denoted by $f(X, Y) + c^{border}_{12}$.

Then, the measured values $z^{border}_{12}$ in the zones J and O are used as the surface position data while taking the coefficient of $f_{21}$ as being fixed, and the least square method is executed to the constant term $c^{border}_{12}$, that is, to solve the relation:

$\iint [\{f(X, Y) + c^{border}_{12}\} - z^{border}_{12}(X, Y)]^2 dXdY = 0$

It is to be noted here that, in Case 10 to Case 12 the measured values $z^{border}_{10} - z^{border}_{12}$ and the surface shape functions $f(X, Y)$ take different values, although they are defined in a similar way as in Case 9. Detailed explanation is omitted here, in order to avoid duplicate description.

In the manner described above, detection offset in relation to the zone in which the measuring points 19–23 lie on a pattern and to the zone in which the measuring points 19, 20, 22 and 23 lie on a pattern boundary, is determined.

Then, by using the thus determined constant terms $c^{pattern}_{19} - c^{pattern}_{23}$ and $c^{border}_1 - c^{border}_{12}$, the offset to be reflected to the surface position measurement is calculated, in a similar way as in the preceding embodiment.

That is, if the offset in the case where the measuring points 19–23 are Present on a Pattern is denoted by $PT_{19} - PT_{23}$, then:

$PT_{19} = c^{pattern}_{19}$
$PT_{20} = c^{pattern}_{20}$
$PT_{21} = c^{pattern}_{21}$
$PT_{22} = c^{pattern}_{22}$
$PT_{23} = c^{pattern}_{23}$ If the offset in the case where the points 19, 20, 22 and 23 are present on a pattern boundary is denoted by $BD_1 - BD_{12}$, then:

$BD_1 = c_{border1}$
$BD_2 = c_{border2}$
$BD_3 = c_{border3}$
$BD_4 = c_{border4}$
$BD_5 = c_{border5}$
$BD_6 = c_{border6}$
$BD_7 = c_{border7}$
$BD_8 = c_{border8}$
$BD_9 = c_{border9}$
$BD_{10} = c^{border}_{10}$
$BD_{11} = c^{border}_{11}$
$BD_{12} = c^{border}_{12}$ Also, in a case where the offset with respect to the measuring point 21 is CT which may be determined beforehand through experiments, for example, as in the preceding embodiment, and if the offset in the case where the points 19, 20, 22 and 23 lie on a pattern is denoted by $PT_{19}$, $PT_{20}$, $PT_{22}$ and $PT_{23}$, then:

$PT_{19} = c^{pattern}_{19} - c^{pattern}_{21} + CT$
$PT_{20} = c^{pattern}_{20} - c^{pattern}_{21} + CT$
$PT_{22} = c^{pattern}_{22} - c^{pattern}_{21} + CT$
$PT_{23} = c^{pattern}_{23} - c^{pattern}_{21} + CT$ If the offset to each measuring point 19, 20, 22 and 23 in a case where they are on a pattern boundary is denoted by $BD_1 - BD_{12}$, then:

$BD_1 = c^{border}_1 - c^{pattern}_{21} + CT$
$BD_2 = c^{border}_2 - c^{pattern}_{21} + CT$
$BD_3 = c^{border}_3 - c^{pattern}_{21} + CT$
$BD_4 = c^{border}_4 - c^{pattern}_{21} + CT$
$BD_5 = c^{border}_5 - c^{pattern}_{21} + CT$
$BD_6 = c^{border}_6 - c^{pattern}_{21} + CT$
$BD_7 = c^{border}_7 - c^{pattern}_{21} + CT$
$BD_8 = c^{border}_8 - c^{pattern}_{21} + CT$
$BD_9 = c^{border}_9 - c^{pattern}_{21} + CT$
$BD_{10} = c^{border}_{10} - c^{pattern}_{21} + CT$
$BD_{11} = c^{border}_{11} - c^{pattern}_{21} + CT$
$BD_{12} = c^{border}_{12} - c^{pattern}_{21} + CT$ The thus determined offsets $PT_{19} - PT_{23}$ as well as twelve offsets $BD_1 - BD_{12}$ are memorized into a memory.

In this manner, the offset to be reflected to each measuring point can be set. The manner of reflecting the offset during the exposure operation is similar to that of the preceding embodiment, and, depending on the zone (of zones A–Q of FIG. 31) to which the exposure region belongs, the offset $OFS_{19} - OFS_{23}$ for the measuring points 19–23, to be read out of the memory by the focus controller 18 is different, such as follows:

TABLE 5

|  | Point 19 | Point 20 | Point 21 | Point 22 | Point 23 |
| --- | --- | --- | --- | --- | --- |
| Zone A | $PT_{19}$ | $PT_{20}$ | $PT_{21}$ | $PT_{22}$ | $PT_{23}$ |
| Zone B | $BD_1$ | $PT_{20}$ | $PT_{21}$ | $BD_1$ | $PT_{23}$ |
| Zone C | $BD_3$ | $BD_3$ | $PT_{21}$ | $PT_{22}$ | $PT_{23}$ |
| Zone D | $PT_{19}$ | $BD_2$ | $PT_{21}$ | $PT_{22}$ | $BD_2$ |
| Zone E | $PT_{19}$ | $PT_{20}$ | $PT_{21}$ | $BD_4$ | $BD_4$ |

TABLE 5-continued

|  | Point 19 | Point 20 | Point 21 | Point 22 | Point 23 |
| --- | --- | --- | --- | --- | --- |
| Zone F | $BD_5$ | $PT_{20}$ | $PT_{21}$ | $PT_{22}$ | $PT_{23}$ |
| Zone G | $PT_{19}$ | $BD_8$ | $PT_{21}$ | $PT_{22}$ | $PT_{23}$ |
| Zone H | $PT_{19}$ | $PT_{20}$ | $PT_{21}$ | $PT_{22}$ | $BD_7$ |
| Zone I | $PT_{19}$ | $PT_{20}$ | $PT_{21}$ | $BD_6$ | $PT_{23}$ |
| Zone J | $BD_1$ | $PT_{20}$ | $PT_{21}$ | $BD_{12}$ | $BD_6$ |
| Zone K | $BD_{11}$ | $BD_5$ | $PT_{21}$ | $BD_1$ | $PT_{23}$ |
| Zone L | $BD_{11}$ | $BD_3$ | $PT_{21}$ | $BD_5$ | $PT_{23}$ |
| Zone M | $BD_3$ | $BD_{10}$ | $PT_{21}$ | $PT_{22}$ | $BD_8$ |
| Zone N | $BD_8$ | $BD_{10}$ | $PT_{21}$ | $PT_{22}$ | $BD_2$ |
| Zone O | $PT_{19}$ | $BD_2$ | $PT_{21}$ | $BD_7$ | $BD_9$ |
| Zone P | $PT_{19}$ | $BD_7$ | $PT_{21}$ | $BD_4$ | $BD_9$ |
| Zone Q | $BD_6$ | $PT_{20}$ | $PT_{21}$ | $BD_{12}$ | $BD_4$ |

By using the offset $OFS_{19}$–$OFS_{23}$ read out, the surface position data $z_{19}$–$z_{23}$ of the exposure region is corrected, to calculate the corrected surface position data $z_{19}$–$z_{23}$.

Namely, as in the second embodiment described hereinbefore:

$Z_{19}=z_{19}-OFS_{19}$ $Z_{20}=z_{20}-OFS_{20}$ $Z_{21}=z_{21}-OFS_{21}$ $Z_{22}=z_{22}-OFS_{22}$ $Z_{23}=z_{23}-OFS_{23}$

On the basis of the corrected surface position data $Z_{19}$–$Z_{23}$, the least square surface of the exposure region is determined. The sequential operations for transferring the pattern of the wafer to the wafer are made in the same way as in the preceding embodiment, and an explanation of then is omitted here.

In accordance with the present embodiment, even if the measuring points are on the pattern boundary and there are seventeen detection errors to be corrected, it is possible to determine the detection errors by using the "surface shape function constant method". Additionally, as compared with the second embodiment, it is possible to determine the detection error (offset correction) with the measurement shots of substantially the same number. Thus, when offset determination is made only to a first wafer in each lot and the thus determined offset is used also for the remaining wafers, the decrease of throughput can be made so small as can be disregarded, as in the preceding embodiment.

The flow chart of FIG. 32 simply depicts the sequences of determination of the detection error (offset correction) described above.

Figure 34:
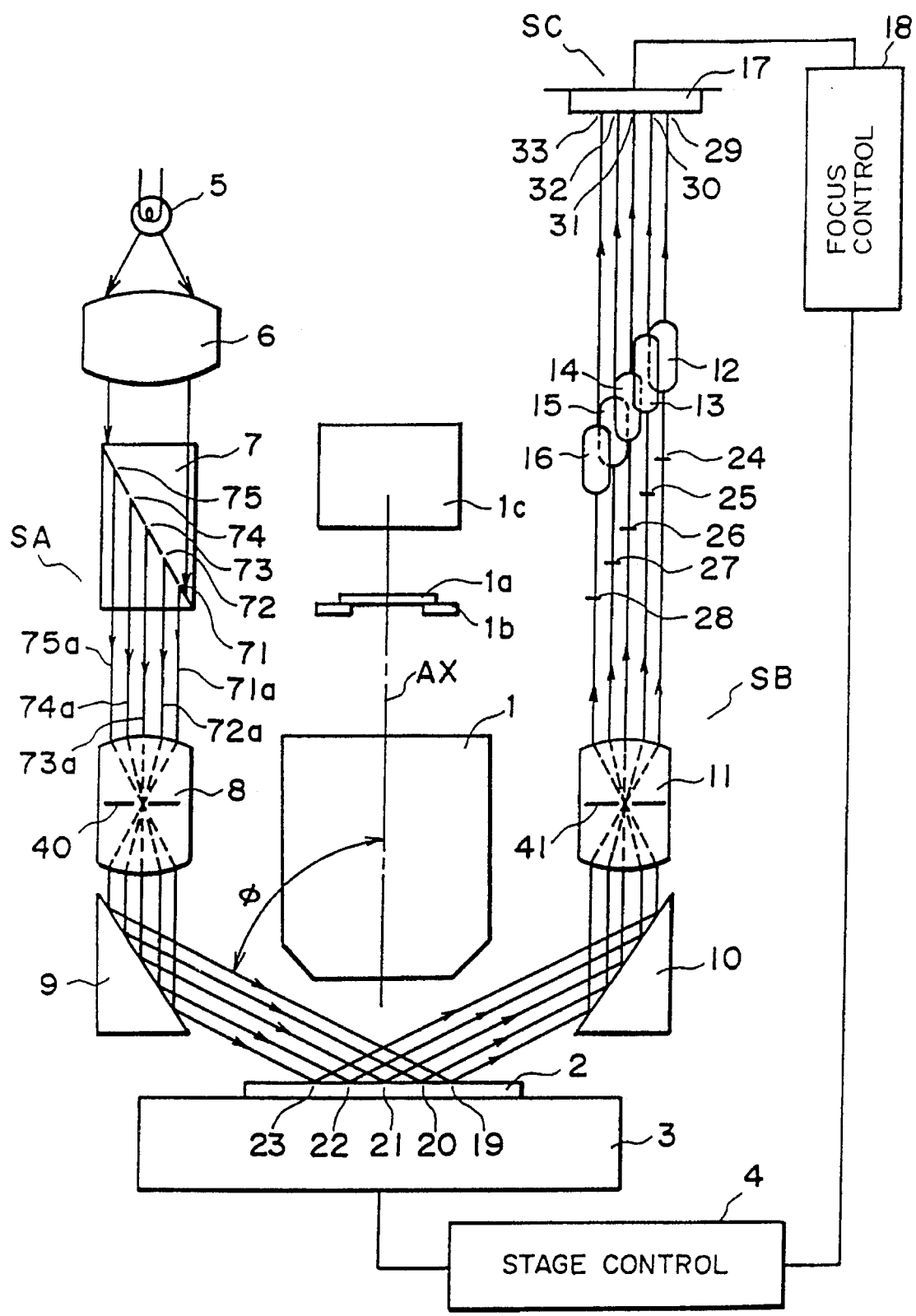
FIG. 34 is a schematic view of a main portion of a fourth embodiment of the present invention.
Figure 35:
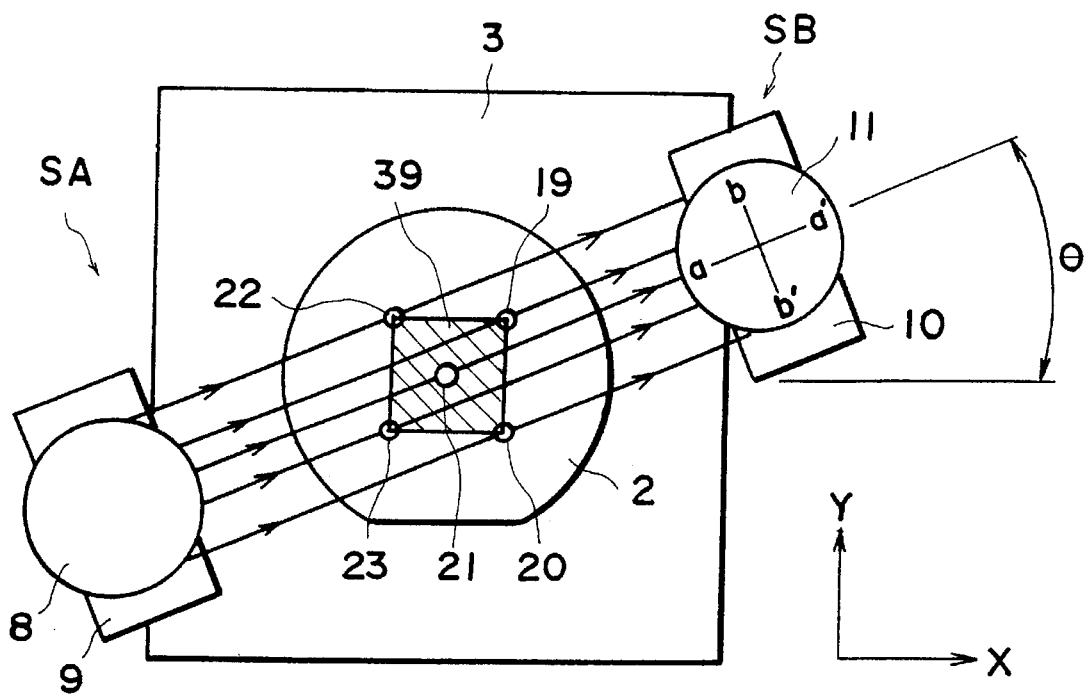
FIG. 35 is a schematic view of a portion of FIG. 34.

FIG. 34 is a schematic view of a main portion of a fourth embodiment of the present invention, and FIG. 35 is an enlarged view of a portion of FIG. 34.

In FIGS. 34 and 35, the elements corresponding to those shown in FIGS. 1 and 2 are denoted by corresponding reference numerals.

Now, the structure of this embodiment will be explained, although it will somewhat duplicate the description of the first embodiment of FIGS. 1 and 2.

Denoted in FIG. 34 at 1 is a reduction type projection optical system (projection lens system), and denoted at Ax is the optical axis of the projection optical system 1. Denoted at 1a is a reticle on which a circuit pattern is formed. It is placed on a reticle stage 1b. Denoted at 1c is an illumination system for illuminating the reticle 1a surface uniformly. The projection optical system 1 serves to project, in a reduced scale, the circuit pattern of the reticle 1a upon the surface of a wafer 2. The wafer 2 is held fixed on the surface of a wafer stage 3, through attraction. The wafer stage 3 is movable along the optical axis Ax (z direction) of the projection optical system 1, as well as in two directions (x and y directions) along the plane (x-y plane) orthogonal to the optical axis Ax. Additionally, it is equipped with the function of tilt adjustment with respect to the plane (x-y plane) orthogonal to the optical axis Ax. Thus, with this structure, it is possible to adjust the surface position of a wafer 2 placed on the wafer stage 3 surface, as desired. Denoted at 4 is a stage controller which is operable to controllably drive the wafer stage 3 in response to a signal from a focus controller 18, to be described later.

Denoted at SA is a light projecting means. Denoted at SB is a projection means. Denoted at SC is a photoelectric converting means. These components constitute a portion of a surface position detecting device for detecting the surface position of a wafer 2. The projection means SB and the photoelectric converting means SC cooperate with each other to define a detecting means SBC.

In this embodiment, when the circuit pattern of the reticle 1a is going to be projected on the wafer 2 surface through the projection optical system 1, the surface position detecting device is used to controllably drive the wafer stage 3 so as to position the wafer 2 surface within the range of the depth of focus of the projection optical system 1. The wafer stage 3 is then moved stepwise along the x-y plane, by which pattern regions (shots) 39 of rectangular shape are defined successively on the wafer 2 surface.

Next, the components of the surface position detecting device of this embodiment will be explained. Initially, the light projecting means SA for projecting a plurality of lights upon the wafer 2 surface will be described.

Denoted at 5 is a light source which comprises a white light source or an illumination unit arranged to emit light of different wavelengths. Denoted at 6 is a collimator lens for receiving the light from the light source 1 and producing parallel light of a substantially uniform sectional intensity distribution.

Denoted at 7 is a slit member of prism shape, having a pair of prisms cemented to each other so that their slant surfaces are opposed to each other. At the cemented surface, a plurality of openings (five pinholes) 71–75 are formed. Denoted at 8 is a lens system of dual telecentric type which serves to direct five independent lights 71a–75a, passed through the pinholes 71–75 of the slit member 7, toward five measuring points 19–23 on the wafer 2 surface via a mirror 9, substantially at the same angle of incidence. Here, the optical components are so set that the projected images comprise pinhole images of substantially the same size. Further, the lens system 8 includes an inside aperture stop 40 which serves to adjust or make uniform the NAs of the lights 71a–75a. In this embodiment, these components 5–9 cooperate to provide the light projecting means SA.

In this embodiment, the incidence angle φ of each light from the light projecting means SA impinging upon the wafer 2 surface (the angle defined with respect to a normal to the wafer surface) is φ=70 deg. or more. On the wafer 2 surface, there are a plurality of pattern regions (shots of exposure regions) 39 arrayed such as shown in FIG. 23. The five lights 71a–75a passed through the lens system 8 impinge on separate measuring points 19–23, respectively, of a pattern region 39.

The five lights 71a–75a when projected on the wafer 2 surface are so projected onto the wafer 2 surface along a direction rotated by an angle θ deg. (e.g. θ=22.5 deg.) in the X-Y plane from the X direction (direction of shot array), so that they can be observed independently as depicted in FIG. 35 when seen in the perpendicular direction to the wafer 2 (optical axis Ax direction), whereby substantially the same advantageous effect as that of the first embodiment is assured.

The five pinholes 71–75 of the slit member 7 are defined on a plane conjugate with the wafer 2 surface so as to satisfy the Scheimpflug's condition with respect to the wafer 2 surface. Also, the size and shape of the pinholes 71–75 of the slit member 7 as well as the distance thereof from the lens system 8 are so set that pinhole images of substantially the same size are formed on the wafer 2 surface.

In this embodiment, a plurality of lights (pinholes) are projected on the wafer 2 surface by using the light projecting means SA which comprises the above-described components 5–9. It is to be noted that in this embodiment the number of the measuring points to be defined on the wafer 2 surface is not limited to five (5).

Next, description will be made of the projection means SB which serves to direct and image the lights reflected by the wafer 2 surface onto the detection surface 17 of the photoelectric converting means SC (CCD position detecting device).

Denoted at 11 is a light receiving lens of dual telecentric type. The five reflection lights from the wafer 2 surface are directed via a mirror 10 to the light receiving lens 11. It serves to form pinhole images at the positions 24–28, respectively, corresponding to the measuring points 19–23, respectively.

Denoted at 41 is a stopper (stop) provided inside the light receiving lens 11, and it provides substantially the same advantageous effect as that of the first embodiment. The lights from the pinhole images at the positions 24–28 are then projected on five separate correction optical systems 12–16, respectively.

The light receiving lens 11 is of dual telecentric type, and the correction optical systems 12–16 have their optical axes placed parallel to each other. Thus, they serve to re-image the pinhole images, defined at the positions 24–28, upon the detection surface 17 of the photoelectric converting means SC such that light spots of the same size are formed thereon. The photoelectric converting means SC comprises a single area CCD, in this embodiment. As described, in this embodiment, the components 10, 11 and 12–16 cooperate with each other to provide the projection means SB.

The correction optical systems 12–16 each comprises a lens system and a parallel flat plate of predetermined thickness, and it is in a coaxial or eccentric relation with the optical axis of the light receiving lens 11. Here, the parallel flat plate is used to correct the optical length of each corresponding lens system. Also, each lens system is provided for magnification correction, such that substantially the same imaging magnification (projection magnification) is assured upon the detection surface 17 with respect to all the measuring points 19–23.

Namely, in an oblique projection imaging optical system as in the present embodiment wherein a plurality of lights are projected obliquely upon the surface of a wafer, as different measuring points 19–23 having different distances with respect to the light receiving lens 11 are imaged on the detection surface 17 of the photoelectric converting means SB, they are imaged at different imaging magnifications.

In this embodiment, in consideration thereof, the correction optical systems 12–16 are provided in relation to the measuring points, respectively, by which substantially the same projection magnification is assured upon the detection surface 17 to the measuring points 19–23.

Here, the positions of the pinhole images (light spots) impinging on the detection surface 17 are changeable with the surface positions (in the direction of level (height) and along the optical axis Ax) of the wafer 2 surface at the measuring points 19–23, respectively. The photoelectric converting means SC serves to detect such a change in the pinhole image position. Thus, in the present embodiment, the surface position information at each measuring point 19–23 on the wafer 2 surface can be detected, with the same precision.

Further, through the projection means SB, the measuring points 19–23 on the wafer 2 surface and the detection surface 17 of the photoelectric converting means SC are placed in a conjugate relation (inclination correction being made to the measuring points 19–23), such that even with any local tilt at the measuring point 19–23 the pinhole image position on the detection surface 17 does not change. Namely, in response to a change in the local level (height position) at each measuring point of the wafer 2 surface in the direction of the optical axis Ax, that is, in response to the level of each measuring point 19–23, the pinhole image position on the detection surface 17 is changeable.

The photoelectric converting means SC serves to detect the positional information about each pinhole image incident on the detection surface 17, and the pinhole image position information corresponding to the measuring points 19–23 obtained through the converting means SC is supplied to the focus controller 18.

In response to the level (surface position) information about the measuring points 19–23 applied from the converting means SC, the focus controller 18 determines the positional information about the wafer 2 surface, i.e., the position with respect to the optical axis AX direction (z direction) or the tilt thereof with respect to the X-Y plane.

Then, it applies a signal related to a drive of the wafer stage 3 to the stage controller 4 so as to bring the wafer 2 surface substantially into coincidence with the projection plane of the reticle 1a through the projection optical system 1. In response to the signal applied from the focus controller 18, the stage controller 4 controllably drives the wafer stage 3 to adjust the position and/or the attitude of the wafer 2.

Displacement of the wafer stage 3 in the x or y direction is measured in a known method using a laser interferometer, not shown, and a signal representing the amount of displacement of the wafer stage 3 is applied from the interferometer to the stage controller 4 through a signal line.

The stage controller 4 controls the position of the wafer stage 3 in the x and y directions and also it controls motion of the stage 3 in the z direction as well as the tilt thereof on the basis of a signal applied thereto from the focus controller 18 through a signal line. This is also the case with the first embodiment.

Now, the manner of detecting the surface position of a pattern region 39 of the wafer 2 in this embodiment will be explained.

As described hereinbefore, the major factor of detection error in the detection of the surface position of the wafer 2 with the optical surface position detecting system of FIG. 34 is the interference between the light reflected by the surface of a resist of the wafer 2 and the light reflected by the surface of the wafer 2 substrate. Since the effect of this interference differs with the pattern formed on the wafer substrate, for the respective measuring point 19–23 the measurement errors due to the interference differ from each other.

In a reduction projection exposure apparatus such as shown in FIG. 34, the pattern of the reticle 1a is transferred to exposure regions of the wafer 2 sequentially through the step-and-repeat method. Prior to the surface position detection and pattern transfer, the alignment operation is made to align an IC pattern previously formed on each exposure region of the wafer 2 with the pattern of the reticle.

The optical type surface position detecting system is fixed to the projection lens system 1, and the reticle 1a is held at a fixed position relative to the projection lens system 1. Therefore, by executing the surface position detection after aligning the reticle pattern and the exposure region of the wafer 2, it is assured that the measuring points 19–23 act to measure the height position substantially at the same location in each exposure region arrayed on the wafer 2. This means that the measuring points 19–23 serve to measure the height position at such a location in each exposure region, having the same substrate (pattern) structure.

Therefore, the effect upon the detection result of the interference between the light reflected by the resist surface of the wafer 2 and the light reflected by the substrate surface of the wafer 2 can be expected as being a quantity which is peculiar to each measuring point in the exposure region. Actually, it has been confirmed by the inventors through experiments that a substantially constant detection error occurs in each measurement.

Figures 36, 37:
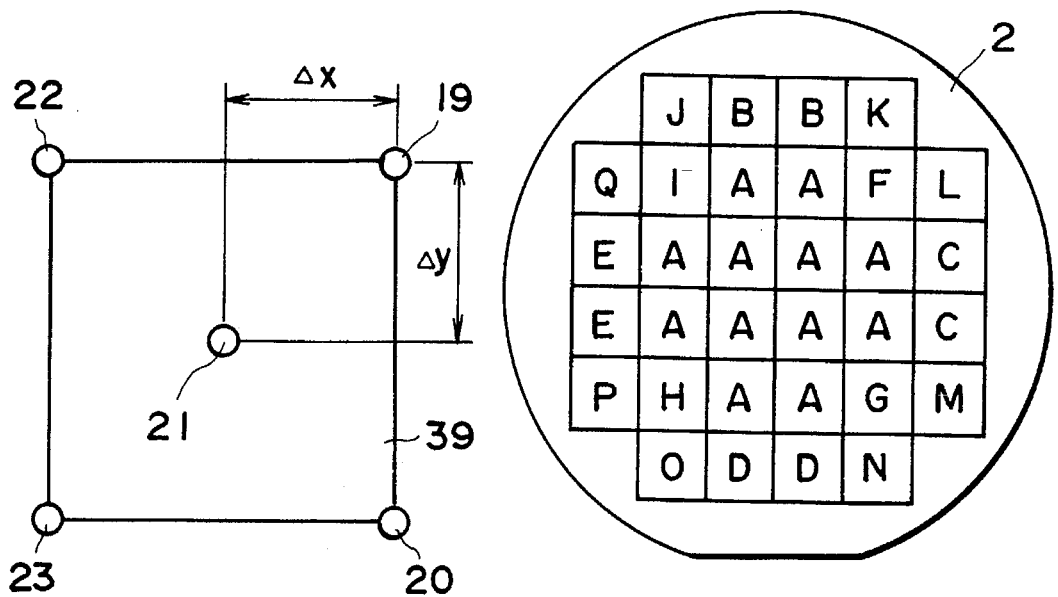
FIG. 36 is a schematic view for explaining the positional relationship between an exposure region and measuring points, in the fourth embodiment.
FIG. 37 is a schematic view of a layout of exposure regions defined regularly on a wafer and classified in a particular manner, in the fourth embodiment.

In this embodiment, the positional relation between the exposure region 39 and the measuring points 19–23 of the surface position detecting system is such as shown in FIG. 36 wherein the rectangle defined by connecting the points 19, 20, 22 and 23 substantially corresponds to the rectangular shape of the exposure region 39.

Here, the mounting position of the surface position detecting system is adjusted beforehand so that the measuring point 21 is substantially at the center of the exposure region 39 and it intersects with the optical axis AX in the surface position detecting operation. Also, adjustment is made so that the remaining measuring points 19, 20, 22 and 23 are placed in the peripheral portion of the exposure region 39, and that the origins for height measurement to the measuring points 19–23 are placed on the same plane which plane is substantially coincident with the best imaging plane of the projection lens system 1.

Here, depending on whether each measuring point 19–23 is on a pattern or a boundary thereof, exposure regions can be classified into seventeen (17) zones A–Q such as shown in FIG. 37.

Figure 38:
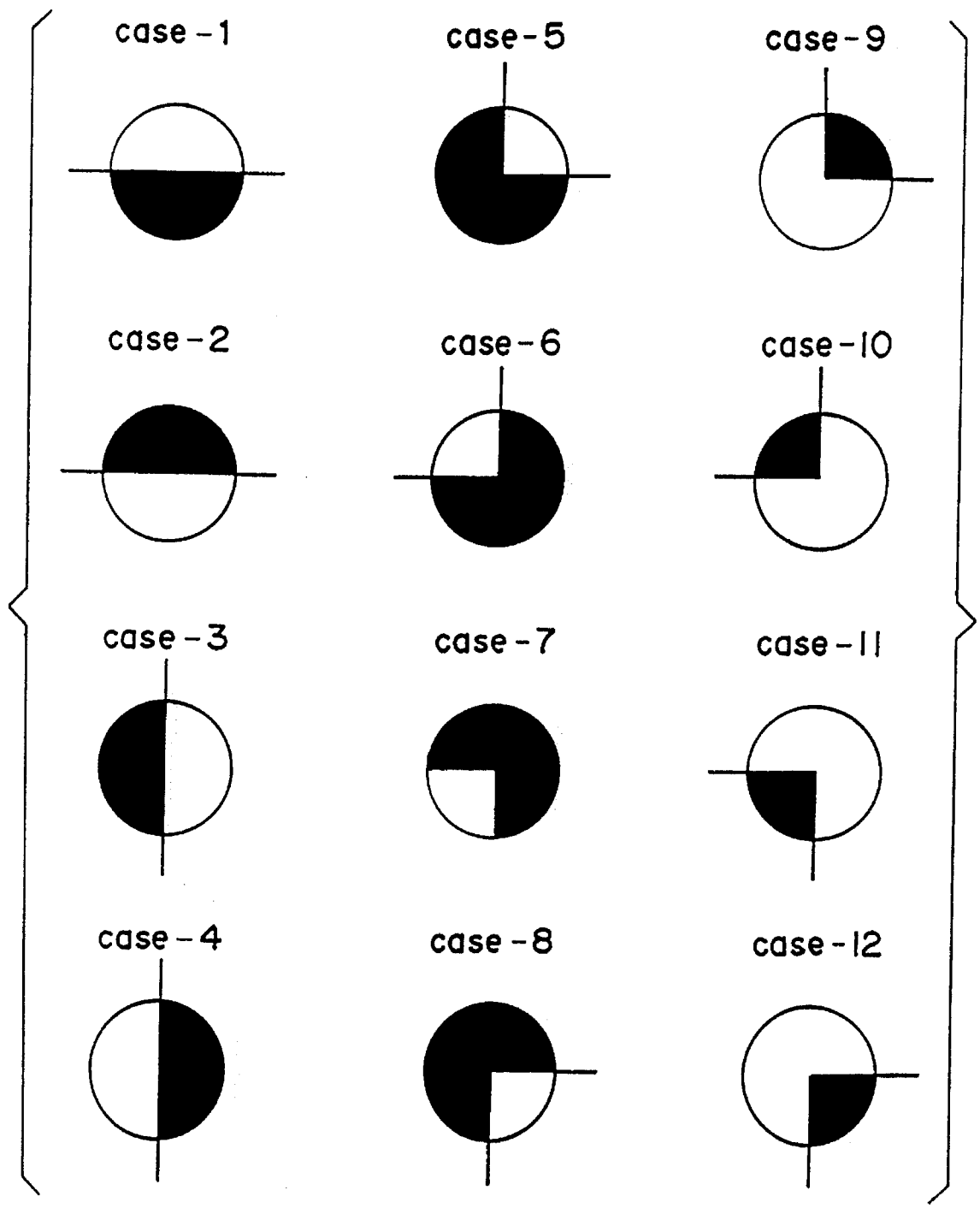
FIG. 38 is a schematic view for explaining the positional relationship of measuring points with exposure regions.

If each measuring point lies on the pattern boundary, there may be twelve (12) cases of positional relationship such as depicted in FIG. 38 (case 1 to case 12). In FIG. 32, each painted circle depicts a measuring point, and each hatched area corresponds to the portion of the measuring point lying on a pattern. The presence of twelve types of positional relations between the measuring point and the pattern boundary, means that there may be twelve types of detection errors (offset correction amounts) in a zone in which a measuring point lies on a boundary.

Here, considering a zone lying on a pattern and a zone lying on a boundary, with respect to each measuring point 19–23 the following relations are obtained:

TABLE 6

|  | Zone On A Pattern | Zone On A Boundary |
| --- | --- | --- |
| Point 19 | A,D,E,G,H,I,O,P | B,C,F,J,K,L,M,N,Q |
| Point 20 | A,B,E,F,H,I,J,Q | C,D,G,K,L,M,N,O,P |
| Point 21 | A–Q (all) |  |
| Point 22 | A,C,D,F,G,H,M,N | B,E,I,J,K,L,O,P,Q |
| Point 23 | A,B,C,F,G,I,K,L | D,E,H,J,M,N,O,P,Q |

Further, in a zone lying on a boundary, for the measuring points 19, 20, 22 and 23 the positional relation between the measuring point and the pattern is different, such as follows:

TABLE 7

|  | Point 19 | Point 20 | Point 22 | Point 23 |
| --- | --- | --- | --- | --- |
| Case 1 | B,J |  | B,K |  |
| Case 2 |  | D,O |  | D,N |
| Case 3 | C,M | C,L |  |  |
| Case 4 |  |  | E,P | E,Q |
| Case 5 | F | K | L |  |
| Case 6 | Q |  | I | J |
| Case 7 |  | P | O | H |
| Case 8 | N | G |  | M |
| Case 9 |  |  |  | O,P |
| Case 10 |  | M,N |  |  |
| Case 11 | K,L |  |  |  |
| Case 12 |  |  | J,Q |  |

Thus, it is necessary to detect detection errors of totaling seventeen (17), i.e., five detection errors in the zone lying on a pattern and twelve detection errors in a the zone lying on a boundary.

In the third embodiment of the present invention, if the measuring points and the pattern are in such a positional relation as depicted in Case 9 of FIG. 38, for example, the offset to the measuring point 23 in zones O and P are determined in the manner described below.

That is, while taking the surface shape function as determined by the measured value at the measuring point 21 with respect to plural exposure regions and not including a constant term, as being f(X, Y) and taking the measured value of the surface position at the measuring point 23 in zones O and P as being $z^{border}_9(X, Y)$ the coefficient of the surface shape function $f_{21}$ is held fixed (not to be processed by the least square method) and the least square method is executed to the constant term $c^{border}_9$. Namely, the operation is made to solve the equation:

$$\iint [\{f(X, Y)+c^{border}_9\}-z^{border}_9(X, Y)]^2 dXdY=0$$

and the value of this constant term $c^{border}_9$ is used as the offset for the measuring point 23 in zones O and P.

With this method, however, if the x-y coordinate of the measuring point 21 is (x, y) and that of the measuring point 23 is (x−δx, y−δy), then since the surface position of the point 23 is extrapolated with the surface shape function which represents the point 21 spaced by (δx, δy) and since the offset is determined while assuming that the difference from the extrapolated value corresponds to the measurement error resulting from the effect of interference, there is a possibility that the determined offset contains a measurement error when a topography change (unevenness) is present between the measuring points 21 and 23.

Such a topography change can be reduced to an order that can be substantially disregarded if the number of exposure regions which are predetermined for the offset determination is large (averaging effect). However, in a case where, as in the peripheral portion of the wafer, the offset is going to be determined with respect to the measuring point 23 in zones O and P (Case 9), only two exposure regions can be selected for the offset determination. Thus, such a topography change may cause an error.

In the present embodiment, in consideration thereof, even in such a case where there is unevenness within the exposure region, as that in the wafer peripheral portion, the effect of local topography can be reduced in the manner to be described below.

First, the exposure regions 39 for detection error measurement are determined beforehand, in four zones K, M, O and Q. The selection of these four zones K, M, O and Q is because all seventeen (17) types of detection errors, i.e., five detection errors in a zone lying on a pattern and twelve detection errors in a zone lying on a pattern boundary, are included in these zones, such as shown below:

TABLE 8

|        | Points On A Pattern | Points On A Boundary |
|--------|---------------------|----------------------|
| Zone K | Points 21 and 23    | Cases 1, 5 and 11    |
| Zone M | Points 21 and 22    | Cases 3, 8 and 10    |
| Zone O | Points 19 and 21    | Cases 2, 7 and 9     |
| Zone Q | Points 20 and 21    | Cases 4, 6 and 12    |

In the surface position detecting system of this embodiment, the formed pinhole images of the measuring points 19–23 are substantially equal to each other and, by providing correction optical systems respectively to the measuring points, substantially the same magnification, resolution and precision are assured for detection of the height positions of the measuring points. Further, by means of the aperture stop 40 provided within the lens system 8, NAs are substantially registered. Also, the lens system 8 is telecentric on its exit side, and the lights 71a–75a are incident on the measuring points 19–23 substantially at the same angle.

Namely, the surface position detecting system of this embodiment is structured to provide the same optical performance with respect to the measuring points 19–23. As a consequence, the detection errors for the measuring points 19, 20, 22 and 23 can be determined by using the measuring point 21.

First, the wafer stage 3 is moved so as to place an exposure region 39 of the wafer 2, in zone K, just below the projection lens system 1, and it is brought into alignment with the pattern of the reticle. Here, the wafer stage 3 motion is controlled on the basis of output signals from the laser interferometer. Then, the wafer 2 is held fixed at such a height position whereat the measured height position (along the optical axis AX direction) becomes substantially equal to zero.

Then, measuring points of a number (n+1) are defined along a straight line in a diagonal direction (depicted by a dash-and-dot line), extending from lower left to upper right, in the exposure region 39 of zone K. These measuring points should include points 19, 21 and 23 shown in FIG. 36. Also, measuring points of a number (n+1) are defined along a straight line in a diagonal direction (depicted by a dash-and-dot line), extending from lower right to upper left. These measuring points should include points 20, 21 and 22 shown in FIG. 36.

Then, while maintaining the height position in the optical axis AX direction as described, the wafer stage 3 is moved stepwise sequentially along the diagonal direction, extending from lower left to upper right, and height measurement using only the measuring point 21 is executed successively at the positions n+1 arrayed along a straight line. The measured height position is denoted by:

$F^K_r(m)$ where m=1 to n+1.

Additionally, while maintaining the height position in the optical axis AX direction as described, the wafer stage 3 is moved stepwise sequentially along the diagonal direction, extending from lower right to upper left, and height measurement using only the measuring points 21 is executed successively at the positions n+1 arrayed along a straight line. The measured height position is denoted by:

$F^K_l(m)$ where m=1 to n+1.

Signals related to the measuring position 21 and corresponding to these height positions $F^K_r(m)$ and $F^K_l(m)$ are supplied from the position detecting element 17 to the focus controller 18, and they are stored into a memory.

Similarly, by moving the wafer stage 3, each exposure region 39 in zones M, O and Q of the wafer 2 is placed sequentially just below the projection lens system 1 and, after alignment with the reticle pattern, similar measurement operations are made sequentially. The measured height positions are denoted respectively by:

$F^M_r(m)$ (m=1 to n+1)

$F^M_l(m)$ (m=1 to n+1)

$F^O_r(m)$ (m=1 to n+1)

$F^O_l(m)$ (m=1 to n+1)

$F^Q_r(m)$ (m=1 to n+1)

$F^Q_l(m)$ (m=1 to n+1)

Signals related to the measuring point 21 and corresponding to these height positions $F^M_r(m)$ to $F^Q_l(m)$ are supplied from the position detecting element 17 to the focus controller 18, and they are stored into the memory.

Now, the manner of determining the amount of correction of the measurement error will be explained.

Figure 39A:
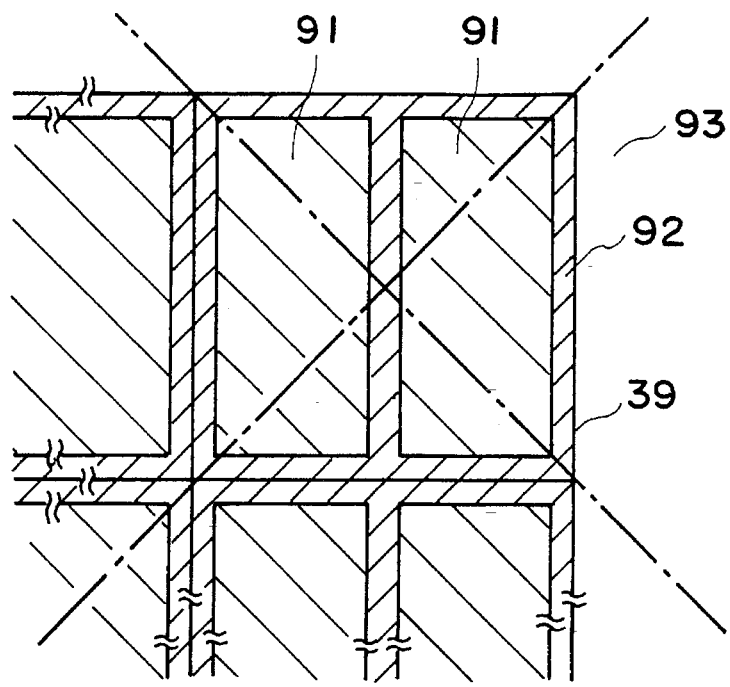
FIGS. 39A–39C are schematic views for explaining the positional relationship of exposure regions as well as the pattern structure.

It is assumed that the exposure region 39 which is present in zone K has a plane structure such as shown in FIG. 39A. Denoted at 91 is an area in which a memory or the like is formed. Denoted at 92 is a scribe line area in which bonding pads, for example, are provided. In the left-side portion, the lower left portion and the lower portion, the exposure region 39 within zone K adjoins exposure regions 39. But, in other peripheral directions, it adjoins a wafer region 93 in which no pattern is formed.

Figure 39B:
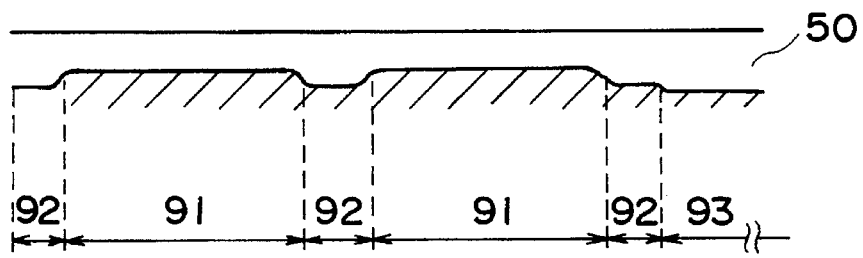

The sectional structure of the exposure region 39 within zone K, in the diagonal direction extending from lower left to upper right, is such as depicted in FIG. 39B. The region 91 in which a memory or the like is formed has a topography of protrusion, and the scribe line region 92 in which bonding pads or the like are formed has a topography of a recess. The wafer region 93 in which no pattern is formed has a topography of a larger recess. However, the surface of the exposure region 39 totally covered by a resist layer 50, has a substantially flat topography.

In the case of FIG. 39B, there is no tilt with reference to the x-y plane along which the wafer stage 3 moves.

Figure 39C:
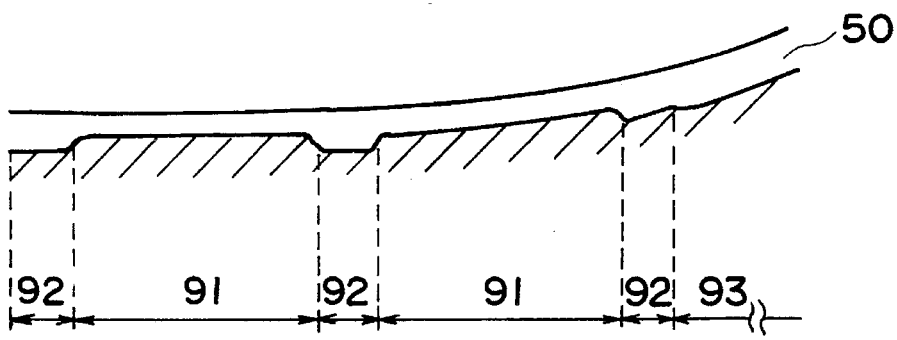

In the case shown in FIG. 39C, the exposure region 39 in zone K, which is in the peripheral portion of the wafer, has a warp at its one side.

Figure 40A:
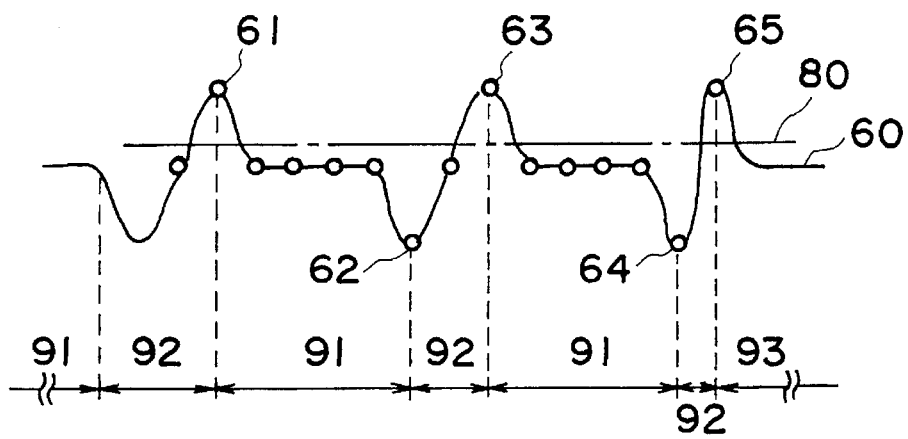
FIGS. 40A–40C are schematic views for explaining measured levels (height positions) and warp components, in cases when there is warp and when there is not warp.

FIG. 40A shows measured height position of the measuring point 21, as measured while moving the wafer stage 3 in the diagonal direction, extending from lower left to upper right, with the exposure region 39 of zone K being maintained at the height position in the optical axis AX direction as described. Solid line 60 depicts continuously measured values of the height position of the measuring point 21 as obtainable if the wafer stage 3 is moved continuously. Each circle corresponds to the measured height position of the measuring point 21 at each of the positions n+1 arrayed along a straight line, as measured while moving the stage 3 stepwise sequentially.

This embodiment is so structured that, with the angle φ of incidence of the measuring light (FIG. 34) being made not smaller than 70 deg., the reflectivity at the resist 50 surface is large, such that the height position adjacent to the resist 50 surface can be measured. However, there is a component transmitted through the resist layer and reflected by the wafer substrate, which component is not zero, and due to the interference between the component reflected by the resist 50 surface and the component reflected by the wafer substrate, a measurement error may be included in the measured value of height position.

As seen in the measured values 61–65 in FIG. 40A, such measurement error becomes most notable when the measuring point 21 is located at the boundary between the regions 91 and 92 or the regions 92 and 93, of different interference conditions. When the measuring point 21 is placed within one and the same region, the topography of the resist layer 50 surface can be measured correctly. Therefore, the measurement error described above is caused as the measuring point 21 starts overlying on those regions of different interference conditions. The range in which the measurement error is produced corresponds to the period in which the measuring point 21 passes through the boundary, i.e., within the size of the measuring point upon the wafer.

Figure 40B:
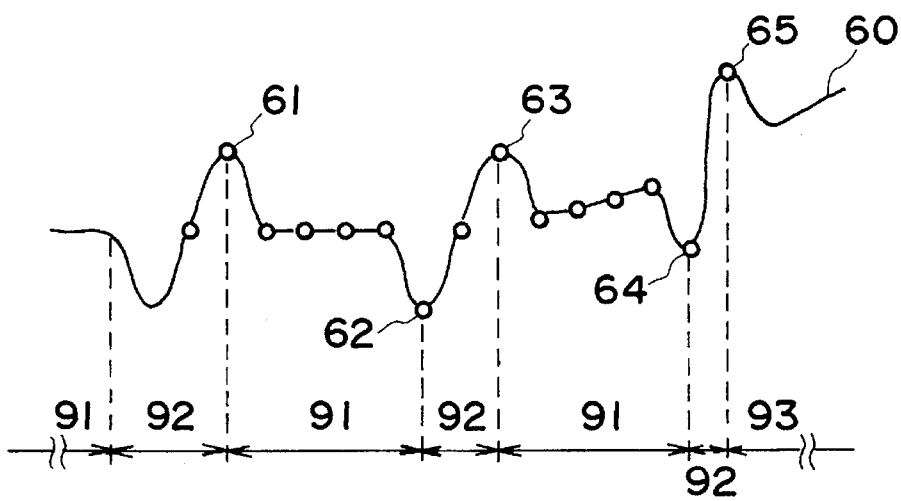

FIG. 40B depicts the measured height of the measuring point 21 in a case where the exposure region 39 of zone K (FIG. 39C) has a warp at one side thereof. Generally, the peripheral portion of a wafer may have such warp. It is necessary to remove the effect of the warp from the measured values in FIG. 40B with any suitable method, and the correction amount to the detection error should be determined, with the measured values corrected such as depicted in FIG. 40A.

It has been confirmed through a number of experiments made by the inventors of the subject application that: since the half period of measurement error (corresponding to one crest or trough of measured values) resulting from the effect of interference as seen in the measured values 61–65 is, at the most, equivalent to or smaller (not less than 3 mm) than the size of the measuring point 21 upon the wafer, and since it is shorter than the diagonal length (not less than 30 mm) of the exposure region 39, it appears in the form of "higher frequency components" of the measured height values as measured while moving the wafer stage: and that, on the other hand, the effect of the wafer warp or the like appears in the form of "lower frequency components" such that it can be approximated simply by a cubic.

Also, it has been confirmed that, by setting in the measurement the sampling interval of the measuring points of a number n+1 substantially equal to or not larger than the size of the measuring point 21 upon the wafer, the component of warp or the like can be approximated by a cubic with a sufficient precision.

The effect of warp of the wafer in the case of FIG. 40B can be specified as follows:

The cubic is denoted by $f_{bend}{}^{K}{}_{r}(m) = a \cdot m^3 + b \cdot m^2 + c \cdot m + d$ where a, b, c and d are constants.

To these constants a–d of the cubic $f_{bend}(m)$, the least square method is executed by using discrete measured values $F^{K}{}_{r}(m)$.

That is, $\int \{f_{bend}{}^{K}{}_{r}(m) - F^{K}{}_{r}(m)\}^2 dm = 0$ (m=1 to n+1)

is calculated to determine $f_{bend}{}^{K}{}_{r}(m)$.

Figure 40C:
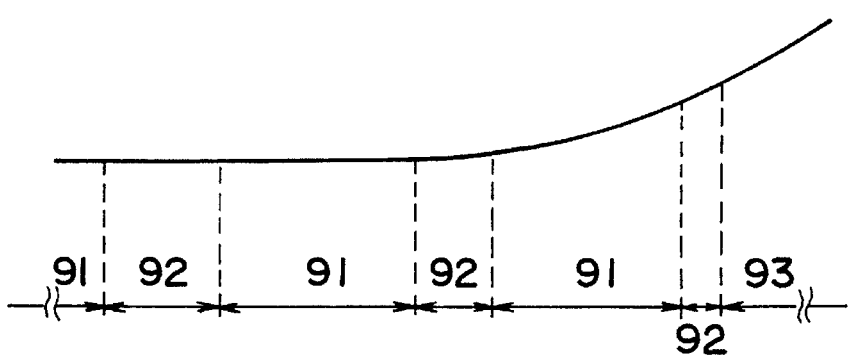

The thus determined warp component $f_{bend}{}^{K}{}_{r}(m)$ is depicted in FIG. 40C.

Subsequently, the measured values $F^{K}{}_{r}(m)$ of FIG. 40B with the warp component being excluded are calculated. That is, $F_{pattern}{}^{K}{}_{r}(m) = F^{K}{}_{r}(m) - f_{bend}{}^{K}{}_{r}(m)$ (m=1 to n+1)

Here, $F_{pattern}{}^{K}{}_{r}(m)$ is corrected into the state as depicted in FIG. 40A.

Similarly, $\int \{f_{bend}{}^{K}{}_{l}(m) - F^{K}{}_{l}(m)\}^2 dm = 0$ $\int \{f_{bend}{}^{M}{}_{r}(m) - F^{M}{}_{r}(m)\}^2 dm = 0$ $\int \{f_{bend}{}^{M}{}_{l}(m) - F^{M}{}_{l}(m)\}^2 dm = 0$ $\int \{f_{bend}{}^{O}{}_{r}(m) - F^{O}{}_{r}(m)\}^2 dm = 0$ $\int \{f_{bend}{}^{O}{}_{l}(m) - F^{O}{}_{l}(m)\}^2 dm = 0$ $\int \{f_{bend}{}^{Q}{}_{r}(m) - F^{Q}{}_{r}(m)\}^2 dm = 0$ $\int \{f_{bend}{}^{Q}{}_{l}(m) - F^{Q}{}_{l}(m)\}^2 dm = 0$ (m=1 to n+1)

are calculated to determine coefficients of respective cubics. Thereafter, $F_{pattern}{}^{K}{}_{l}(m) = F^{K}{}_{l}(m) - f_{bend}{}^{K}{}_{l}(m)$ $F_{pattern}{}^{M}{}_{r}(m) = F^{M}{}_{r}(m) - f_{bend}{}^{M}{}_{r}(m)$ $F_{pattern}{}^{M}{}_{l}(m) = F^{M}{}_{l}(m) - f_{bend}{}^{M}{}_{l}(m)$ $F_{pattern}{}^{O}{}_{r}(m) = F^{O}{}_{r}(m) - f_{bend}{}^{O}{}_{r}(m)$ $F_{pattern}{}^{O}{}_{l}(m) = F^{O}{}_{l}(m) - f_{bend}{}^{O}{}_{l}(m)$ $F_{pattern}{}^{Q}{}_{r}(m) = F^{Q}{}_{r}(m) - f_{bend}{}^{Q}{}_{r}(m)$ $F_{pattern}{}^{Q}{}_{l}(m) = F^{Q}{}_{l}(m) - f_{bend}{}^{Q}{}_{l}(m)$ (m=1 to n+1)

are calculated, whereby the effect of warp or the like can be removed.

Initially, calculation is made to determine, relative to the measuring point 21 at the center of the exposure region 39, the relative errors $PT_{19}'$, $PT_{20}'$, $PT_{22}'$ and $PT_{23}'$ of the "measuring points 19, 20, 22 and 23 on a pattern" as well as the relative errors $BD_1'$–$BD_{12}'$ of the "measuring points 19, 20, 22 and 23 upon a boundary region in Case 1 to Case 12".

That is, $PT_{19}' = F_{pattern}{}^{O}{}_{r}(n+1) - F_{pattern}{}^{O}{}_{r}((n/2)+1)$ $PT_{20}' = F_{pattern}{}^{Q}{}_{l}(1) - F_{pattern}{}^{Q}{}_{l}((n/2)+1)$ $PT_{22}' = F_{pattern}{}^{M}{}_{l}(n+1) - F_{pattern}{}^{M}{}_{l}((n/2)+1)$ $PT_{23}' = F_{pattern}{}^{K}{}_{r}(1) - F_{pattern}{}^{K}{}_{r}((n/2)+1)$ It follows from the above that:

$BD_1' = F_{pattern}{}^{K}{}_{l}(n+1) - F_{pattern}{}^{K}{}_{l}((n/2)+1)$ $BD_2' = F_{pattern}{}^{O}{}_{l}(1) - F_{pattern}{}^{O}{}_{l}((n/2)+1)$ $BD_3' = F_{pattern}{}^{M}{}_{r}(n+1) - F_{pattern}{}^{M}{}_{r}((n/2)+1)$ $BD_4' = F_{pattern}{}^{Q}{}_{r}(1) - F_{pattern}{}^{Q}{}_{r}((n/2)+1)$ $BD_5' = F_{pattern}{}^{K}{}_{l}(1) - F_{pattern}{}^{K}{}_{l}((n/2)+1)$ $BD_6' = F_{pattern}{}^{Q}{}_{r}(n+1) - F_{pattern}{}^{Q}{}_{r}((n/2)+1)$ $BD_7' = F_{pattern}{}^{O}{}_{l}(n+1) - F_{pattern}{}^{O}{}_{l}((n/2)+1)$ $BD_8' = F_{pattern}{}^{M}{}_{r}(1) - F_{pattern}{}^{M}{}_{r}((n/2)+1)$ $BD_9' = F_{pattern}{}^{O}{}_{r}(1) - F_{pattern}{}^{O}{}_{r}((n/2)+1)$ $BD_{10}' = F_{pattern}{}^{M}{}_{l}(1) - F_{pattern}{}^{M}{}_{l}((n/2)+1)$ $BD_{11}' = F_{pattern}{}^{K}{}_{r}(n+1) - F_{pattern}{}^{K}{}_{r}((n/2)+1)$ $BD_{12}' = F_{pattern}{}^{Q}{}_{l}(n+1) - F_{pattern}{}^{Q}{}_{l}((n/2)+1)$ Here, assuming that the offset to be reflected to the measured value of the measuring point 21 is $PT_{21}$ and that the value determined through experiments of wafer pattern exposure and stored into a memory is CT, $PT_{21} = CT$.

By using a value determined through experiments, as the offset of the measuring point 21 which serves as a reference for the height position measurement at the peripheral measuring points 19, 20, 22 and 23, the total reliability of offset is improved.

Thus, the seventeen types of offset to be reflected to the measured values of the measuring points 19–23, i.e., the offset $PT_{19}$–$PT_{23}$ to be reflected to the "measuring points 19–23 lying on a pattern" and the offset $BD_1$–$BD_{12}$ to be reflected as the "Case 1 to Case 12 of the measuring points 19, 20, 22 and 23 lying on a boundary zone", are expressed such as follows:

$PT_{19} = PT_{19}' + CT$ $PT_{20} = PT_{20}' + CT$ $PT_{21} = CT$ $PT_{22} = PT_{22}' + CT$ $PT_{23} = PT_{23}' + CT$ and $BD_1 = BD_1' + CT$ $BD_2 = BD_2' + CT$ $BD_3=BD_3'+CT$ $BD_4=BD_4'+CT$ $BD_5=BD_5'+CT$ $BD_6=BD_6'+CT$ $BD_7=BD_7'+CT$ $BD_8=BD_8'+CT$ $BD_9=BD_9'+CT$ $BD_{10}=BD_{10}'+CT$ $BD_{11}=BD_{11}'+CT$ $BD_{12}=BD_{12}'+CT$ These four offsets $PT_{19}$, $PT_{20}$, $PT_{22}$ and $PT_{23}$ as well as twelve offsets $BD_1$–$BD_{12}$ thus determined are stored into a memory.

In this manner, the offset to be reflected to each measuring point can be set. Now, the manner of reflecting the offset during the exposure operation will be explained.

After completion of the offset setting, the wafer stage 3 is moved so as to place a first exposure region of the wafer 2 just below the projection lens system 1, and it is brought into alignment with the pattern of the reticle. After completion of the alignment operation, the surface position detection is done to the five measuring points 19–23 of the first exposure region through the surface position detecting system. On the basis of output signals from the position detecting element 17, the focus controller 18 produces surface position data related to the measuring points.

The focus controller 18 reads offset $OFS_{19}$–$OFS_{23}$ of the measuring points 19–23, out of the memory.

Here, depending on the zone (out of zones A–Q of FIG. 37) to which the first exposure region belongs, the offset $OFS_{19}$–$OFS_{23}$ to be read out is different, such as shown below:

TABLE 9

|        | Point 19  | Point 20  | Point 21  | Point 22  | Point 23  |
|--------|-----------|-----------|-----------|-----------|-----------|
| Zone A | $PT_{19}$ | $PT_{20}$ | $PT_{21}$ | $PT_{22}$ | $PT_{23}$ |
| Zone B | $BD_1$    | $PT_{20}$ | $PT_{21}$ | $BD_1$    | $PT_{23}$ |
| Zone C | $BD_3$    | $BD_3$    | $PT_{21}$ | $PT_{22}$ | $PT_{23}$ |
| Zone D | $PT_{19}$ | $BD_2$    | $PT_{21}$ | $PT_{22}$ | $BD_2$    |
| Zone E | $PT_{19}$ | $PT_{20}$ | $PT_{21}$ | $BD_4$    | $BD_4$    |
| Zone F | $BD_5$    | $PT_{20}$ | $PT_{21}$ | $PT_{22}$ | $PT_{23}$ |
| Zone G | $PT_{19}$ | $BD_8$    | $PT_{21}$ | $PT_{22}$ | $PT_{23}$ |
| Zone H | $PT_{19}$ | $PT_{20}$ | $PT_{21}$ | $PT_{22}$ | $BD_7$    |
| Zone I | $PT_{19}$ | $PT_{20}$ | $PT_{21}$ | $BD_6$    | $PT_{23}$ |
| Zone J | $BD_1$    | $PT_{20}$ | $PT_{21}$ | $BD_{12}$ | $BD_6$    |
| Zone K | $BD_{11}$ | $BD_5$    | $PT_{21}$ | $BD_1$    | $PT_{23}$ |
| Zone L | $BD_{11}$ | $BD_3$    | $PT_{21}$ | $BD_5$    | $PT_{23}$ |
| Zone M | $BD_3$    | $BD_{10}$ | $PT_{21}$ | $PT_{22}$ | $BD_8$    |
| Zone N | $BD_8$    | $BD_{10}$ | $PT_{21}$ | $PT_{22}$ | $BD_2$    |
| Zone O | $PT_{19}$ | $BD_2$    | $PT_{21}$ | $BD_7$    | $BD_9$    |
| Zone P | $PT_{19}$ | $BD_7$    | $PT_{21}$ | $BD_4$    | $BD_9$    |
| Zone Q | $BD_6$    | $PT_{20}$ | $PT_{21}$ | $BD_{12}$ | $BD_4$    |

By using the offset $OFS_{19}$–$OFS_{23}$ read out, the surface position data $z_{19}$–$z_{23}$ of the five measuring points of the first exposure region is corrected, to calculate the corrected surface position data $Z_{19}$–$Z_{23}$.

Namely:

$Z_{19}=z_{19}-OFS_{19}$ $Z_{20}=z_{20}-OFS_{20}$ $Z_{21}=z_{21}-OFS_{21}$ $Z_{22}=z_{22}-OFS_{22}$ $Z_{23}=z_{23}-OFS_{23}$

On the basis of the corrected surface position data $Z_{19}$–$Z_{23}$, the focus controller 18 determines the least square surface of the first exposure region.

Further, the focus controller 18 supplies a signal corresponding to the result of calculation of the least square surface to the stage controller 4, by which the position of the wafer 2 in the optical axis AX direction, held on the wafer stage 3, as well as any tilt thereof are adjusted (corrected). By this, the first exposure region of the wafer 2 is positioned upon the best imaging plane of the projection lens system 1. Thereafter, the first exposure region is exposed, whereby the pattern of the reticle is transferred thereto.

After completion of the exposure process to the first exposure region, the wafer stage 3 is moved so as to place a second exposure region of the wafer 2 just below the projection lens system 1, and similar surface position detecting operation, surface position adjusting operation and exposure operation as described are executed. Such sequential operations are carried out repeatedly until the exposure process to the last exposure region is completed. Then, the wafer 2 is off-loaded from the wafer stage 3.

Determination of detection error (offset correction) for each measuring point on the wafer surface as described above, has to be done in each process where a different pattern is to be formed.

However, as for frequency, it is sufficient to make such a determination once in each process. At an initial stage of each process, the detection error (offset correction) may be determined and stored into a memory and, by doing so, semiconductor chips can be manufactured substantially without a loss of throughput.

On an occasion where, to these four shots of zones K, M, O and Q, the measurement is carried out along the diagonal directions extending from lower left to upper right and from lower right to upper left, each with respect to eleven points, and if the time period necessary for the stepwise motion between adjacent shots and for the alignment operation is 0.4 sec. and the time period necessary for the motion between adjacent measuring points along the diagonal direction and for the measurement is 0.2 sec., then it takes only about 20 seconds or less to determine the detection errors (offset correction).

Where the detection error (offset) determination is carried out with respect to only a first wafer in each lot and the thus determined value is used also for the remaining wafers, as described hereinbefore, the decrease of throughput can be made so small as can be substantially disregarded.

Figure 41:
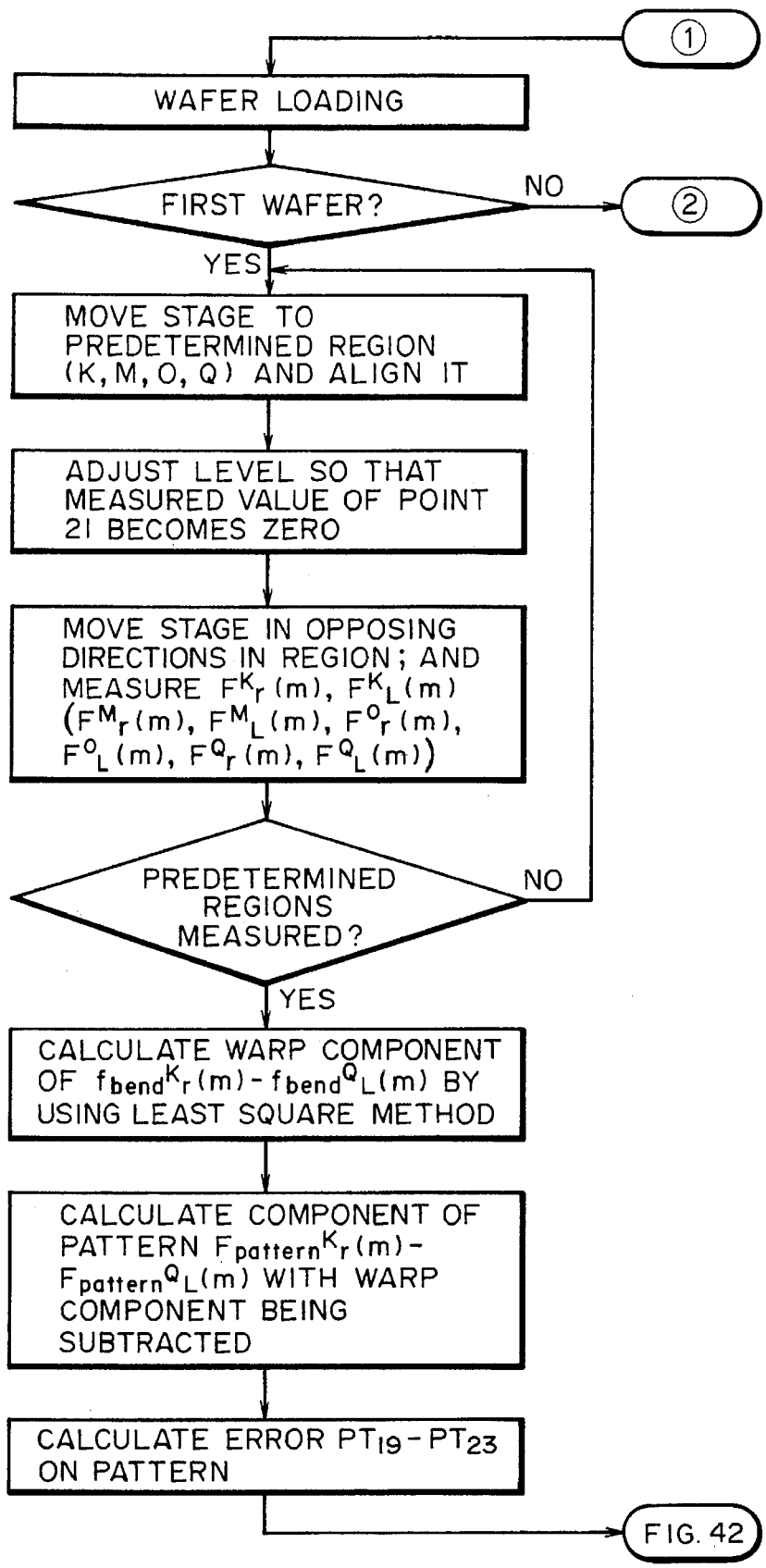
FIG. 41 is a flow chart of determination of measurement error.
Figure 42:
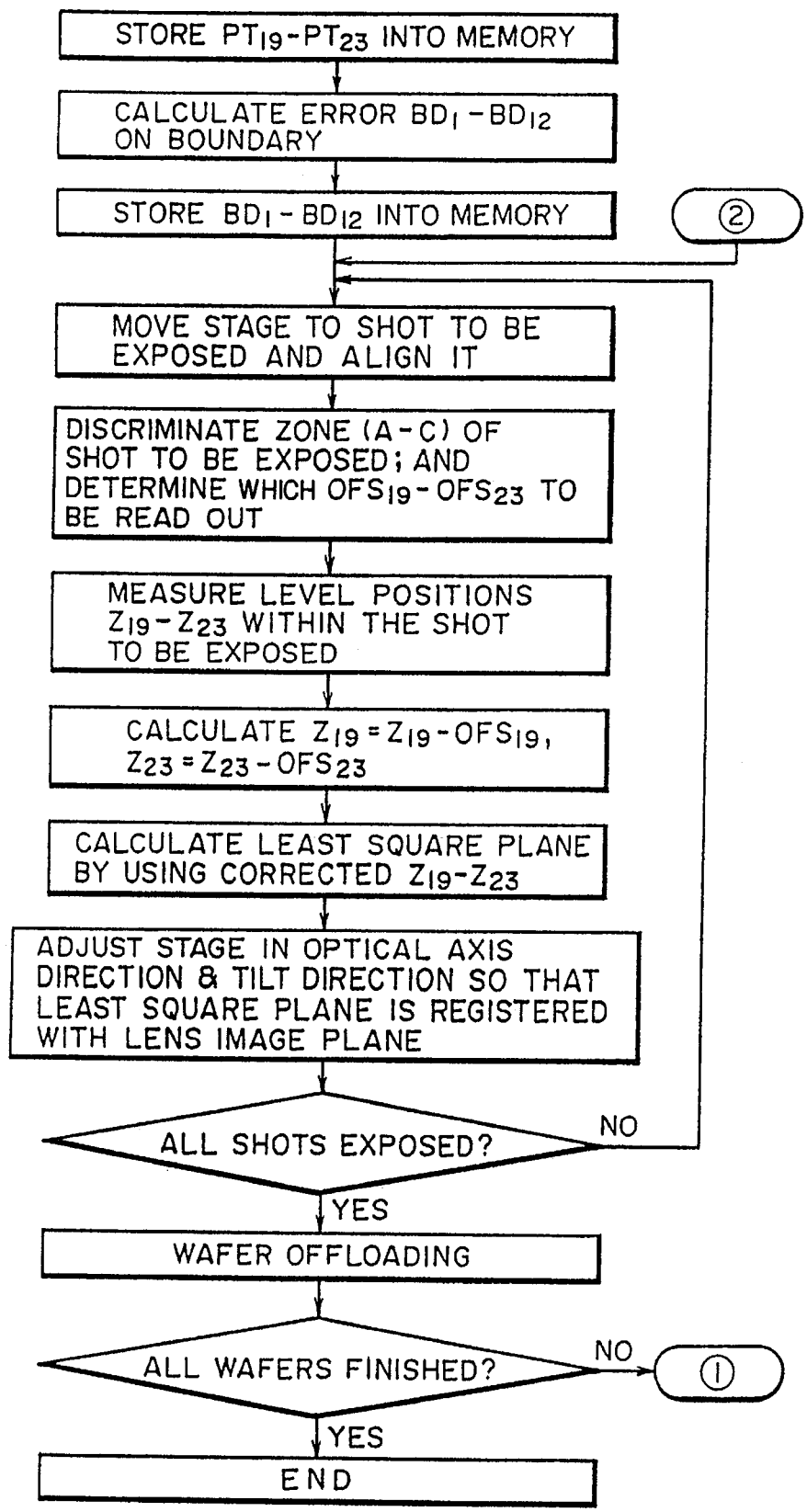
FIG. 42 is a flow chart of determination of measurement error.

The flow charts of FIGS. 41 and 42 simply depict the measurement process in this case.

In the fourth embodiment described above, the offset for the measuring point 21 is determined on the basis of experiments and, by using the determined value, the remaining offsets are determined. However, all the offsets may be determined automatically in the manner to be described below to facilitate the offset setting operation.

As described hereinbefore, the measurement error resulting from the effect of interference in zone K (FIG. 40A) becomes notable as the measuring point is located at the boundary of a pattern. Even on an occasion when, as the case of the measured values 62 and 63 of FIG. 40A, the same pattern at the boundary between zones 91 and 92 underlies the measuring point, if the disposition of zones is inverted, the produced measurement errors have inverted signs although the magnitudes (absolute values) of them are the same.

Here, considering the measured height positions of a number of n+1, the measured values 62 and 63 and the measured values 61 and 64 may be mutually canceled, but the measured value 65 at the boundary between the scribe line region 92 and the region 93 not having a pattern remains.

Therefore, considering an average of measured values of height position of a number n+1 in zone K as depicted in FIG. 40A, it follows that:

$\{1/(n+1)\} \cdot \Sigma\{F^K_r(m)\} = C_{patter\ r}^{\ K}$ (m=1 to n+1)

Thus, it converges to a certain value as depicted at 80 in FIG. 40A.

Figure 43:
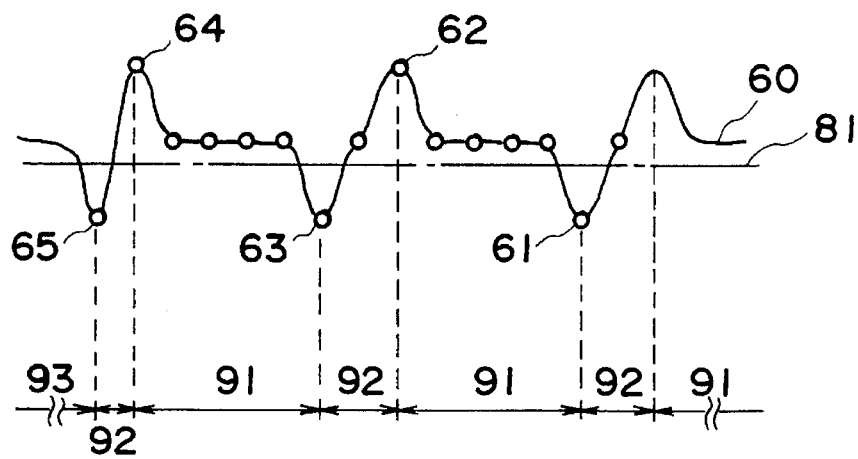
FIG. 43 is a schematic view for explaining measured levels (height positions) in a case where the warp component is corrected.

FIG. 43 shows the values $F_{patter\ r}^{\ O}(m)$ of those measured values which are along a direction, extending from lower left to upper right, in zone O of the wafer 2 symmetric with zone K, with the warp components or the like in the measured values being corrected.

Here, considering the measured values of height position of a number of n+1, the measured values 62 and 63 and the measured values 61 and 64 may be mutually canceled, and only the measured value 65 at the boundary between the scribe line region 92 and the region 93 not having a pattern, remains with its sign inverted relative to zone K (FIG. 40A).

Therefore, considering an average of measured values of height position of a number n+1 in zone O as depicted in FIG. 43, it follows that:

$\{1/(n+1)\} \cdot \Sigma\{F^O_r(m)\} = C_{pattern\ r}^{\ O}$ (m=1 to n+1)

Thus, it converges to a certain value as depicted at 81 in FIG. 43.

It follows therefrom that:

$$\{1/(n+1)\} \cdot \Sigma\{F^{K_r}_{pattern}(m) + F^{O_r}_{pattern}(m)\} = C^{K_r}_{pattern} + C^{O_r}_{pattern}$$
$$= 0$$

Thus, the measurement errors resulting from the effect of interference are mutually canceled.

Similarly, between the measured values in the zones of the wafer which are symmetric with each other:

$$\{1/(n+1)\} \cdot \Sigma\{F^{K_l}_{pattern}(m) + F^{O_l}_{pattern}(m)\} = C^{K_l}_{pattern} + C^{O_l}_{pattern}$$
$$= 0$$

and $$\{1/(n+1)\} \cdot \Sigma\{F^{M_r}_{pattern}(m) + F^{Q_r}_{pattern}(m)\} = C^{M_r}_{pattern} + C^{Q_r}_{pattern}$$
$$= 0$$

and $$\{1/(n+1)\} \cdot \Sigma\{F^{M_l}_{pattern}(m) + F^{Q_l}_{pattern}(m)\} = C^{M_l}_{pattern} + C^{Q_l}_{pattern}$$
$$= 0$$

Thus, the measurement errors caused by the effect of interference are mutually canceled.

Japanese Laid-Open Patent Application, Laid-Open No. 198130/1990 proposes a method of setting offset of each measuring point by using the sum of those measured values with which the measurement errors are mutually canceled. In accordance with this method, the offset of each measuring point is determined as follows:

$PT_{19} = F_{pattern\ r}^{\ O}(n+1) - (C_{pattern\ r}^{\ K} + C_{pattern\ r}^{\ O})$
$PT_{20} = F_{pattern\ l}^{\ Q}(1) - (C_{pattern\ l}^{\ M} + C_{pattern\ l}^{\ Q})$
$PT_{21} = F_{pattern\ r}^{\ K}((n/2)+1) - (C_{pattern\ r}^{\ K} + C_{pattern\ r}^{\ O})$
$PT_{22} = F_{pattern\ l}^{\ M}(n+1) - (C_{pattern\ l}^{\ M} + C_{pattern\ l}^{\ Q})$
$PT_{23} = F_{pattern\ r}^{\ K}(1) - (C_{pattern\ r}^{\ K} + C_{pattern\ r}^{\ O})$ and
$BD_1 = F_{pattern\ l}^{\ K}(n+1) - (C_{pattern\ l}^{\ K} + C_{pattern\ l}^{\ O})$
$BD_2 = F_{pattern\ l}^{\ Ol}(1) - (C_{pattern\ l}^{\ K} + C_{pattern\ l}^{\ O})$
$BD_3 = F_{pattern\ r}^{\ M}(n+1) - (C_{pattern\ r}^{\ M} + C_{pattern\ r}^{\ Q})$
$BD_4 = F_{pattern\ r}^{\ Q}(1) - (C_{pattern\ r}^{\ M} + C_{pattern\ r}^{\ Q})$
$BD_5 = F_{pattern\ l}^{\ K}(1) - (C_{pattern\ l}^{\ K} + C_{pattern\ l}^{\ O})$
$BD_6 = F_{pattern\ r}^{\ Q}(n+1) - (C_{pattern\ r}^{\ M} + C_{pattern\ r}^{\ Q})$
$BD_7 = F_{pattern\ l}^{\ O}(n+1) - (C_{pattern\ l}^{\ K} + C_{pattern\ l}^{\ O})$
$BD_8 = F_{pattern\ r}^{\ M}(1) - (C_{pattern\ r}^{\ M} + C_{pattern\ r}^{\ Q})$
$BD_9 = F_{pattern\ 6}^{\ O}(1) - (C_{pattern\ r}^{\ K} + C_{pattern\ r}^{\ O})$
$BD_{10} = F_{pattern\ l}^{\ M}(1) - (C_{pattern\ l}^{\ M} + C_{pattern\ l}^{\ Q})$
$BD_{11} = F_{pattern\ r}^{\ K}(n+1) - (C_{pattern\ r}^{\ K} + C_{pattern\ r}^{\ O})$
$BD_{12} = F_{pattern\ l}^{\ Q}(n+1) - (C_{pattern\ l}^{\ M} + C_{pattern\ l}^{\ Q})$ Here, the offset to the measuring point 21 may be determined by:

$PT_{21} = F_{pattern\ l}^{\ Q}((n/2)+1) - (C_{pattern\ l}^{\ M} + C_{pattern\ l}^{\ Q})$ The thus determined five offsets $PT_{19}$–$PT_{23}$ and twelve offsets $BD_1$–$BD_{12}$ are stored into the memory. Since the manner of reflecting the offset during the exposure operation is the same as described hereinbefore, the explanation is omitted here.

Further, if the offset is set in the manner described below, it is possible to reduce the effect of random error resulting from noise, for example, during the measurement of $F^K_r(m) - F^Q_1(m)$.

Namely, it is assumed that:

$$C_{pattern} = (C^{K_r}_{pattern} + C^{O_r}_{pattern} + C^{K_l}_{pattern} + C^{O_l}_{pattern} + C^{M_r}_{pattern} +$$
$$C^{Q_r}_{pattern} + C^{M_l}_{pattern} + C^{Q_l}_{pattern})/8$$

and $$F_{pattern}((n/2)+1) = \{F^{K_r}_{pattern}((n/2)+1) + F^{K_l}_{pattern}((n/2)+1) +$$
$$F^{M_r}_{pattern}((n/2)+1) + F^{M_l}_{pattern}((n/2)+1) + F^{O_r}_{pattern}((n/2)+1) +$$
$$F^{O_l}_{pattern}((n/2)+1) + F^{Q_l}_{pattern}((n/2)+1) + F^{Q_l}_{pattern}((n/2)+1)\}/8$$

Then, the offset of each measuring point can be determined as follows:

$PT_{19} = F_{pattern\ r}^{\ O}(n+1) - C_{pattern}$
$PT_{20} = F_{pattern\ l}^{\ Q}(1) - C_{pattern}$
$PT_{21} = F_{pattern}((n/2)+1) - C_{pattern}$
$PT_{22} = F_{pattern\ l}^{\ M}(n+1) - C_{pattern}$
$PT_{23} = F_{pattern\ r}^{\ K}(1) - C_{pattern}$ and
$BD_1 = F_{pattern\ l}^{\ K}(n+1) - C_{pattern}$
$BD_2 = F_{pattern\ l}^{\ O}(1) - C_{pattern}$
$BD_3 = F_{pattern\ r}^{\ M}(n+1) - C_{pattern}$
$BD_4 = F_{pattern\ r}^{\ Q}(1) - C_{pattern}$
$BD_5 = F_{pattern\ l}^{\ K}(1) - C_{pattern}$
$BD_6 = F_{pattern\ r}^{\ Q}(n+1) - C_{pattern}$
$BD_7 = F_{pattern\ l}^{\ O}(n+1) - C_{pattern}$
$BD_8 = F_{pattern\ r}^{\ M}(1) - C_{pattern}$
$BD_9 = F_{pattern\ r}^{\ O}(1) - C_{pattern}$
$BD_{10} = F_{pattern\ l}^{\ M}(1) - C_{pattern}$
$BD_{11} = F_{pattern\ r}^{\ K}(n+1) - C_{pattern}$
$BD_{12} = F_{pattern\ l}^{\ Q}(n+1) - C_{pattern}$ The thus determined five offsets $PT_{19}$–$PT_{23}$ as well as twelve offsets $BD_1$–$BD_{12}$ are stored into the memory. Since the manner of reflecting the offset in the exposure process is the same as described hereinbefore, explanation thereof is omitted here.

Now, an embodiment of the present invention wherein the surface position detecting method described hereinbefore is applied to an exposure apparatus, will be explained.

Figure 44:
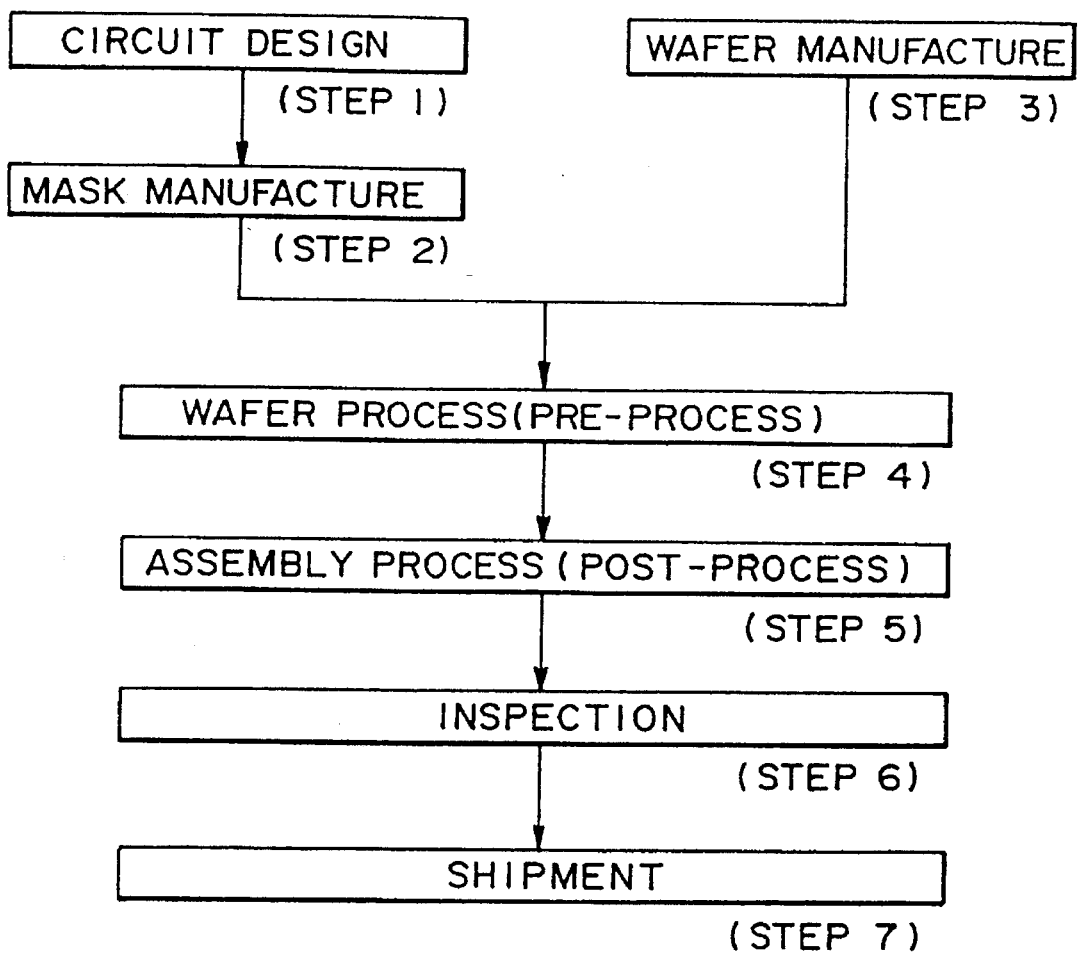
FIG. 44 is a flow chart of semiconductor device manufacturing processes.

FIG. 44 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 45:
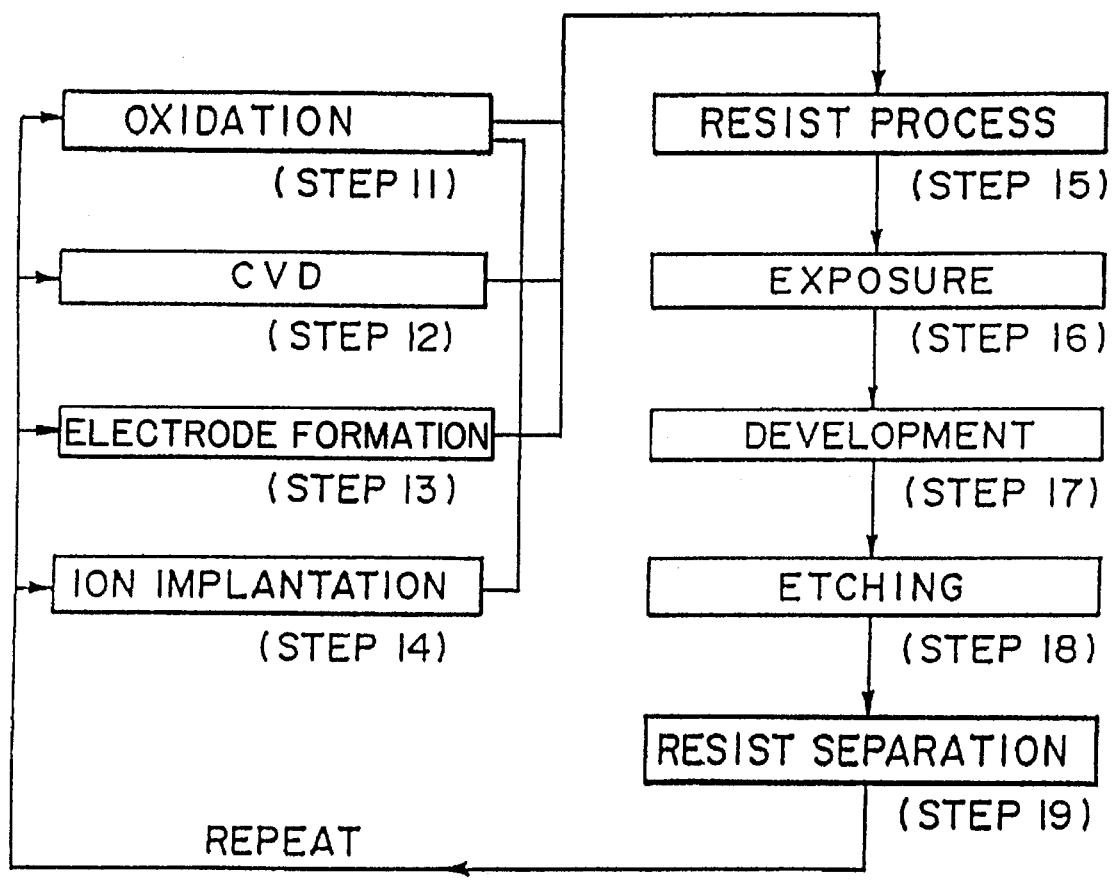
FIG. 45 is a flow chart of a wafer process.

FIG. 45 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

It is to be noted that the present invention is not limited to the use in a projection exposure apparatus. Namely, the invention is applicable to a case wherein accurate detection of the surface position of a surface, to be examined, on which a pattern is formed, is required.

While the invention has been described with reference to the structures disclosed herein, it is not confined to the details set forth and this application is intended to cover such modifications or changes as may come within the purposes of the improvements or the scope of the following claims.

What is claimed is:

1. A registration method usable with a projection optical system for projecting patterns of a first object simultaneously upon a second object having a surface step, for measuring at different locations the surface position of the second object with respect to the direction of an optical axis of the projection optical system prior to projection of the patterns onto the second object to bring the surface of the second object into coincidence with an image plane of the projection optical system on the basis of the measurement, said method comprising the steps of:

bringing, into coincidence with the image plane position of the projection optical system, the surface position at a location of the second object, on which location a pattern, of the patterns of the first object, having a smaller depth of focus, is or is to be projected, and thereby determining any tilt of the surface of the second object with respect to the image plane of the projection optical system; and correcting any determined tilt of the surface of the second object with respect to the image plane of the projection optical system.

2. A method according to claim 1, wherein said bringing step includes measuring the surface position of the second object at the location at which the pattern, of the patterns of the first object, is to be projected.

3. A method according to claim 2, wherein said measuring step includes (1) placing the second object on a stage movable along a direction perpendicular to the optical axis of the projection optical system, and (ii) sequentially detecting signals corresponding to a predetermined location on the second object and the location whereat the pattern, of the patterns of the first object is to be projected while moving the stage in a direction substantially perpendicular to the optical axis of the projection optical system.

4. A method according to claim 3, wherein said bringing step includes (i) determining offset on the basis of the surface position at the predetermined location and the location whereat the pattern, of the patterns of the first object, is to be projected, as detected in said detecting step, (ii) correcting the detected surface position at the predetermined location with the determined offset and (iii) bringing the surface position whereat the pattern, of the patterns of the first object, is to be projected into coincidence with the image plane on the basis of the corrected position.

5. A method of manufacturing semiconductor devices, wherein the surface position at different locations on an exposure region of a wafer having a surface step, with respect to the direction of an optical axis of a projection optical system, is measured, wherein the wafer surface is brought into coincidence with an image plane of the projection optical system, and wherein patterns of a reticle are projected simultaneously upon the exposure region through the projection optical system, said method comprising the steps of:

bringing, into coincidence with the image plane position of the projection optical system, the surface position at a location of the exposure region, on which location a pattern, of the patterns of the reticle, having a smaller depth of focus, is or is to be projected;

correcting any tilt of the surface of the exposure region with respect to the image plane of the projection optical system; and projecting, after said tilt correction, the patterns simultaneously upon the exposure region through the projection optical system.

6. A method according to claim 5, wherein said bringing step includes (i) measuring the surface position, with respect to the direction of the optical axis of the projection optical system, of the exposure region at a predetermined location and a location whereat the pattern, of the patterns of the reticle, is to be projected, (ii) determining offset on the basis of the surface positions at the predetermined location and the location whereat the pattern, of the patterns of the reticle, is to be projected; (iii) measuring the surface position at the predetermined location in the exposure region, (iv) correcting the measured surface position with the determined offset and (v) bringing the surface position of the exposure region at the location whereat the pattern, of the patterns of the reticle, is to be projected, into coincidence with the image plane on the basis of the surface position correction.

7. A method according to claim 6, wherein the wafer has a plurality of exposure regions and wherein said step of measuring the surface position at the predetermined location in the exposure region and said bringing step are executed sequentially to the exposure regions of the wafer.

8. A method according to claim 6, wherein said step of measuring the surface position, with respect to the direction of the optical axis of the projection optical system, of the exposure region at the predetermined location and the location whereat the pattern, of the patterns of the reticle is to be projected, includes (i) placing the wafer on a stage movable along a direction perpendicular to the optical axis of the projection optical system, and (ii) sequentially detecting signals corresponding to a predetermined location on the wafer and other locations thereon while moving the stage in a direction substantially perpendicular to the optical axis.

9. An exposure apparatus for projecting, simultaneously and through a projection optical system, patterns of a reticle upon an exposure region of a wafer having a surface step, said apparatus comprising:

a movable stage on which the wafer is placed;

detecting means for detecting signals corresponding to the surface position at predetermined locations on the exposure region with respect to the direction of an optical axis of the projection optical system; and control means for moving the stage in a direction perpendicular to the optical axis so as to enable said detecting means to produce signals corresponding to a location on the exposure region at which a pattern, of the patterns of the reticle, is to be projected and the predetermined locations thereon, and moving the stage to displace the location, at which the pattern, of the patterns of the reticle, having a smaller depth of focus is or is to be projected, on the basis of the produced signals, said control means further moving the stage on the basis of the produced signals to correct any tilt of the surface of the exposure region with respect to the image plane.

10. An apparatus according to claim 9, wherein said control means determines offset related to the predetermined locations on the basis of the signals corresponding to the surface position of the wafer at the predetermined locations and the location where the pattern, of the patterns of the reticle, is to be projected, with respect to the direction of the optical axis.

11. An apparatus according to claim 10, wherein the wafer has a plurality of exposure regions having substantially the same surface step structures, and wherein said control means causes said detecting means to produce signals corresponding to the surface position of predetermined locations on each of the exposure regions and to correct the produced signals on the basis of a corresponding offset.

12. A method, usable with a wafer having a plurality of arrayed exposure regions with patterns of substantially the same structure, for detecting the surface position of each of the exposure regions of the wafer, wherein the exposure regions of the wafer have uniformly defined measurement points whose levels are measured for surface position detection and wherein a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said method comprising the steps of:

detecting a first measurement error resulting from the pattern structure in measurement of the height of the first exposure region, and a second, different measurement error resulting from the pattern structure in measurement of the height of the second region; and correcting the first measurement error on the basis of the measurement of the height of the first region to determine the surface position of the first exposure region, and correcting the second measurement error on the basis of the measurement of the height of the second exposure region to determine the surface position of the second exposure region.

13. A method according to claim 12, wherein said detecting step includes (i) measuring the height of the measurement point in the first exposure region and a measurement point, in another exposure region, having the same or similar pattern structure as that at the measurement point in the first exposure region, (ii) detecting the surface shape of the wafer on the basis of the height data obtained by said measurement, (iii) detecting the first measurement error on the basis of the surface shape detected, (iv) measuring the height of the measurement point in the second exposure region and a measurement point, in another exposure region, having the same or similar pattern structure as that at the measurement point in the second exposure region, (v) detecting the surface shape of the wafer on the basis of the height data obtained by said last-executed measurement, and (vi) determining the second measurement error on the basis of the surface shape detected.

14. A method according to claim 13, wherein, in each of said surface shape detecting steps, a parameter for determination of a function of the surface shape is determined on the basis of the height data.

15. A method according to claim 14, wherein each of the first and second measurement errors is detected on the basis of a constant term of the function.

16. A method according to claim 13, wherein said measurement of the height position at the measurement position includes (i) placing the wafer on a stage movable in a direction perpendicular to the optical axis of the projection optical system, (ii) moving the stage so that plural exposure regions are successively positioned adjacent to the position where an image of a pattern of the reticle is to be projected by the projection optical system, (iii) projecting a radiation beam to the exposure region positioned at the projection position and receiving the beam reflected at the measurement position of the exposure region to detect a signal corresponding to the height of the measurement position, and (iv) measuring the height position of the measurement position on the basis of the signal.

17. A method according to claim 16, wherein, when the exposure region is positioned, the position of the stage in the direction of the optical axis is held substantially constant.

18. A device for detecting the surface position of first and second exposure regions of a wafer, and usable with a wafer having a plurality of arrayed exposure regions with patterns of substantially the same structure, for detecting the surface position of each of the exposure regions of the wafer, wherein the exposure regions of the wafer have uniformly defined measurement points whose levels are measured for surface position detection and wherein a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said device comprising:

detecting means for projecting a radiation beam to the measurement position of each of the first and second exposure regions, and for receiving the beam reflected by the exposure regions to produce a signal corresponding to the height of the exposure regions;

height measuring means for measuring the height of the exposure region on the basis of the signal from said detecting means, said height measuring means comprising displacing means for displacing the wafer relative to the radiation beam so that the radiation beam is projected to exposure regions different from the first and second regions, error detecting means cooperable with said displacing means and said measuring means to detect an error resulting from the pattern structure at the measurement position as the height of each of the first and second exposure regions is measured, and memory means for storing the detected errors related to the first and second exposure regions, wherein said surface position detecting device measures the surface positions while correcting corresponding errors of the first and second exposure regions.

19. A device according to claim 18, wherein said displacing means includes a movable stage on which the wafer is placed, and driving means for moving the movable stage.

20. A device according to claim 19, wherein said error detecting means includes (i) height measuring means, cooperable with said measuring means, for measuring the height of at least one exposure region having the same or similar pattern structure at a corresponding measurement position, as the first or second exposure region, and for detecting the surface shape of the wafer on the basis of the height data obtained by said height measuring means, and (ii) error detecting means for determining a parameter of a function related to the surface shape and for determining an error on the basis of a constant term of the function.

21. A method of manufacturing semiconductor devices, usable with a wafer having a plurality of arrayed exposure regions with patterns of substantially the same structure, for detecting the surface position of each of the exposure regions of the wafer, wherein the exposure regions of the wafer have uniformly defined measurement points whose levels are measured for surface position detection and wherein a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said method comprising the steps of:

detecting a first measurement error resulting from the pattern in measurement of the height of the first exposure region, and a second, different measurement error resulting from the pattern in measurement of the height of the second region;

correcting the first measurement error on the basis of the measurement of the height of the first region to determine the surface position of the first exposure region;

bringing the surface position of the first exposure region and the image plane of the projection optical system into coincidence with each other on the basis of the determination of the surface position of the first exposure region, and projecting through the projection optical system an image of the pattern upon the first exposure region;

correcting the second measurement error on the basis of the measurement of the height of the second exposure region to determine the surface position of the second exposure region; and bringing the surface position of the second exposure region and the image plane of the projection optical system into coincidence with each other on the basis of the determination of the surface position, and projecting through the projection optical system an image of the pattern upon the second exposure region.

22. A method according to claim 21, wherein said error detecting step includes memorizing the first and second measurement errors.

23. A method according to claim 21, wherein the surface position of the exposure region is determined by using corresponding errors memorized.

24. A projection exposure apparatus, usable with a wafer having a plurality of arrayed exposure regions with patterns of substantially the same structure, for detecting the surface position of each of the exposure regions of the wafer, wherein the exposure regions of the wafer have uniformly defined measurement points whose levels are measured for surface position detection and wherein a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said apparatus comprising:

a movable stage on which the wafer is placed;

measuring means for measuring the height of the measurement position of each of the first and second regions;

control means for moving the stage in a direction perpendicular to the optical axis of the projection optical system for detection of a first measurement error resulting from the pattern in measurement of the height of the first exposure region and a second, different, measurement error resulting from the pattern in measurement of the height of the second exposure region, said control means further causing said measuring means to produce a signal corresponding to the height of at least one exposure region, having the same or similar pattern structure at a corresponding measurement position, as the first or second exposure region;

wherein said control means determines a surface shape of the wafer on the basis of the signal and produces a signal corresponding to the first or second measurement error;

wherein said control means moves the stage in a direction perpendicular to the optical axis such that a first signal corresponding to the height of the first exposure region is produced, which first signal is then corrected on the basis of the signal of the first measurement error;

wherein said control means moves the stage along the optical axis on the basis of the corrected first signal and the projection optical system projects the pattern image upon the first region;

wherein said control means moves the stage in a direction perpendicular to the optical axis so that a second signal corresponding to the height of the second exposure region is produced, which second signal is then corrected on the basis of the signal of the second measurement error; and wherein said control means moves the stage along the optical axis on the basis of the corrected second signal and the projection optical system projects the pattern image upon the second exposure region.

25. An apparatus according to claim 24, wherein the control means includes means for memorizing the signals corresponding to the first and second measurement errors.

26. A method of detecting the surface position of an exposure region of a wafer, comprising the steps of:

detecting heights at different points in the exposure region and producing detected height data with respect to the different points;

generating a function representing the surface shape of the exposure region on the basis of the detected height data; and determining a measurement error depending on a predetermined pattern structure of the exposure region, on the basis of both (i) the detected height data produced in said detecting step and related to a point on which the pattern structure is present and (ii) height data obtainable from the function generated in said generating step and related to the point on which the pattern structure is present.

27. A method according to claim 26, wherein the wafer has a plurality of exposure regions and wherein the exposure region with respect to which the measurement error is to be detected is located in a peripheral portion of the wafer.

28. A method according to claim 27, wherein the function is a cubic function.

29. A semiconductor device manufacturing method wherein the surface position of an exposure region of a wafer is measured and a pattern of a reticle is projected through a projection optical system upon the exposure region, said method comprising the steps of:

detecting heights at different points in the exposure region and producing detected height data with respect to the different points;

generating a function representing the surface shape of the exposure region on the basis of the detected height data;

determining a measurement error depending on a predetermined pattern structure of the exposure region, on the basis of both (i) the detected height data produced in said detecting step and related to a point on which the pattern structure is present and height data obtainable from the function generated in said generating step and related to the point on which the pattern structure is present;

correcting the measurement error and, after the correction, detecting the heights at the different points in the exposure region; and bringing the surface position of the exposure region and the image plane of the projection optical system into coincidence with each other and projecting the pattern of the reticle upon the exposure region through the projection optical system.

30. A method according to claim 29, wherein the wafer has a plurality of exposure regions and wherein the exposure region with respect to which the measurement error is to be detected is located in a peripheral portion of the wafer.

31. A method according to claim 30, wherein the function is a cubic function.

32. An exposure apparatus for measuring the surface position of an exposure region of a wafer and for projecting a pattern of a reticle upon the exposure region through a projection optical system, said apparatus comprising:

a movable stage on which the wafer can be placed;

means for detecting signals corresponding to the surface position of the exposure region, at predetermined locations, with respect to the direction of the optical axis of the projection optical system; and control means for moving said stage in a direction perpendicular to the optical axis so that said detecting means produces signals corresponding to the height of the exposure region at the predetermined locations, said control means calculates the surface shape of the exposure region on the basis of the signals, and detects a measurement error depending on a predetermined pattern structure on the basis of a difference between (i) a signal from said detecting means, corresponding to the height at a location where the pattern structure is present, and (ii) a signal obtainable from the calculated surface shape and corresponding to the height at the location where the pattern structure is present.

33. An apparatus according to claim 32, wherein the wafer has a plurality of exposure regions and wherein the exposure region with respect to which the measurement error is to be detected is located in a peripheral portion of the wafer.

34. An apparatus according to claim 33, wherein the function is a cubic function.

35. A registration method, usable with a projection optical system for projecting patterns of a first object simultaneously upon a second object having a surface step, for measuring at different locations the surface position of the second object with respect to the direction of an optical axis of the projection optical system prior to projection of the patterns onto the second object to bring the surface of the second object in coincidence with an image plane of the projection optical system on the basis of the measurement, said method comprising the steps of:

bringing, into coincidence with the image plane position of the projection optical system, the surface position at a location of the second object, on which location a predetermined pattern, of the patterns of the first object, is to be projected, and thereby determining any tilt of the surface of the second object with respect to the image plane of the projection optical system; and correcting any determined tilt of the surface of the second object with respect to the image plane of the projection optical system.

36. A method according to claim 35, wherein said bringing step comprises measuring the surface position of the second object at the location at which the predetermined pattern, of the patterns of the first object, is to be projected.

37. A method according to claim 36, wherein said measuring step comprises (i) placing the second object on a stage movable along a direction perpendicular to the optical axis of the projection optical system, and (ii) sequentially detecting signals corresponding to a predetermined location on the second object and the location at which the predetermined pattern, of the patterns of the first object, is to be projected while moving the stage in a direction substantially perpendicular to the optical axis of the projection optical system.

38. A method according to claim 37, wherein said bringing step comprises (i) determining an offset on the basis of the surface position at the predetermined location and the location at which the predetermined pattern, of the patterns of the first object, is to be projected, as detected in said detecting step, (ii) correcting the detected surface position at the predetermined location with the determined offset and (iii) bringing the surface position at which the predetermined pattern, of the patterns of the first object, is to be projected into coincidence with the image plane on the basis of the corrected position.

39. A semiconductor device manufacturing method, wherein the surface position at different locations on an exposure region of a wafer having a surface step, with respect to the direction of an optical axis of a projection optical system, is measured, the wafer surface is brought into coincidence with an image plane of the projection optical system, and patterns of a reticle are projected simultaneously upon the exposure region through the projection optical system, said method comprising the steps of:

bringing, into coincidence with the image plane position of the projection optical system, the surface position at a location of the exposure region, on which location a predetermined pattern, of the patterns of the reticle, is to be projected;

correcting any tilt of the surface of the exposure region with respect to the image plane of the projection optical system; and simultaneously projecting, after said tilt correcting step, the patterns upon the exposure region through the projection optical system.

40. A method according to claim 39, wherein said bringing step comprises (i) measuring the surface position, with respect to the direction of the optical axis of the projection optical system, of the exposure region at a predetermined location and a location at which the predetermined pattern, of the patterns of the reticle, is to be projected, (ii) determining an offset on the basis of the surface positions at the predetermined location and the location at which the predetermined pattern, of the patterns of the reticle, is to be projected, (iii) measuring the surface position at the predetermined location in the exposure region, (iv) correcting the measured surface position with the determined offset and (v) bringing the surface position of the exposure region at the location at which the predetermined pattern, of the patterns of the reticle, is to be projected, into coincidence with the image plane on the basis of the surface position correction.

41. A method according to claim 40, wherein the wafer has a plurality of exposure regions and wherein said step of measuring the surface position at the predetermined location in the exposure region and said bringing step are executed sequentially to the exposure regions of the wafer.

42. A method according to claim 40, wherein said step of measuring the surface position, with respect to the direction of the optical axis of the projection optical system, of the exposure region at the predetermined location and the location at which the predetermined pattern, of the patterns of the reticle, is to be projected, comprises (i) placing the wafer on a stage movable along a direction perpendicular to the optical axis of the projection optical system, and (ii) sequentially detecting signals corresponding to a predetermined location on the wafer and other locations thereon while moving the stage in a direction substantially perpendicular to the optical axis.

43. An exposure apparatus for projecting, simultaneously and through a projection optical system, patterns of a reticle upon an exposure region of a wafer having a surface step, said apparatus comprising:

a movable stage on which the wafer is placed;

detecting means for detecting signals corresponding to the surface position at predetermined locations on the exposure region with respect to the direction of an optical axis of the projection optical system; and control means for moving the stage in a direction perpendicular to the optical axis so as to enable said detecting means to produce signals corresponding to a location on the exposure region at which a predetermined pattern, of the patterns of the reticle, is to be projected and the predetermined locations thereon, and moving the stage to displace the location, at which the predetermined pattern, of the patterns of the reticle, is to be projected, on the basis of the produced signals, said control means further moving the stage on the basis of the produced signals to correct any tilt of the surface of the exposure region with respect to the image plane.

44. An apparatus according to claim 43, wherein said control means determines an offset related to the predetermined locations on the basis of the signals corresponding to the surface position of the wafer at the predetermined locations and the location where the predetermined pattern, of the patterns of the reticle, is to be projected, with respect to the direction of the optical axis.

45. An apparatus according to claim 44, wherein the wafer has a plurality of exposure regions having substantially the same surface step structures, and said control means causes said detecting means to produce signals corresponding to the surface position of predetermined locations on each of the exposure regions and to correct the produced signals on the basis of a corresponding offset.

46. A method, usable with a wafer having a plurality of arrayed exposure regions with patterns of substantially the same structure, for detecting the surface position of each of the exposure regions of the wafer, wherein each of the exposure regions of the wafer has a uniformly defined measurement point whose level is measured for the surface position detection and a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said method comprising the steps of:

detecting a first measurement error resulting from the pattern structure in measurement of the height of the first exposure region and a second, different measurement error resulting from the pattern structure in measurement of the height of the second region; and correcting the first measurement error on the basis of the measurement of the height of the first region to determine the surface position of the first exposure region, and correcting the second measurement error on the basis of the measurement of the height of the second exposure region to determine the surface position of the second exposure region.

47. A method according to claim 46, wherein said detecting step comprises (i) measuring the height of the measurement point in the first exposure region and a measurement point, in another exposure region, having the same or similar pattern structure as that at the measurement point in the first exposure region, (ii) detecting the surface shape of the wafer on the basis of the height data obtained in said measuring step, (iii) detecting the first measurement error on the basis of the surface shape detected, (iv) measuring the height of the measurement point in the second exposure region and a measurement point, in another exposure region, having the same or similar pattern structure as that at the measurement point in the second exposure region, (v) detecting the surface shape of the wafer on the basis of the height data obtained in the last-executed measurement, and (vi) determining the second measurement error on the basis of the surface shape detected.

48. A method according to claim 47, further comprising determining a parameter for determining a function of the surface shape on the basis of the height data in each of said surface shape detecting steps.

49. A method according to claim 48, further comprising detecting each of the first and second measurement errors on the basis of a constant term of the function.

50. A method according to claim 47, wherein said step of measuring the height position at the measurement position comprises (i) placing the wafer on a stage movable in a direction perpendicular to the optical axis of the projection optical system, (ii) moving the stage so that plural exposure regions are successively positioned adjacent to the position where an image of a pattern of the reticle is to be projected by the projection optical system, (iii) projecting a radiation beam to the exposure region positioned at the projection position and receiving the beam reflected at the measurement position and receiving the beam reflected at the measurement position of the exposure region to detect a signal corresponding to the height of the measurement position, and (iv) measuring the height position of the measurement position on the basis of the signal.

51. A method according to claim 50, wherein the position of the stage in the direction of the optical axis is held substantially constant when the exposure region is positioned.

52. A device for detecting the surface position of first and second exposure regions of a wafer, and usable with a wafer having a plurality of arrayed exposure regions with patterns of substantially the same structure, for detecting the surface position of each of the exposure regions of the wafer, wherein each of the exposure regions of the wafer has a uniformly defined measurement point whose level is to be measured for the surface position detection, and a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said device comprising:

detecting means for projecting a radiation beam to the measurement position of each of the first and second exposure regions, and for receiving the beam reflected by the exposure region to produce a signal corresponding to the height of the exposure region; and height measuring means for measuring the height of the exposure region on the basis of the signal from said detecting means, said height measuring means comprising (i) displacing means for displacing the wafer relative to the radiation beam so that the radiation beam is projected to exposure regions different from the first and second regions, (ii) error detecting means cooperable with said displacing means and said measuring means to detect an error resulting from the pattern structure at the measurement position as the height of each of the first and second exposure region is measured, and (iii) memory means for storing the detected errors related to the first and second exposure regions, wherein said surface position detecting device measures the surface positions while correcting the corresponding errors of the first and second exposure regions.

53. A device according to claim 52, wherein said displacing means comprises a movable stage on which the wafer is placed, and driving means for moving the movable stage.

54. A device according to claim 53, wherein said error detecting means comprises (i) height measuring means, cooperable with said measuring means, for measuring the height of at least one exposure region having the same or a similar pattern structure at a corresponding measurement position, as the first or second exposure region, and for detecting the surface shape of the wafer on the basis of the height data obtained by said height measuring means, and (ii) error detecting means for determining a parameter of a function related to the surface shape and for determining an error on the basis of a constant term of the function.

55. A method of manufacturing semiconductor devices, usable with a wafer having a plurality of arrayed exposure regions with patterns of substantially the same structure, for detecting the surface position of each of the exposure regions of the wafer, wherein each of the exposure regions of the wafer has a uniformly defined measurement point whose level is to be measured for the surface position detection, and a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said method comprising the steps of:

detecting a first measurement error resulting from the pattern in measuring the height of the first exposure region, and a second, different measurement error resulting from the pattern in measuring the height of the second region;

correcting the first measurement error on the basis of the measurement of the height of the first region to determine the surface position of the first exposure region;

bringing the surface position of the first exposure region and the image plane of the projection optical system into coincidence with each other on the basis of the determination of the surface position of the first exposure region, and projecting through the projection optical system an image of the pattern upon the first exposure region;

correcting the second measurement error on the basis of the measurement of the height of the second exposure region to determine the surface position of the second exposure region; and bringing the surface position of the second exposure region and the image plane of the projection optical system into coincidence with each other on the basis of the determination of the surface position, and projecting through the projection optical system an image of the pattern upon the second exposure region.

56. A method according to claim 55, wherein said error detecting step comprises memorizing the first and second measurement errors.

57. A method according to claim 55, further comprising determining the surface position of the exposure region by using corresponding memorized errors.

58. A projection exposure apparatus, usable with a wafer having a plurality of arrayed exposure regions with patterns of substantially the same structure, for detecting the surface position of each of the exposure regions of the wafer, wherein each of the exposure regions of the wafer has a uniformly defined measurement point whose level is to be measured for the surface position detection, and a pattern structure at a measurement point in a first exposure region, of the exposure regions of the wafer, may differ from a pattern structure at a measurement point in a second exposure region of the exposure regions of the wafer, in accordance with a difference therebetween in position in the exposure region array, said apparatus comprising:

a movable stage on which the wafer is placed;

measuring means for measuring the height of the measurement position of each of the first and second regions;

control means for moving the stage in a direction perpendicular to the optical axis of the projection optical system for detecting a first measurement error resulting from the pattern in measuring the height of the first exposure region and a second, different, measurement error resulting from the pattern in measuring the height of the second exposure region, said measuring means producing a signal corresponding to the height of at least one exposure region, having the same or a similar pattern structure at a corresponding measurement position, as the first or second exposure region;

wherein said control means determines a surface shape of the wafer on the basis of the signal and produces a signal corresponding to the first or second measurement error;

wherein said control means moves the stage in a direction perpendicular to the optical axis such that a first signal corresponding to the height of the first exposure region is produced, which first signal is then corrected on the basis of the signal of the first measurement error;

wherein said control means moves the stage along the optical axis on the basis of the corrected first signal and the projection optical system projects the pattern image upon the first exposure region;

wherein said control means moves the stage in a direction perpendicular to the optical axis so that a second signal corresponding to the height of the second exposure region is produced, which second signal is then corrected on the basis of the signal of the second measurement error; and wherein said control means moves the stage along the optical axis on the basis of the corrected second signal and the projection optical system projects the pattern image upon the second exposure region.

59. An apparatus according to claim 58, wherein said control means comprises means for memorizing the signals corresponding to the first and second measurement errors.

* * * * *

UNITED STATES PATENT AND TRADEMARK OFFICE
CERTIFICATE OF CORRECTION

PATENT NO. : 5,602,400  Page 1 of 3
DATED : February 11, 1997
INVENTOR(S) : HARUNA KAWASHIMA It is certified that error appears in the above-identified patent and that said Letters Patent is hereby corrected as shown below:

COLUMN 4

Line 63, "i" should read --1--.

COLUMN 8

Line 37, "where in" should read --where, in--.

COLUMN 10

Line 52, "60" should read --608--.

COLUMN 12

Line 57, "is" should read --are--.

COLUMN 18

Line 51, "be" should be deleted.

COLUMN 24

Line 32, "of" should be deleted.
Line 39, "exist" should read --exists--.
Line 61, "dxdy=0" should read --dxdy=0,--.

UNITED STATES PATENT AND TRADEMARK OFFICE
CERTIFICATE OF CORRECTION

PATENT NO. : 5,602,400

DATED : February 11, 1997

INVENTOR(S) : HARUNA KAWASHIMA

It is certified that error appears in the above-indentified patent and that said Letters Patent is hereby corrected as shown below:

COLUMN 25

Line 4, "$^2dxdy=0$" should read --$^2dxdy=0;$--.

Line 11, "$term_{23}$, $C^{pattern}$ 23" should read --$tern_{20}$, $C^{pattern}$ 22--.

COLUMN 26

Line 55, "FIG. 25" should read --FIG. 25,--.

COLUMN 27

Line 16, "0S" should read --O5--.
Line 17, "follow:" should read --follows:--.

COLUMN 29

Line 8, "that" should read --that,--.

COLUMN 35

Line 62, "Present on a Pattern" should read --present on a pattern--.

UNITED STATES PATENT AND TRADEMARK OFFICE
CERTIFICATE OF CORRECTION

PATENT NO. : 5,602,400
DATED : February 11, 1997
INVENTOR(S) : HARUNA KAWASHIMA

It is certified that error appears in the above-indentified patent and that said Letters Patent is hereby corrected as shown below:

<u>COLUMN 37</u>

Line 31, "then" should read --them--.

<u>COLUMN 47</u>

Line 43, "PT20" should read --$PT_{20}$--.

<u>COLUMN 49</u>

Line 4, "$F_{patter}{}^{o}{}_{r}$" should read --$F_{pattern}{}^{o}{}_{r}$--.

Line 58, "$F_{pattern}{}^{o1}$" should read --$F_{pattern}{}^{o1}$--.

Line 67, "$F_{pattern}{}^{o}{}_{6}$" should read --$F_{pattern}{}^{o}{}_{r}$--.

Signed and Sealed this

Ninth Day of September, 1997

Attest:

BRUCE LEHMAN

*Attesting Officer*  *Commissioner of Patents and Trademarks*